US00RE41757E

(19) United States
(12) Reissued Patent
Isozaki et al.

(10) Patent Number: US RE41,757 E
(45) Date of Reissued Patent: Sep. 28, 2010

(54) SOUND SOURCE SYSTEM BASED ON COMPUTER SOFTWARE AND METHOD OF GENERATING ACOUSTIC WAVEFORM DATA

(75) Inventors: Yoshimasa Isozaki, Hamamatsu (JP); Hideyuki Masuda, Hamamatsu (JP); Hideo Suzuki, Hamamatsu (JP); Masahiro Shimizu, Saitama (JP); Masashi Hirano, Hamamatsu (JP)

(73) Assignee: Yamaha Corporation, Hamamatsu-shi (JP)

(21) Appl. No.: 09/976,769

(22) Filed: Oct. 12, 2001

Related U.S. Patent Documents

Reissue of:
(64) Patent No.: 5,981,860
Issued: Nov. 9, 1999
Appl. No.: 08/920,947
Filed: Aug. 29, 1997

(30) Foreign Application Priority Data

Aug. 30, 1996 (JP) ..... 8-246942
Aug. 30, 1996 (JP) ..... 8-248592
Jan. 14, 1997 (JP) ..... 9-017333

(51) Int. Cl.
*G10H 11/00* (2006.01)
*G10H 7/00* (2006.01)
*G11C 1/00* (2006.01)

(52) U.S. Cl. ..... 84/603; 84/622
(58) Field of Classification Search ..... 84/600, 84/603, 604, 622, 659
See application file for complete search history.

(56) References Cited

U.S. PATENT DOCUMENTS 4,554,857 A * 11/1985 Nishimoto ..... 84/624
5,040,448 A * 8/1991 Matsubara et al. ..... 84/622
5,200,564 A * 4/1993 Usami et al.
5,220,117 A * 6/1993 Yamada et al.
5,376,752 A * 12/1994 Limberis et al. ..... 84/622

(Continued)

FOREIGN PATENT DOCUMENTS

EP 0 337 458 A2 10/1989
EP 0 747 877 A2 12/1996

(Continued)

OTHER PUBLICATIONS

European Office Action mailed Feb. 13, 2009, for EP Application No. 00123550.6, five pages.

(Continued)

*Primary Examiner*—Jeffrey Donels
(74) *Attorney, Agent, or Firm*—Morrison & Foerster LLP

(57) ABSTRACT

A sound source apparatus has operation blocks composed of softwares used to compute waveforms for generating a plurality of musical tones through a plurality of channels according to performance information. In the apparatus, a setting device sets an algorithm which determines a system composed of selective ones of the operation blocks systematically combined with each other to compute a waveform specific to one of the musical tones. A designating device responds to the performance information for designating one of the channels to be used for generating the musical tone. A generating device allocates the selective operation blocks to the one channel and systematically executes the allocated selective operation blocks according to the algorithm so as to compute the waveform to thereby generate the musical tone through the channel. The generating device responds to a variable sampling frequency for executing the operation blocks to successively compute samples of the waveform in synchronization to the variable sampling frequency so as to generate the musical tone, and sets the variable sampling frequency according to process of computation of the waveform by the operation blocks.

65 Claims, 41 Drawing Sheets

U.S. PATENT DOCUMENTS

| | | | | | |
|---|---|---|---|---|---|
| 5,410,099 | A | * | 4/1995 | Kosugi | 84/618 |
| 5,432,293 | A | * | 7/1995 | Nonaka et al. | 84/607 |
| 5,677,504 | A | * | 10/1997 | Kurata | 84/617 |
| 5,696,342 | A | * | 12/1997 | Shimizu | 84/603 |
| 5,698,806 | A | * | 12/1997 | Yamada et al. | 84/615 |
| 5,714,703 | A | * | 2/1998 | Wachi et al. | 84/603 |
| 5,767,430 | A | * | 6/1998 | Yamanoue et al. | 84/602 |

FOREIGN PATENT DOCUMENTS

| | | |
|---|---|---|
| JP | 2179697 | 7/1990 |
| JP | 05-249970 | 9/1993 |
| JP | 05-297876 | 11/1993 |
| JP | 06-097770 | 4/1994 |
| JP | 07-271378 | 10/1995 |
| JP | 7-122796 | 12/1995 |
| JP | 07-319471 | 12/1995 |
| WO | 96/18995 | 6/1996 |

OTHER PUBLICATIONS

European Search Report Mailed Oct. 14, 2004, for EP Application No. 00123550.6, three pages.

* cited by examiner

VOICEj
KEYONj
FNOj
ALGORj
VOLj
VELj
OP1DATAj
OP2DATAj
OPmDATAj

FSAMPm
MULTm
FBLm
WSELm
TLm
EGPARm
MSCm
OPPRIOm
OPBUFm

OPONm
PHBUFm
FBm
MODINm
OPOUTm
EGSTATEm

FIG.28

| | | |
|---|---|---|
| EXICITER PARAMETERS | EF | EXCITER FILTER PARAMETER |
| | NLG1 | NONLINEAR CONVERTER 1 INPUT GAIN |
| | NLG2 | NONLINEAR CONVERTER 2 INPUT GAIN |
| | EXG | EXCITER OUTPUT GAIN |
| | NL1 | NONLINEAR CONVERTER 1 CHARACTERISTIC PARAMETER (TABLE) |
| | NL2 | NONLINEAR CONVERTER 2 CHARACTERISTIC PARAMETER (TABLE) |
| P/S PARAMETERS | DL | DELAY-L DELAY AMOUNT TABLE |
| | DRL | DELAY-RL DELAY AMOUNT TABLE |
| | DRR | DELAY-RR DELAY AMOUNT TABLE |
| | FLP | TERMINAL FILTER-L PARAMETER |
| | FRP | TERMINAL FILTER-R PARAMETER |
| | MULTI1(M1) | TONE HOLE JUNCTION MULTIPLICATION COEFFICIENT 1 |
| | MULTI2(M2) | TONE HOLE JUNCTION MULTIPLICATION COEFFICIENT 2 |
| | MULTI3(M3) | TONE HOLE JUNCTION MULTIPLICATION COEFFICIENT 3 |
| | MULTI4(M4) | TONE HOLE JUNCTION MULTIPLICATION COEFFICIENT 4 |
| | J1 | TUBE JUNCTION MULTIPLICATION COEFFICIENT 1 |
| | J2 | TUBE JUNCTION MULTIPLICATION COEFFICIENT 2 |
| | J3 | TUBE JUNCTION MULTIPLICATION COEFFICIENT 3 |
| EG PAR | ATTACK RATE | ATTACK RATE |
| | RELEASE RATE | RELEASE RATE |
| | ↓ | ↓ |
| | | |
| RESONATOR PAR | TYPE | RESONATOR TYPE |
| | FREQ | RESONATOR FREQUENCY CHARACTERISTIC PARAMETER |
| | LEVEL | RESONATOR LEVEL PARAMETER |
| | ↓ | ↓ |
| | | |
| EFFECT PAR | EFFECT TYPE | EFFECT TYPE DESIGNATION |
| | FREQ | EFFECT DEPTH |
| | LEVEL | MODULATION SPEED |
| | ↓ | ↓ |
| | | |
| SAMPLING FREQ | FS | SAMPLING FREQUENCY DATA (FS1>FS2) |

SOUND SOURCE SYSTEM BASED ON COMPUTER SOFTWARE AND METHOD OF GENERATING ACOUSTIC WAVEFORM DATA

Matter enclosed in heavy brackets [ ] appears in the original patent but forms no part of this reissue specification; matter printed in italics indicates the additions made by reissue.

BACKGROUND OF THE INVENTION

The present invention relates to a sound source system that combines music tone waveform generating modules made of software, and that generates music tone waveform data based on music tone waveform generating computation performed by each music tone waveform generating module. In addition, the present invention relates to a sound source waveform generating method that uses a general-purpose computation processing machine for executing a waveform computation algorithm so as to generate tone waveform data.

Conventionally, in order to generate a music tone according to a variety of music tone generating methods such as a waveform memory tone generating method and an FM tone generating method, a circuit for implementing the music tone generating method is constituted by dedicated hardware such as an LSI specifically designed for a sound source and a digital signal processor (DSP) that operates under the control of a fixed microprogram. The music tone generator constituted by the dedicated hardware is generically referred to as a hardware sound source hereafter. However, the hardware sound source requires dedicated hardware components, hence reduction of the product cost is difficult. It is also difficult for the hardware sound source to flexibly modify its specifications once the design has been completed.

Recently, as the computational performance of CPU has been enhancing, tone generators have been developed in which a general-purpose computer or a CPU installed on a dedicated tone generator executes software programs written with predetermined tone generation processing procedures to generate music tone waveform data. The tone generator based on the software programs is generically referred to as a software sound source hereafter.

Use of the hardware sound source in a computer system or a computer-based system presents problems of increasing the cost and decreasing the flexibility of modification. Meanwhile, the conventional software sound sources simply replace the capabilities of the dedicated hardware devices such as the conventional tone generating LSI. The software sound source is more flexible in modification of the specifications after completion of design than the hardware sound source. However, the conventional software sound source cannot satisfy a variety of practical demands occurring during vocalization or during operation of the sound source. These demands come from CPU performance, system environment, user preferences and user settings. To be more specific, the conventional software sound sources cannot satisfy the demands for changing fidelity of an outputted music tone waveform (not only the change to higher fidelity but also to lower fidelity) and demands for changing the degree of timbre variation (for example, change from normal timbre variation to subtle timbre variation or vice versa).

Recently, an attempt has been made to generate tone waveform data by operating a general-purpose processor such as a personal computer to run software programs and to convert the generated digital tone waveform data through a CODEC (coder-decoder) into an analog music tone signal for vocalization. The sound source that generates the tone waveform data by such a manner is referred to as the software sound source as mentioned before. Otherwise, the tone waveform data may be generated by an LSI dedicated to tone generation or by a device dedicated to tone generation having a digital signal processor (DSP) executing a microprogram. The sound source based on this scheme is referred to as the hardware sound source as mentioned before.

Generally, a personal computer runs a plurality of application software programs in parallel. Sometimes, a karaoke application program or a game application program is executed concurrently with a software sound source application program. This situation, however, increases a work load imposed on the CPU (Central Processing Unit) in the personal computer. Such an over load delays the generation of tone waveform data by the software sound source, thereby interrupting the vocalization of a music tone in the worst case. When the CPU is operating in the multitask mode, the above-mentioned concurrent processing may cause the tasks other than the tone generation task into a wait state.

In the hardware sound source, a waveform computation algorithm is executed by the DSP or the like to generate tone waveform data. The performance of the DSP for executing the computation has been enhanced every year, but the conventional tone waveform data generating method cannot make the most of the enhanced performance of the DSP.

SUMMARY OF THE INVENTION

It is therefore an object of the present invention to provide a sound source system based on computer software capable of reducing cost by generating a music tone by a software program without adding special dedicated hardware and, at the same time, capable of changing the load of a computation unit for computing music tone waveform and improving the quality of an output music tone.

It is another object of the present invention to provide a tone waveform data generating method that is capable of generating tone waveform data without interrupting the vocalization of a music tone even if the CPU load is raised high, and capable of, when the CPU is operating in the multitask mode, processing tasks not associated with the tone waveform generation without placing these tasks in a wait state.

It is still another object of the present invention to provide a tone waveform data generating method that makes a hardware sound source fully put forth its computational capability to provide the waveform output having higher precision than before.

The inventive sound source apparatus has operation blocks composed of softwares used to compute waveforms for generating a plurality of musical tones through a plurality of channels according to performance information. In the inventive apparatus, a setting device sets an algorithm which determines a system composed of selective ones of the operation blocks systematically combined with each other to compute a waveform specific to one of the musical tones. A designating device responds to the performance information for designating one of the channels to be used for generating said one musical tone. A generating device allocates the selective operation blocks to said one channel and systematically executes the allocated selective operation blocks according to the algorithm so as to compute the waveform to thereby generate said one musical tone through said one channel.

Preferably, the setting device sets different algorithms which determine different systems corresponding to different timbres of the musical tones. Each of the different systems is composed of selective ones of the operation blocks which are selectively and sequentially combined with each other to compute a waveform which is specific to a corresponding one of the different timbres.

Preferably, the setting device comprises a determining device that determines a first system combining a great number of operation blocks and corresponding to a regular timbre and that determines a second system combining a small number of operation blocks and corresponding to a substitute timbre, and a changing device operative when a number of operation blocks executable in the channel is limited under said great number and over said small number due to a load of the computation of the waveform for changing the musical tone from the regular timbre to the substitute timbre so that the second system is adopted for the channel in place of the first system.

Preferably, the setting device comprises an adjusting device operative dependently on a condition during the course of generating the musical tone for adjusting a number of the operation blocks to be allocated to the channel.

Preferably, the adjusting device comprises a modifying device that modifies the algorithm to eliminate a predetermined one of the operation blocks involved in the system so as to reduce a number of the operation blocks to be loaded into the channel for adjustment to the condition.

Preferably, the adjusting device operates when the condition indicates that an amplitude envelope of the waveform attenuates below a predetermined threshold level for compacting the system so as to reduce the number of the operation blocks.

Preferably, the adjusting device operates when the condition indicates that an output volume of the musical tone is tuned below a predetermined threshold level for compacting the system so as to reduce the number of the operation blocks.

Preferably, the adjusting device operates when the condition indicates that one of the operation blocks declines to become inactive in the system without substantially affecting other operation blocks of the system for eliminating said one operation block so as to reduce the number of the operation blocks to be allocated to the channel.

Preferably, the generating device comprises a computing device responsive to a variable sampling frequency for executing the operation blocks to successively compute samples of the waveform in synchronization to the variable sampling frequency so as to generate the musical tone, and a controlling device that sets the variable sampling frequency according to process of computation of the waveform by the operation blocks.

Preferably, the generating device comprises a computing device responsive to a variable sampling frequency for executing the operation blocks to successively compute samples of the waveform in synchronization to the variable sampling frequency so as to generate the musical tone, and a controlling device for adjusting the variable sampling frequency dependently on a load of computation of the waveform during the course of generating the musical tone.

Preferably, the generating device comprises a computing device responsive to a variable sampling frequency for executing the operation blocks to successively compute samples of the waveform in synchronization to the variable sampling frequency so as to generate the musical tone, and a controlling device for adjusting the variable sampling frequency according to result of computation of the samples during the course of generating the musical tone.

The inventive sound source apparatus has a software module used to compute samples of a waveform in response to a sampling frequency for generating a musical tone according to performance information. In the inventive apparatus, a processor periodically executes the software module for successively computing samples of the waveform corresponding to a variable sampling frequency so as to generate the musical tone. A detector device detects a load of computation imposed on the processor device during the course of generating the musical tone. A controller device operates according to the detected load for changing the variable sampling frequency to adjust a rate of computation of the samples.

Preferably, the controller device provides a fast sampling frequency when the detected load is relatively light, and provides a slow sampling frequency when the detected load is relatively heavy such that the rate of the computation of the samples is reduced by 1/n where n denotes an integer number.

Preferably, the processor device includes a delay device having a memory for imparting a delay to the waveform to determine a pitch of the musical tone according to the performance information. The delay device generates a write pointer for successively writing the samples into addresses of the memory and a read pointer for successively reading the samples from addresses of the memory to thereby create the delay corresponding to an address gap between the write pointer and the read pointer. The delay device is responsive to the fast sampling frequency to increment both of the write pointer and the read pointer by one address for one sample. Otherwise, the delay device is responsive to the slow sampling frequency to increment the write pointer by one address n times for one sample and to increment the read pointer by n addresses for one sample.

Preferably, the processor device includes a delay device having a pair of memory regions for imparting a delay to the waveform to determine a pitch of the musical tone according to the performance information. The delay device successively writes the samples of the waveform of one musical tone into addresses of one of the memory regions, and successively reads the samples from addresses of the same memory region to thereby create the delay. The delay device is operative when said one musical tone is switched to another musical tone for successively writing the samples of the waveform of said another musical tone into addresses of the other memory region and successively reading the samples from addresses of the same memory region to thereby create the delay while clearing the one memory region to prepare for a further musical tone.

Preferably, the processor device executes the software module composed of a plurality sub-modules for successively computing the waveform. The processor device is operative when one of the sub-modules declines to become inactive without substantially affecting other sub-modules during computation of the waveform for skipping execution of said one sub-module.

The inventive sound source apparatus has a software module used to compute samples of a waveform for generating a musical tone. In the inventive apparatus, a provider device variably provides a trigger signal at a relatively slow rate to define a frame period between successive trigger signals, and periodically provides a sampling signal at a relatively fast rate such that a plurality of sampling signals occur within one frame period. A processor device is resettable in response to each trigger signal and is operable based on each sampling signal to periodically execute the software module for successively computing a number of samples of the waveform within one frame. A detector device detects a load of computation imposed on the processor device during the course of generating the musical tone. A controller device is operative according to the detected load for varying the frame period to adjust the number of the samples computed within one frame period. A converter device is responsive to each sampling signal for converting each of the samples into a corresponding analog signal to thereby generate the musical tones.

BRIEF DESCRIPTION OF THE DRAWINGS

The above and other objects, features and advantages of the present invention will become more apparent from the accompanying drawings, in which like reference numerals are used to identify the same or similar parts in several views.

FIG. 28 is a diagram illustrating details of control parameter VATONPAR necessary for computational generation of musical tones in the present invention;

DETAILED DESCRIPTION OF PREFERRED EMBODIMENTS

Figure 1:
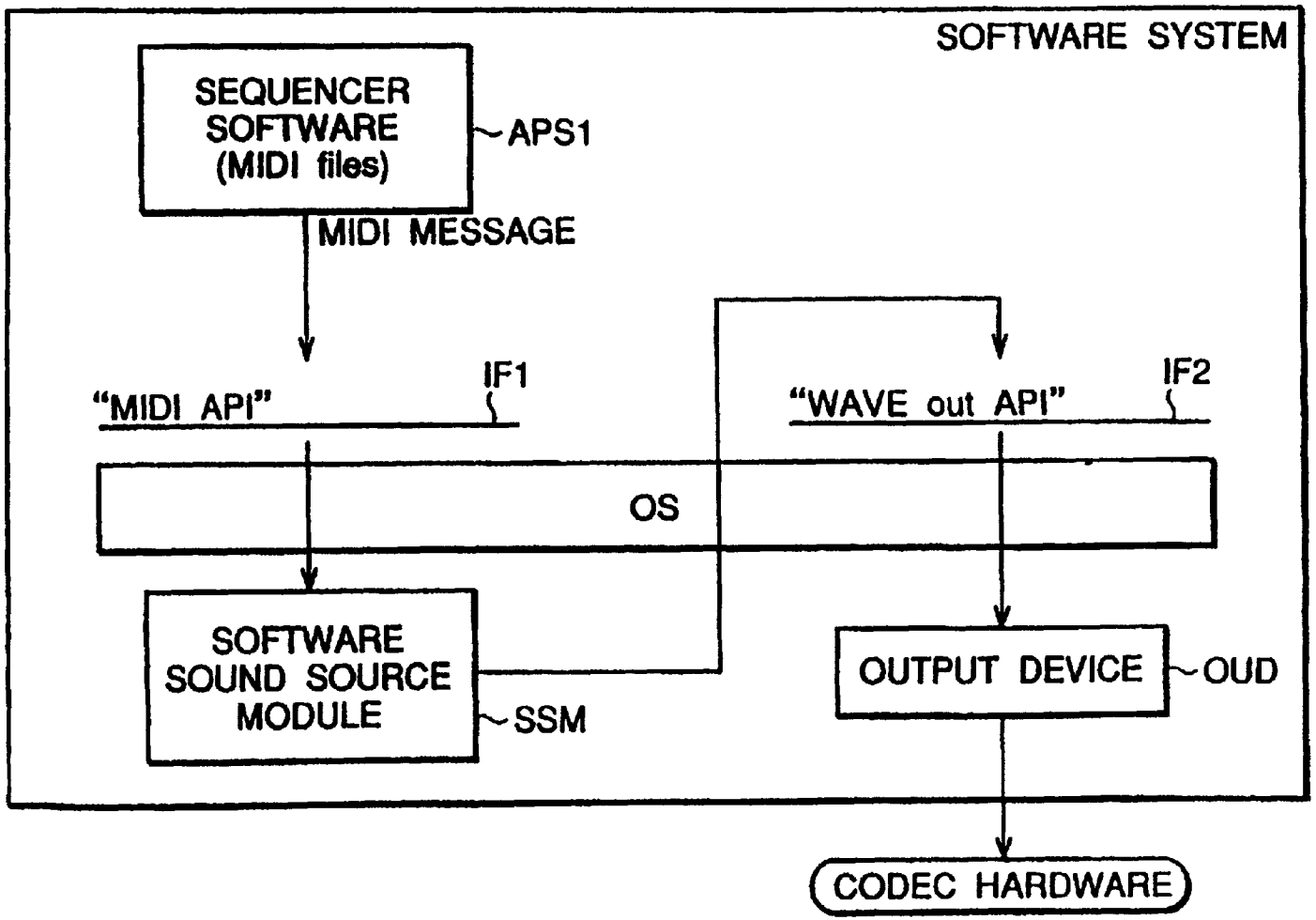
FIG. 1 is a schematic block diagram illustrating a software constitution of a sound source system practiced as a first preferred embodiment of the present invention.

This invention will be described in further detail by way of example with reference to the accompanying drawings. FIG. 1 shows a software constitution of a sound source system practiced as a first preferred embodiment of the present invention. As shown in the figure, this software sound source system is constituted to generate music tone waveform data based on an operating system (OS). It should be noted that FIG. 1 also shows CODEC hardware including a DAC (Digital to Analog Converter) for converting a digital music signal in the form of the music tone waveform data generated under control of the OS into an analog music tone signal.

Now, referring to FIG. 1, an APS1 is application software such as a sequencer software operable on real-time basis for sequentially generating performance information containing MIDI messages. The sequencer software APS1 has a plurality of MIDI files composed of MIDI data such as various event data and timing data for timing occurrence of the event data. The MIDI file is prepared for generating pieces of music. When one or more MIDI files are selected by the user, the MIDI data is read sequentially from the selected files. Based on the read MIDI data, MIDI messages are sequentially generated according to the event data at real-time. Then, the sequencer software APS1 outputs the generated MIDI messages to a first interface IF1 which is a MIDI Application Interface or MIDI API arranged on the OS for MIDI message input.

The OS is installed with a driver defining a software sound source module SSM. This module is a program for generating music tone waveform data based on the MIDI messages inputted via the first interface IF1. The OS also has a second interface IF2 denoted by WAVE out Application Interface or WAVE out API for receiving the music tone waveform data generated by the software sound source module SSM. Further, the OS is installed with an output device OUD which is a software driver for outputting the music tone waveform data inputted via the second interface IF2. To be more specific, this output device OUD reads, via a direct memory access (DMA) controller, the music waveform data generated by the software sound source module SSM and temporarily stored in a storage device such as a hard disk, and outputs the read music waveform data to a predetermined hardware device such as a CODEC.

The MIDI messages outputted by the sequencer software APS1 are supplied to an input interface of the software sound source module SSM via the first interface IF1 and the OS. The software sound source module SSM performs music tone waveform data generation processing. In the present embodiment, the music tone waveform data is generated by FM tone generating based on the received MIDI messages. The generated music tone waveform data is supplied to the output device OUD via the second interface IF2 and the OS. In the output device OUD, the supplied music tone waveform data is outputted to the above-mentioned CODEC to be converted into an analog music tone signal.

Thus, the present embodiment allows, at the OS level, ready combination of the software sound source module SSM for generation music tone waveform data and the sequencer software APS1 which is the application software for outputting MIDI messages. This makes it unnecessary to add any hardware components dedicated to music tone waveform data generation, resulting in reduced cost.

Figure 2:
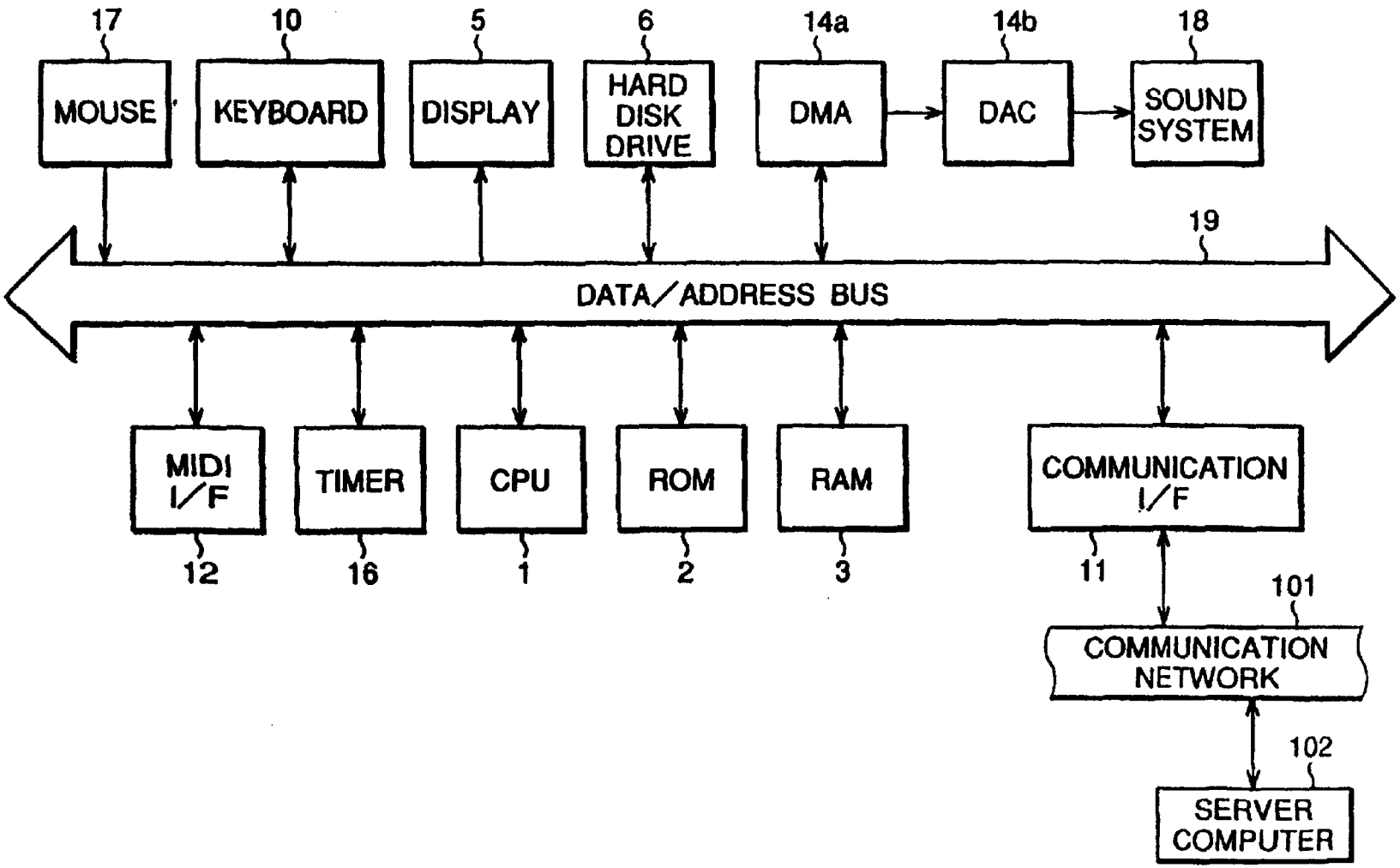
FIG. 2 is a block diagram illustrating a general hardware constitution of the sound source system practiced as the first preferred embodiment of the present invention.

FIG. 2 shows an overall hardware constitution for implementing the sound source system of the present embodiment. This system is implemented by a general-purpose personal computer. For the main controller of this system, a CPU 1 is used. Under the control of the CPU 1, the music tone waveform data generation processing by a software sound source program and processing by other programs are executed in parallel under multi-tasks.

Referring to FIG. 2, the CPU 1 is connected, via a data/address bus 19, to a MIDI interface (MIDI I/F) 12 for inputting MIDI messages from an external device and for outputting MIDI messages to an external device, a timer 16 for counting a timer interrupt time and other various times, a ROM (Read Only Memory) 2 for storing various control programs and table data, a RAM (Random Access Memory) 3 for temporarily storing a selected MIDI file, various input information, and computational results, a mouse 17 used as a pointing device, an alphanumeric keyboard 10 through which character information is mainly inputted, a display 5 composed of a large-sized LCD or a CRT for displaying various information, a hard disk drive 6 for driving a hard disk storing application programs, various control programs to be executed by the CPU 1 and various data, a DMA (Direct Memory Access) controller 14a, and a communication interface (I/F) 11 for transferring data between a server computer 102 via a communication network 101.

The DMA controller 14a directly reads the music tone waveform data generated by the music tone generation processing from an output buffer of the RAM 3 in direct memory access manner dependently on a free space state of a data buffer incorporated in a DAC 14b. The DMA controller 14a transfers the read music tone data to the data buffer of the DAC 14b for sound reproducing process. The analog music tone signal converted by the DAC 14b is sent to a sound system 18, in which the analog music tone signal is converted into a sound.

The hard disk of the hard disk drive 6 stores the above-mentioned OS, utility programs, software for implementing a software sound source that is the above-mentioned software sound source module SSM, and other application programs including the above-mentioned sequencer software APS1.

The output device OUD mentioned in FIG. 1 is equivalent to a module that sends the music tone data supplied from the software sound source module SSM via the above-mentioned second interface IF2 of the OS level to the DAC 14b. As mentioned above, the DMA controller 14a sends the music tone data to the DAC 14b in the direct memory access manner. The output device OUD is executed as interrupt processing by the DMA controller 14a under the control of the CPU 1.

The communication I/F 11 is connected to the communication network 101 such as a LAN (Local Area Network), the Internet, or a public telephone line. The communication I/F 11 is further connected to the server computer 102 via the communication network 101. If none of the above-mentioned programs and parameters are stored on the hard disk of the hard disk drive 6, the communication I/F 11 is used to download the programs and parameters from the server computer 102. A client computer (namely, the sound source system of the present embodiment) sends a command to the server computer 102 via the communication I/F 11 and the communication network 101 for requesting downloading of the programs and parameters. Receiving this command, the server computer 102 distributes the requested programs and parameters to the client computer via the communication network 101. The client computer receives these programs and parameters via the communication I/F 11, and stores the received programs and parameters in the hard disk of the hard disk drive 6, upon which the downloading operation is completed. In addition, an interface for transferring data directly between an external computer may be provided.

The following is an overview of the music tone generation processing based on FM tone generating by the software sound source module SSM with reference to FIGS. 3 through 6. When the sequencer software APS1 is started, MIDI messages are supplied to the software sound source module SSM. To be more specific, the MIDI messages are supplied to a software sound source interface via the first interface IF1 and the OS. Accordingly, the software sound source module SSM generates a music tone parameter VOICEj based on voice data in the form of a voice number assigned to a MIDI channel of the supplied MIDI message. The voice number represents a particular timbre of the music tone. The MIDI channel may corresponds to a particular performance part of the music piece. The SSM loads the generated music tone parameter VOICEj into a timbre register corresponding to a sound channel which is designated or allocated for sounding of the particular performance part of the music piece.

Figure 6:
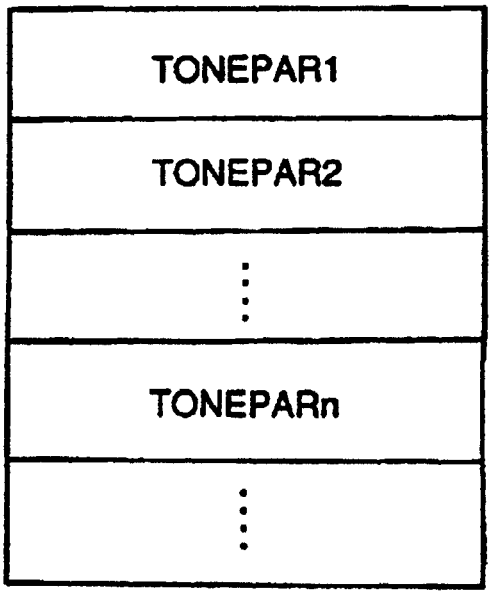
FIG. 6 is a diagram illustrating a timbre register used for expanding timbre parameters of a music tone to be sounded through an assigned channel.

FIG. 6 shows a timbre register group provided to the sound channels. If 32 number of the sound channels are allocated for example, this timbre register group has 32 number of timbre registers TONEPARk (k=1 to 32). It will be apparent that the number of sound channels is not limited to 32 but may be set to any value according to the computational performance of the CPU 1.

Referring to FIG. 6, if the sound channel concerned is channel n, the music tone parameter VOICEj is stored in a area for storing the music tone parameter VOICEj in the timbre register TONEPARn. In other words, the timbre register group composed of these timbre registers TONEPARk provides a part of the software sound source interface of the software sound source module SSM.

It should be noted that, in addition to the music tone parameter VOICEk, these timber registers TONEPARk store data TM indicating a time at which the software sound source module SSM has received a MIDI message corresponding to the music tone parameter VOICEk. The data TM provides information for determining time positions of key-on and key-off operations within a predetermined frame of period.

Figure 3:
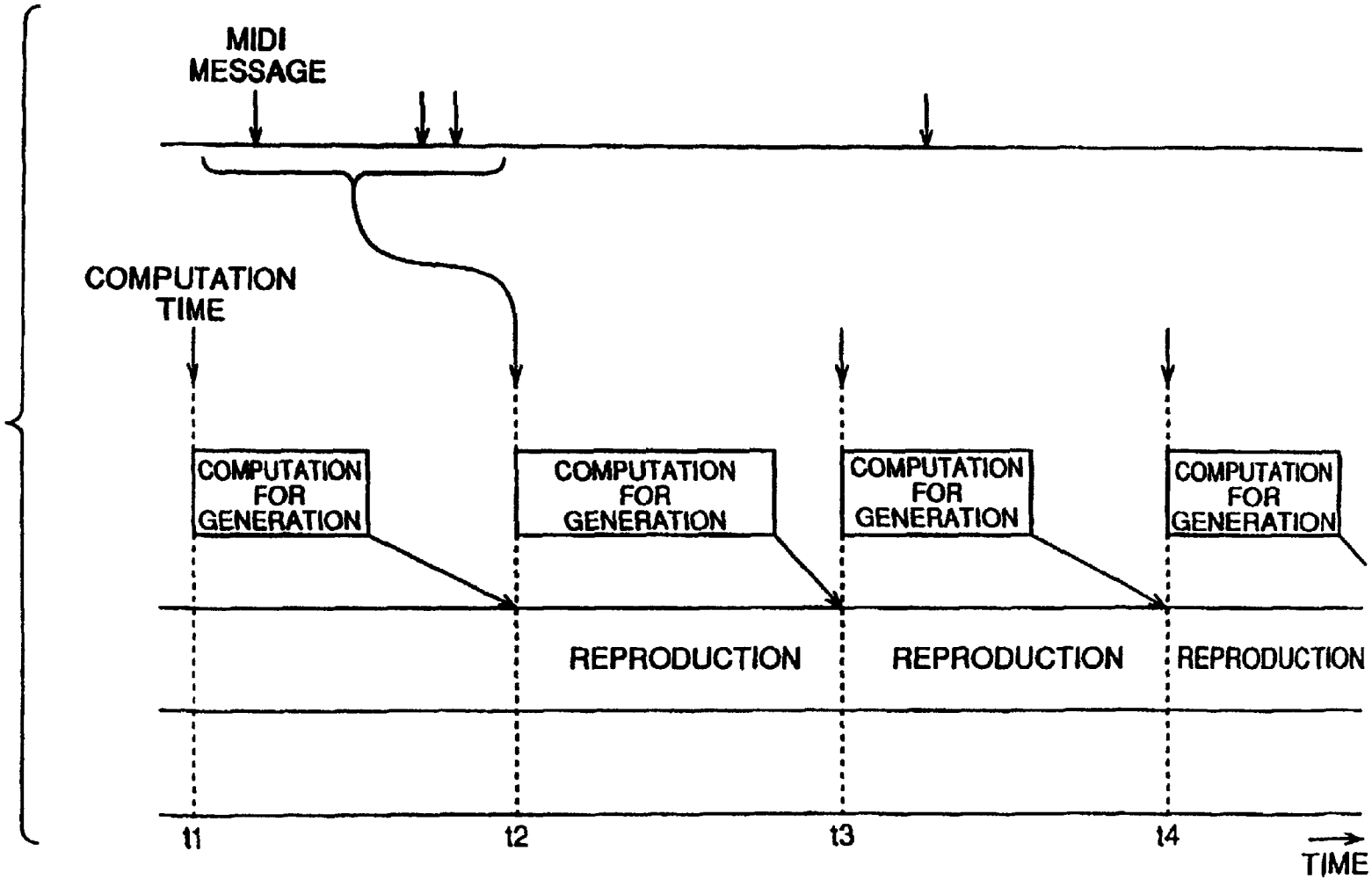
FIG. 3 is a diagram for explaining music tone generation processing performed by the sound source system of FIG. 1.

Referring to FIG. 3, the software sound source module SSM is basically started by a trigger signal which is set for each frame having a predetermined time length, under the control of the CPU 1. The SSM executes the music tone generation processing based on the MIDI messages supplied within a frame immediately before the trigger, according to the music tone parameter VOICEn stored in the timbre register TONEPARn. For example, as shown in FIG. 3, the music tone generation processing based on the MIDI messages supplied within a preceding frame from time t1 to time t2 is executed in a succeeding frame from time t2 to time t3.

When the music tone waveform data for one frame has been generated by the music tone generation processing, the generated music tone waveform data is written to the output buffer of the RAM 3. Reproduction of the written data is reserved in the output device OUD. This reservation in the OUD is equivalent to the outputting of the generated music tone waveform data from the software sound source module SSM to the second interface IF2 (WAVE out API) of the OS level.

The output device OUD reads the music tone waveform data, a sample by sample, from the output buffer reserved for the reproduction in the immediately preceding frame, and outputs the data to the DAC 14b. For example, as shown in FIG. 3, the music tone waveform data generated in the frame from time t2 to time t3 and written to the output buffer for reserved reproduction is read in a next frame from time t3 to time t4 for the sound reproduction.

Figure 4A:
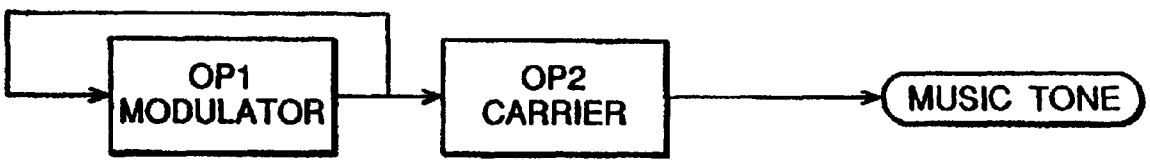
FIGS. 4A through 4C are a diagram for explaining overview of the music tone generation processing based on an FM sound source.
Figure 4B:
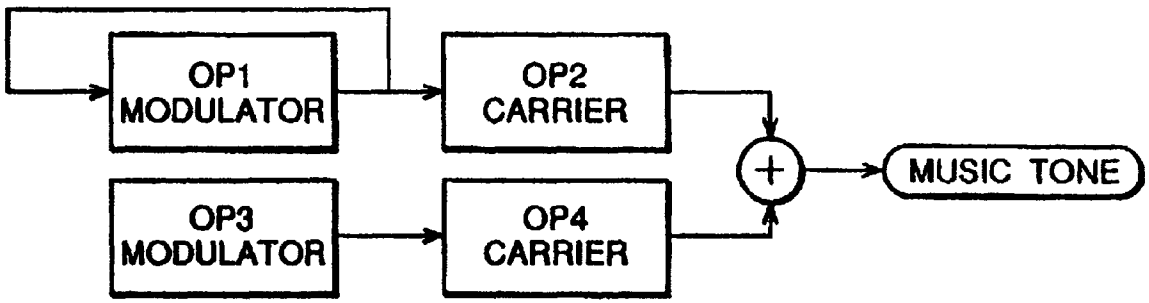
Figure 4C:
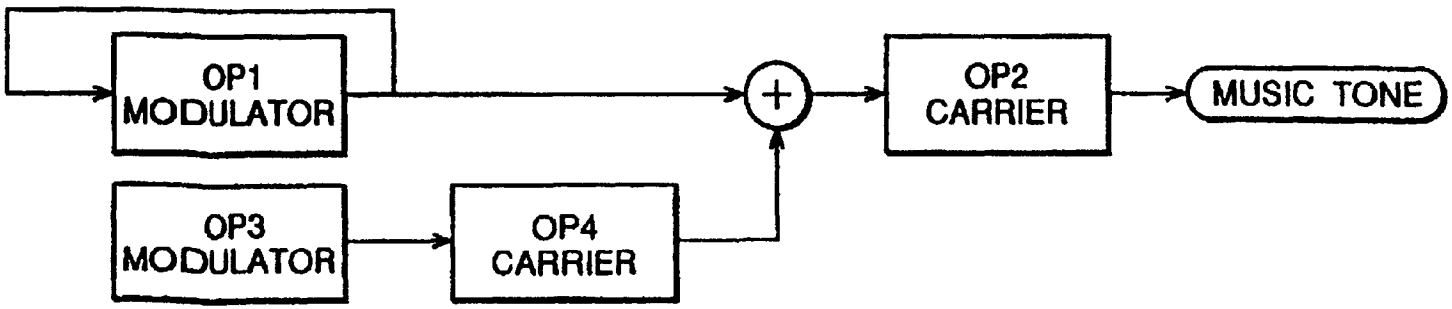
Figure 5:
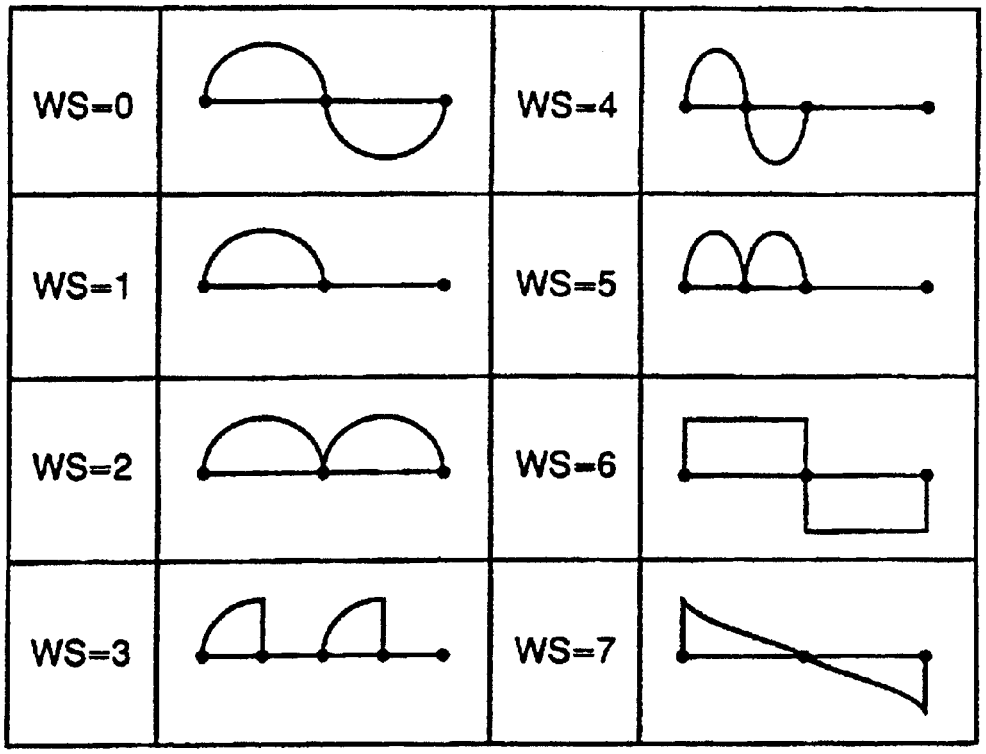
FIG. 5 is a diagram illustrating examples of basic waveform data selected from a basic waveform table.

The following is an overview of the music tone generation processing based on music tone parameter VOICEn. In this embodiment, the music tone generation processing is based on FM tone generating as shown in FIGS. 4A through 4C. FIG. 4A through FIG. 4C show three different music tone generating methods. As shown in the figures, the music tone generation based on FM tone generating is performed by combining two types of operation blocks or operators, namely, an operator called a carrier and an operator called modulator. The different number of combined operators and the different connection sequences (connection modes) are used according to the type and quality of the music tone waveform to be generated. Systematic connection scheme of these operators is called an algorithm.

The operator herein denotes a block that provides a unit in which tone creation or music tone generation processing is performed. To be more specific, from various basic waveform data used for the tone creation, one piece of basic waveforms shown in FIG. 5 for example is selected according to a wave select parameter WSEL and is read based on input data such as pitch data and modulation data. If the input data includes two types of data such as the pitch data and the modulation data, the basic waveform data is read out based on a result obtained by adding these two pieces of data together. Then, the amplitude of this one piece of waveform data is adjusted, and the adjusted data is outputted. The operation block in which these operations are performed is called the operator. Among the operators, the carrier denotes an operator for generating a basic music tone waveform. The modulator denotes an operator for modulating the carrier, namely for generating modulation data for modulating the carrier. It should be noted that the algorithm is not limited to the three types shown in FIGS. 4A through 4C.

Figures 7A, 7B, 7C:
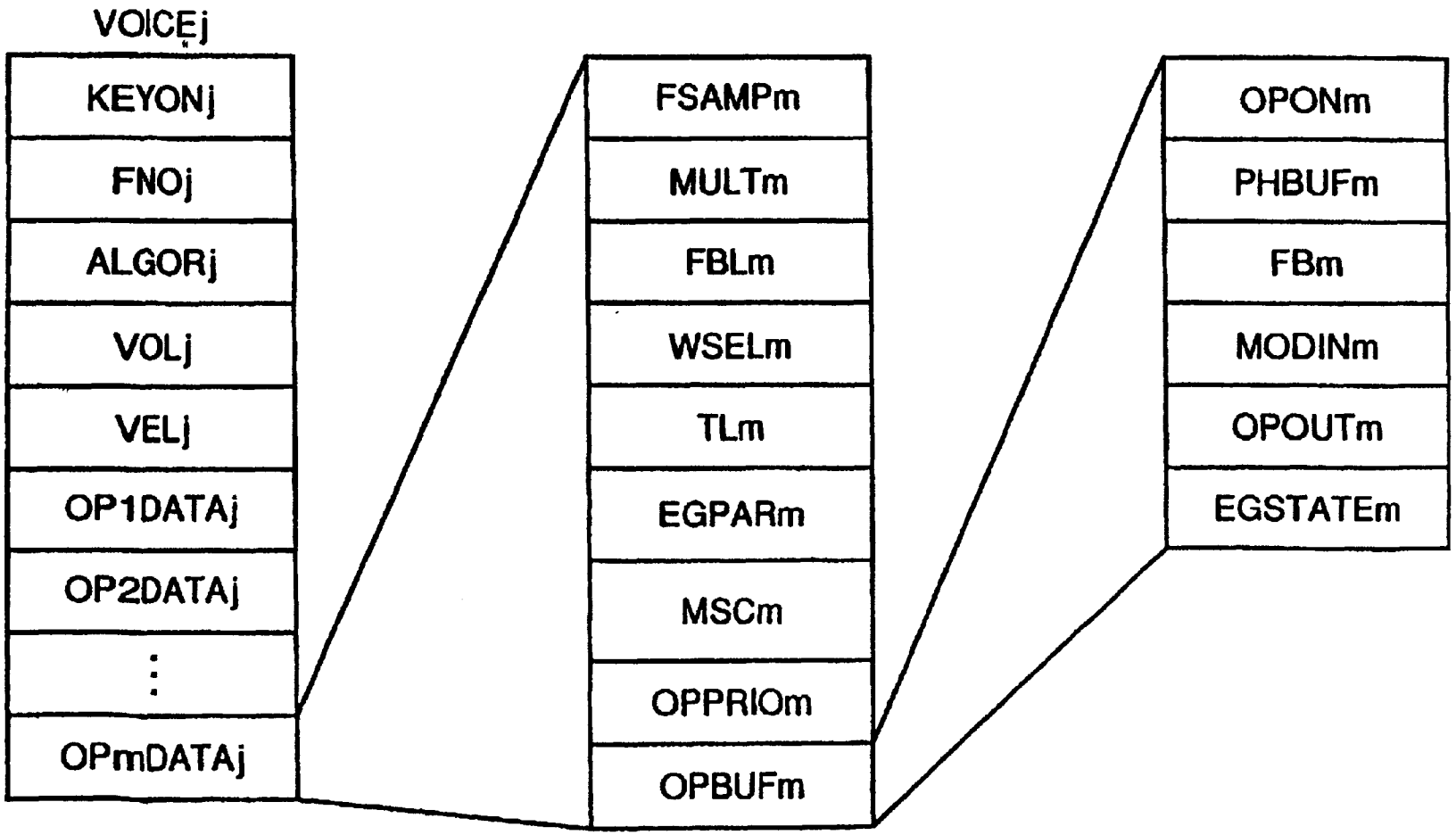
FIGS. 7A through 7C are a diagram illustrating a data format of music tone parameter VOICEj.

The following explains a data format of the above-mentioned music tone parameter VOICEj. FIGS. 7A through 7C show the data format of the music tone parameter VOICEj. FIG. 7A shows the data format of the music tone parameter VOICEj, FIG. 7B shows a data format of each operator data OPmDATAj shown in FIG. 7A, and FIG. 7C shows a data format of each operator buffer OPBUFm shown in FIG. 7B.

As shown in FIG. 7A, the music tone parameter VOICEj is composed of key-on data KEYONj indicating key-on and key-off by "1" and "0" respectively, frequency number FNOj (actually represented by a phase rate) determined by pitch information included in a MIDI message of a corresponding note-on event, algorithm designation data ALGORj for designating one of the above-mentioned algorithms, volume data VOLj determined according to volume set to a MIDI channel concerned. The volume is set by control change #7 event of the MIDI message, for example.

The music tone parameter further contains touch velocity data VELj determined according to touch velocity information in the MIDI message concerned, and operator data OPkDATAj (j=1 to m) made up of a buffer for holding data necessary for computing music tone generation in each of the constituent operators and the results of this computation.

It should be noted that the music tone parameter VOICEj simultaneously has two types of data, one type read from the ROM 2, RAM 3, or the hard disk and the other type determined according to the data in the MIDI message. The data determined according to the MIDI message includes the key-on data KEYONj, the frequency number FNOj, the volume data VOLj, and the touch velocity data VELj. The data read from the ROM 2 and so on includes the algorithm designation data ALGORj and the operator data OPkDATAj.

As shown in FIG. 7B, each operator data OPkDATAj is composed of sampling frequency designation data FSAMPm for designating a sampling frequency used in operator m, frequency multiple data MULTm providing a parameter for substantially setting a frequency ratio between operators (actually, a parameter for designating an integer multiple for varying the above-mentioned frequency number FNOj), feedback level data FBLm indicating a feedback level (namely, a degree of feedback modulation), wave select data WSELm for selecting basic waveform data to be used by operator m from various pieces of basic waveform data (described with reference to FIG. 5) stored in the ROM 2, total level data TLm for setting the output level (varying with the above-mentioned touch velocity data VELj) of a music tone waveform to be generated in the operator m, envelope parameter EGPARm composed of various type of data (for example, attack time, decay time, sustain level, and release time) for determining the envelope of a music tone waveform to be generated in the operator m, data MSCm indicating other parameters (for example, velocity and depth of vibrato and tremolo, and various key scaling coefficients), operator priority data OPPRIOm indicating priority of operator m (for example, priorities of start and stop of the waveform generating computation in each operator), and buffer OPBUFm for storing the results of the music tone waveform generating computation in operator m.

The sampling frequency designation data FSAMPm contains integer value f higher than "0". This integer value f allows the sampling frequency FSMAX (for example, 44.1 kHz) in standard mode to be multiplied by $2^{-f}$. For example, if f=0, a music tone waveform in operator m is generated at the sampling frequency FSMAX of the standard mode; if f=1, a music tone waveform in operator m is generated at the sampling frequency of FSMAX/2.

The operator priority data OPPRIOm contains data (for example, members indicating the order by which waveform computing operations are performed) indicating the priority of the waveform computation processing in all operators k (k=1 to m). According to this priority data, the priority by which each operator is activated is determined for the waveform computation processing. Alternatively, the performance and load states of the CPU 1 are checked to determine the operators to be activated. If this check indicates that the CPU 1 has no more capacity for performing tone generation processing, the computation processing of the operators of lower priorities may be left out. In the present embodiment, the priorities of the computation processing are set according to timbre applied to the music tone. Alternatively, the priorities may be set according to MIDI channels for example. Namely, the priorities set by some reference may be selected for use at sounding. For example, if the priorities are not set according to the timbre, the operator priority data OPPRIOm may be determined based on the timbre parameter expanded in the above-mentioned timbre register TONEPARn. The operator priority data OPPRIOm may be handled also as to determine the setting that operator m is to be used or not.

In the present embodiment, the sampling frequency can be set for each operator m by the above-mentioned sampling frequency designation data FSAMPm. Alternatively, the sampling frequency may be set differently for the two types of the operators, the carrier and the modulator. For example, the carrier may be set to the above-mentioned frequency FSMAX and the modulator may be set to ½ of the FSMAX. In this case, the contents of the algorithm of the timbre parameter concerned are checked and the sampling frequency may be accordingly set for the operators with which the timbre parameter is combined. Alternatively, the load state of the CPU 1 is checked and the sampling frequency may be accordingly increased or decreased.

As shown in FIG. 7C, the buffer OPBUFm is composed of operator-on parameter OPONm indicating by "1" that the waveform computation is performed by operator m (namely, operator m is on), phase value buffer PHBUFm for storing a phase value obtained by performing phase computation on the result of the waveform computation performed by operator m, feedback output value buffer FBm for storing a feedback output value obtained by the feedback sample computation of the above-mentioned waveform computation processing, modulation data input buffer MODINm for storing modulation data (this data is used in the above-mentioned phase computation processing), operator output value buffer OPOUTm for storing the music tone waveform (namely the output value) generated by operator m, and EG state buffer EGSTATEm for storing the EG parameters obtained by the computation processing (hereafter referred to as AEG computation processing) for computing amplitude controlling EG of the above-mentioned waveform computation processing.

Figure 8:
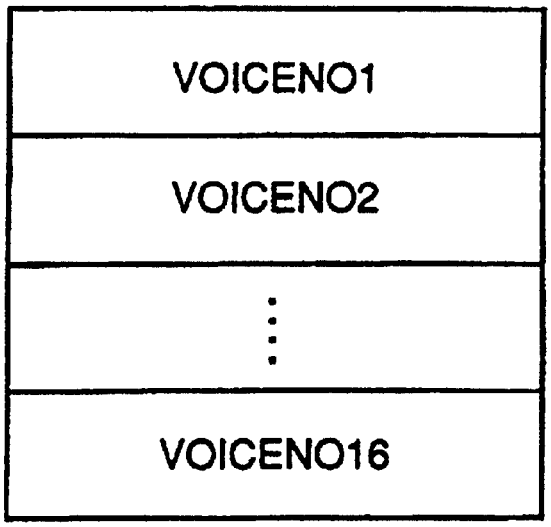
FIG. 8 is a diagram illustrating a MIDI-CH voice table for storing a voice number of music tone parameter VOICEn selectively set in each MIDI channel.

FIG. 8 shows a MIDI-CH voice table for storing voice data representative of a timbre selectively set for each MIDI channel or for each performance part of the music piece. In the present embodiment, the voice data is denoted by a voice number of music tone parameter VOICEn.

As shown in FIG. 8, in the present embodiment, 16 MIDI channels are provided. Different timbres can be set to different MIDI channels corresponding to different performance parts. Consequently, the sound source system of the present embodiment can generate a maximum of 16 types of timbres. This MIDI-CH voice table lists the voice numbers of the timbres assigned to the sound channels, namely the voice numbers contained in the above-mentioned music tone parameters VOICEn.

The MIDI-CH voice table is allocated at a predetermined area in the RAM 3. The table data, namely the voice numbers, are stored beforehand on the hard disk or the like in correspondence with the selected MIDI file. The user-selected MIDI file is loaded into a performance data storage area allocated at a predetermined location in the RAM 3. At the same time, the table data corresponding to the loaded MIDI file is loaded into the MIDI-CH voice table. Alternatively, the user can arbitrarily set the MIDI-CH voice table from the beginning or can change the table after standard voice numbers have been set to the music piece. MIDI messages are sequentially generated by the sequencer program APS1 and the generated MIDI messages are recognized by the software sound source module SSM. The software sound source module SSM then searches the MIDI-CH voice table for the voice number assigned to the MIDI channel of the MIDI message concerned. For example, if the MIDI channel of the MIDI message concerned is "2HC," the voice number stored at the second location VOICEN02 in the MIDI-CH voice table is selected.

When voice number j is found, the software sound source module SSM generates music tone parameter VOICEj as described above. To be more specific, the software sound source module SSM reads the basic data from the ROM 2 and determines other parameters from the MIDI message concerned to generate the music tone parameter VOICEj shown in FIGS. 7A through 7C. Then, the software sound source module SSM expands the generated music tone parameter VOICEj in a timbre register TONEPARn corresponding to the sound channel among the plurality of timbre registers shown in FIG. 6.

As described above, the inventive sound source apparatus has the operation blocks OPs (shown in FIGS. 4A through 4C) composed of softwares used to compute waveforms for generating a plurality of musical tones through a plurality of sound channels according to performance information in the form of the MIDI messages. In the inventive apparatus, a setting device sets an algorithm (shown in FIGS. 4A through 4C) which determines a system of the software sound source module SSM composed of selective ones of the operation blocks OPs systematically combined with each other to compute a waveform specific to one of the musical tones. A designating device including the MIDI API shown in FIG. 1 responds to the performance information for designating one of the channels to be used for generating said one musical tone. A generating device including the CPU 1 allocates the selective operation blocks to said one channel and systematically executes the allocated selective operation blocks according to the algorithm so as to compute the waveform to thereby generate said one musical tone through said one channel.

Preferably, the setting device sets different algorithms which determine different systems corresponding to different timbres of the musical tones. Each of the different systems is composed of selective ones of the operation blocks which are selectively and sequentially combined with each other to compute a waveform which is specific to a corresponding one of the different timbres.

Preferably, the setting device comprises a determining device that determines a first system combining a great number of operation blocks and corresponding to a regular timbre and that determines a second system combining a small number of operation blocks and corresponding to a substitute timbre, and a changing device operative when a number of operation blocks executable in the channel is limited under said great number and over said small number due to a load of the computation of the waveform for changing the musical tone from the regular timbre to the substitute timbre so that the second system is adopted for the channel in place of the first system.

Preferably, the setting device comprises an adjusting device operative dependently on a condition during the course of generating the musical tone for adjusting a number of the operation blocks to be allocated to the channel.

Preferably, the adjusting device comprises a modifying device that modifies the algorithm to eliminate a predetermined one of the operation blocks involved in the system so as to reduce a number of the operation blocks to be loaded into the channel for adjustment to the condition.

Preferably, the adjusting device operates when the condition indicates that an amplitude envelope of the waveform attenuates below a predetermined threshold level for compacting the system so as to reduce the number of the operation blocks.

Preferably, the adjusting device operates when the condition indicates that an output volume of the musical tone is tuned below a predetermined threshold level for compacting the system so as to reduce the number of the operation blocks.

Preferably, the adjusting device operates when the condition indicates that one of the operation blocks declines to become inactive in the system without substantially affecting other operation blocks of the system for eliminating said one operation block so as to reduce the number of the operation blocks to be allocated to the channel.

Preferably, the generating device comprises a computing device responsive to a variable sampling frequency for executing the operation blocks to successively compute samples of the waveform in synchronization to the variable sampling frequency so as to generate the musical tone, and a controlling device that sets the variable sampling frequency according to process of computation of the waveform by the operation blocks.

Preferably, the generating device comprises a computing device responsive to a variable sampling frequency for executing the operation blocks to successively compute samples of the waveform in synchronization to the variable sampling frequency so as to generate the musical tone, and a controlling device for adjusting the variable sampling frequency dependently on a load of computation of the waveform during the course of generating the musical tone.

Preferably, the generating device comprises a computing device responsive to a variable sampling frequency for executing the operation blocks to successively compute samples of the waveform in synchronization to the variable sampling frequency so as to generate the musical tone, and a controlling device for adjusting the variable sampling frequency according to result of computation of the samples during the course of generating the musical tone.

Figure 9:
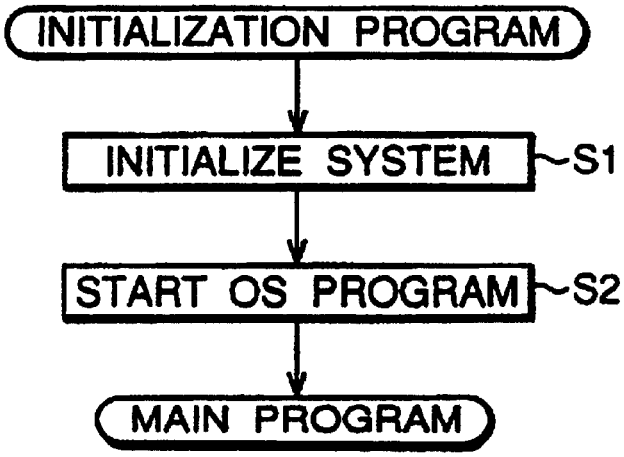
FIG. 9 is a flowchart indicating procedure of an initialization program executed by the CPU of the sound source system of FIG. 1.

The following explains the control processing to be performed by the sound source system thus constituted, with reference to FIGS. 9 through 20. FIG. 9 is a flowchart showing the procedure of an initialization program to be executed by the CPU 1 in the sound source system of the present embodiment. The initialization program is executed when the user turns on the power to the sound source system, or presses a reset switch thereof. First, system initialization such as resetting ports and clearing the RAM 3 and a video RAM in the display 5 is performed (step S1). Next, the OS program is read from the hard disk of the hard disk drive 6 for example, and the OS program is loaded in a predetermined area in the RAM 3 so as to run the OS program (step S2). Then, the process goes to the execution of a main program.

Figure 10:
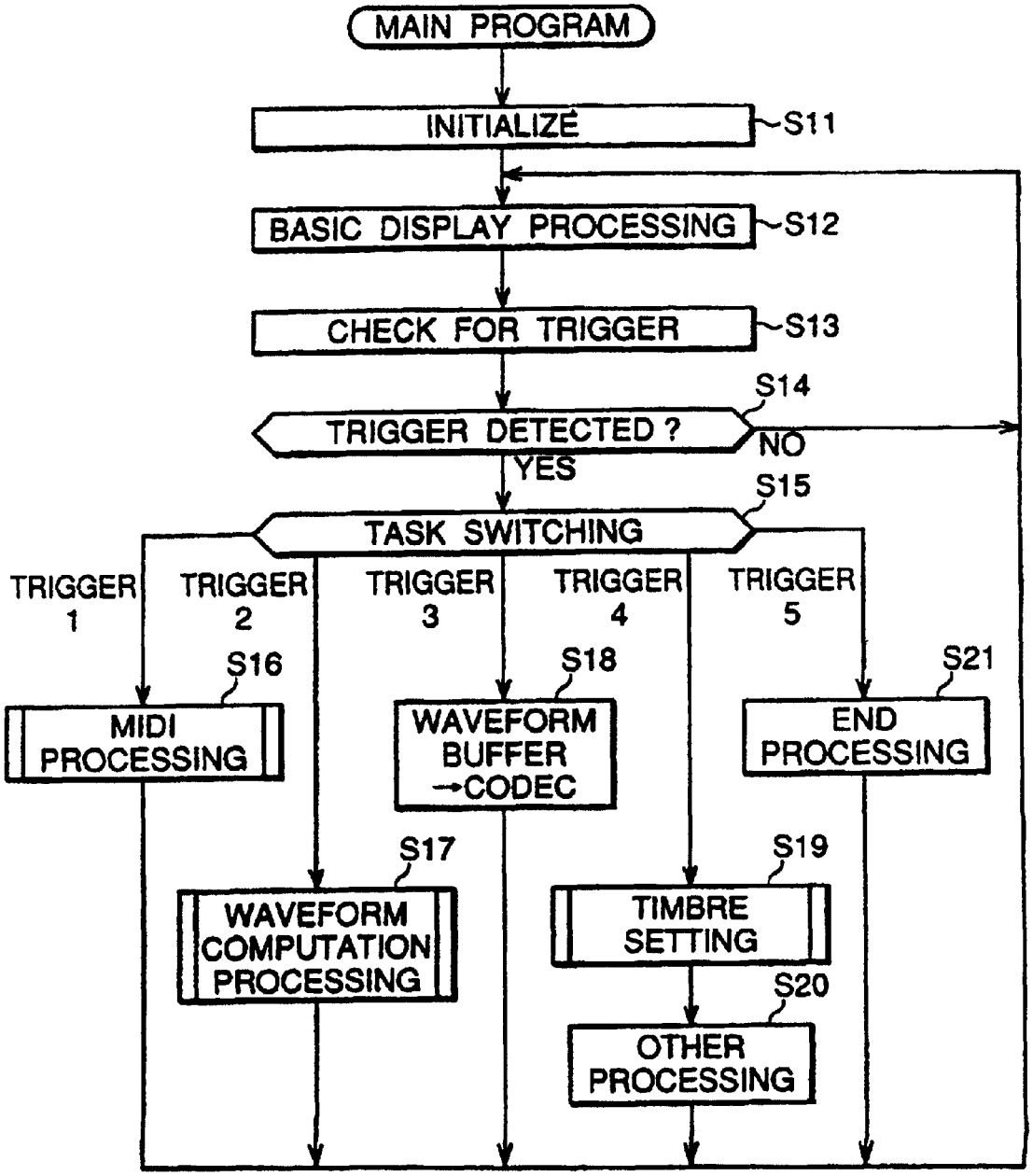
FIG. 10 is a flowchart indicating procedure of a main program executed by the CPU after the initialization program of FIG. 9.

FIG. 10 is a flowchart indicating the procedure of the main program to be executed by the CPU 1 after execution of the initialization program. This main program is the main routine of the software sound source module SSM. First, the area containing the timbre register group shown in FIG. 6 in the RAM 3 to be used by the software sound source module SSM is cleared. At the same time, the various types of basic data (for example, the various pieces of basic waveform data shown in FIG. 5) stored in the hard disk of the hard disk drive 6 are loaded in a predetermined area in the RAM 3 (step S11). Next, basic graphic operation is performed to display information according to the progression of processing and to display menu icons to be selected mainly by the mouse 7 (step S12).

Then, the sound source module SSM checks to see whether any of the following triggers has taken place (step S13).

Trigger 1: the sequencer software APS1 has been started for supplying a MIDI message to the software sound source module SSM.

Trigger 2: an internal interrupt signal (a start signal) for starting execution of the waveform computation processing by the SSM has been generated by a software timer.

Trigger 3: a request has been made by the CODEC hardware for transferring the music tone waveform data from the output buffer to a buffer in the CODEC hardware.

Trigger 4: the user has operated the mouse 7 or the keyboard 8 and the corresponding operation event has been detected.

Trigger 5: the user has terminated the main routine and the corresponding operation event has been detected.

In step S14, the CPU 1 determines which of the above-mentioned triggers 1 through 5 has taken place. If the trigger 1 has been taken place, the software sound source module SSM passes control by the CPU 1 to step S16, in which a MIDI processing subroutine is executed. If the trigger 2 has been taken place, the software sound source module SSM passes control to step S17, in which a waveform computation processing subroutine is executed. If the trigger 3 has taken place, the process goes to step S18, in which the music tone waveform data is transferred from the output buffer to the buffer of the CODEC hardware. If the trigger 4 has taken place, the software sound source module SSM passes control to step S19, in which a timbre setting processing subroutine is executed especially if a timbre setting event has occurred; if another event has occurred, corresponding processing is performed in step S20. If the trigger 5 has taken place, the software sound source module SSM passes control to step S21, in which end processing such as returning the screen of the display 5 to the initial state provided before the main program was started. Then, any of the steps S16 through S21 has been ended, the software sound source module SSM passes control to step S12 to repeat the above-mentioned operations.

Figure 11:
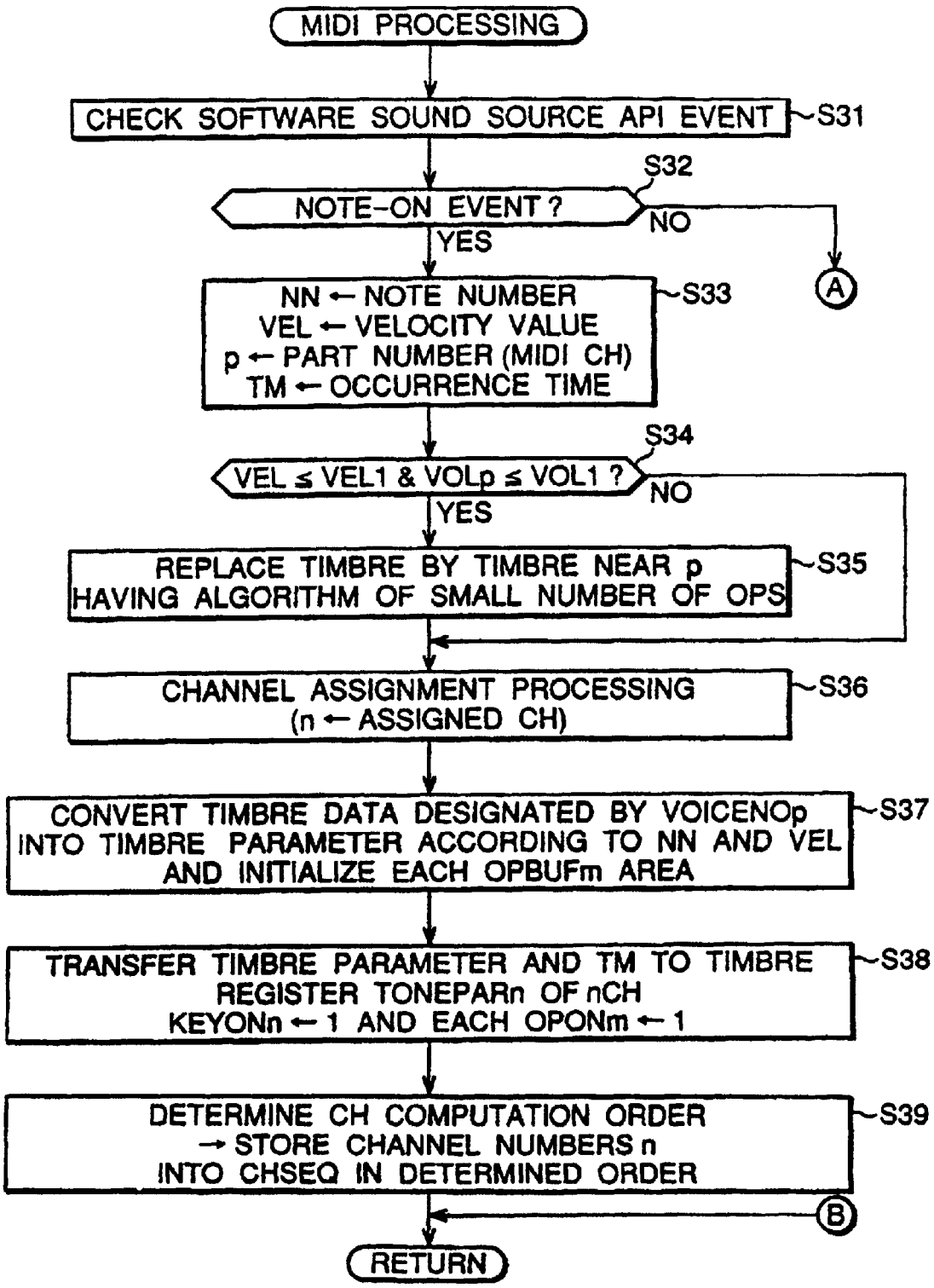
FIG. 11 is a flowchart indicating detailed procedure of a MIDI processing subroutine contained in the main routine of FIG. 10.
Figure 12:
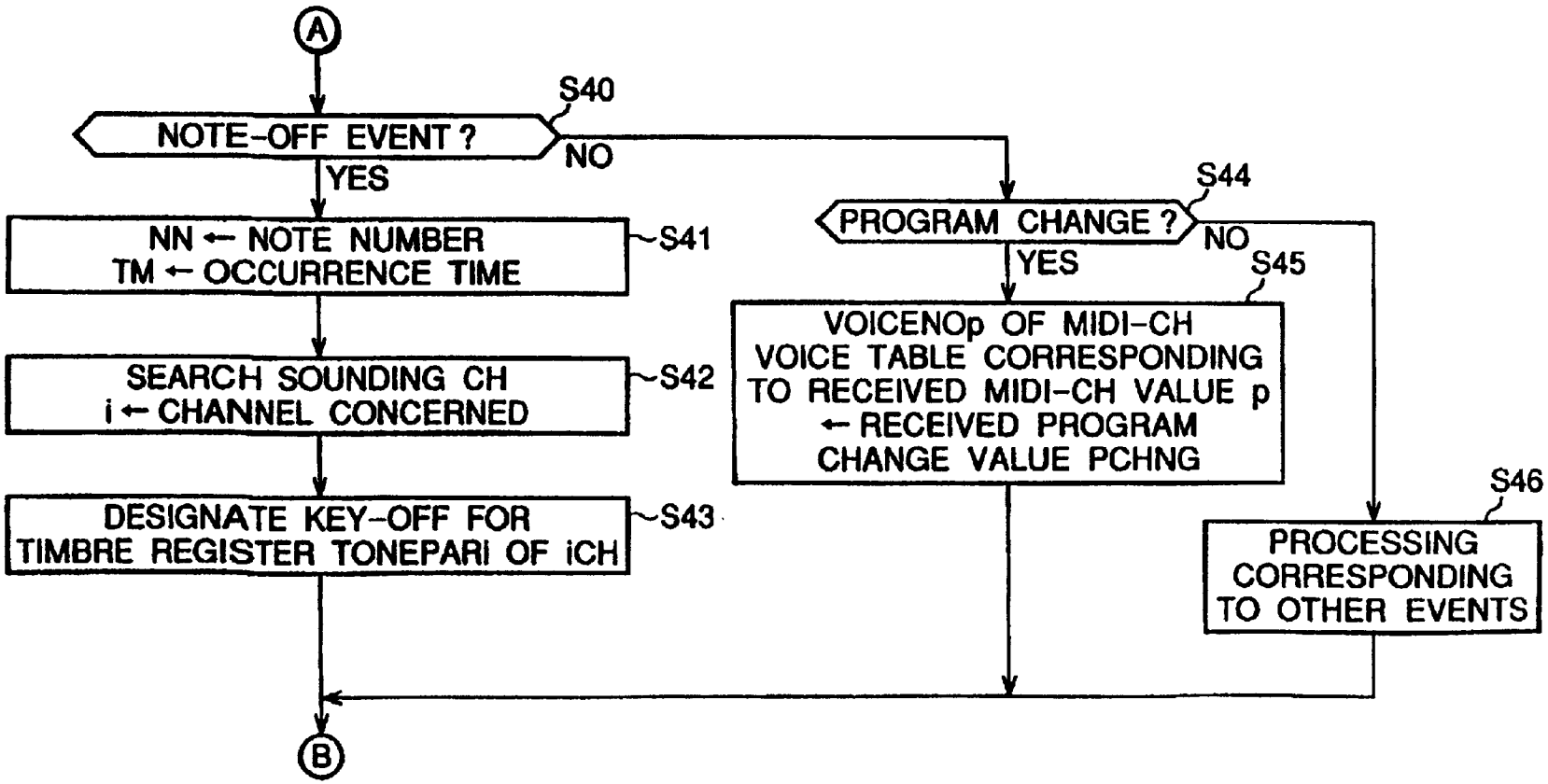
FIG. 12 is a flowchart indicating a continued part from the MIDI processing subroutine of FIG. 11.

FIGS. 11 and 12 are flowcharts indicating the detailed procedure of the MIDI processing subroutine of step S16. First, the software sound source module SSM checks to see whether a MIDI event (a MIDI message) has been inputted via the software sound source interface API of the software sound source module SSM (step S31). When a MIDI message is outputted from the sequencer software APS1, the outputted MIDI message is converted in a predetermined manner by the first interface IF1 and the OS. The converted MIDI message is then transferred to a MIDI event buffer allocated at a predetermined area in the RAM 3 via the software sound source interface API. When this transfer is made, the software sound source module SSM determines that the trigger 1 has taken place, thereby passing control by the CPU 1 from step S15 to step S16. The processing operations so far are performed in the preparation processing of step S20 in the main routine of FIG. 10. In step S31, the software sound source module SSM monitors the event occurrence by checking the MIDI event buffer.

Next, in step S32, the software sound source module SSM determines whether the MIDI event is a note-on event. If the MIDI event is found a note-on event, the software sound source module SSM passes control to step S33; if not, the SSM passes control to step S40 shown in FIG. 12. In step S33, the SSM decodes the note-on event data and stores resultant note-number data, velocity value data and part number data (namely, the MIDI channel number) into registers NN, VEL, and p, respectively. Further, the SSM stores the data about the time at which the note-on event should take place into a register TM allocated at a predetermined position in the RAM 3. Hereafter, the contents of the registers NN, VEL, p, and TM are referred to as note number NN, velocity VEL, part p, and time TM, respectively.

In step S34, the software sound source module SSM determines whether velocity VEL is lower than a predetermined value VEL1 and whether volume data VOLp is lower than a predetermined value VOL1. The VOLp denotes the volume data of the part p stored in area VOLp allocated at a predetermined area in the RAM 3. This VOLp is changed by the control change #7 event of the MIDI message as explained with reference to FIG. 7A. The change is performed in the miscellaneous processing of step S20 when the source change #7 event has taken place. In step S34, if VEL≦VEL1 and VOL≦VOL1, the regular timbre allotted to the part p is replaced by a substitute timbre of an algorithm having a small number of operators, namely a small total number of carriers and modulators. That is, the voice number stored in VOICEp of the part p in the above-mentioned MIDI-CH voice table is replaced by the voice number of the music tone parameter VOICE having an alternate algorithm (step S35). If VEL>VEL1 or VOL>VOL1, the SSM skips step S35 and passes control to step S36. In the present embodiment, whether the processing of step S35 is to be performed is determined according to the values of velocity VEL and volume VOL. The decision may also be made by detecting the load state of the CPU 1 and according to the detection result, for example.

In step S36, channel assignment processing based on the note-on event concerned is performed. The channel number of the assigned sound channel is stored in register n allocated at a predetermined location in RAM 3. The contents stored in the register n are hereafter referred to as sound channel n. In step S37, the MIDI-CH voice table shown in FIG. 8 is searched. The timbre data (voice number) of VOICENOp of the part p in the table is converted into a music tone parameter according to the above-mentioned note number NN and velocity VEL. For example, if voice number j is stored in VOICENOp, the music tone parameter VOICEj explained with reference to FIG. 7A is generated. Then, the buffer OPBUFm in each operator data OPmDATAj of the music tone parameter VOICEm is initialized or cleared.

Figure 13:
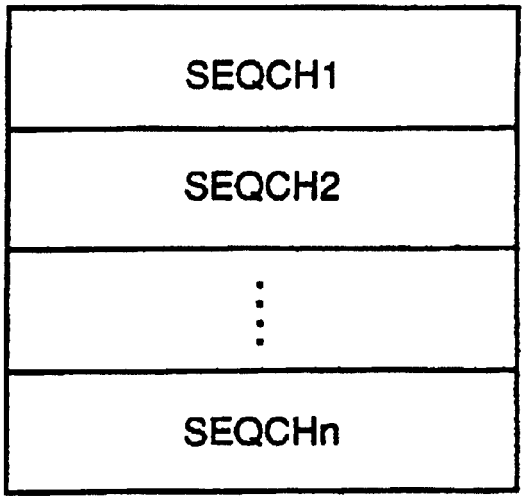
FIG. 13 is a diagram illustrating an example of a format of a CH sequence register.

In step S38, the music tone parameter VOICEj generated in step S37 is transferred or expanded along with time TM into the timbre register TONEPARn corresponding to the sound channel n. At the same time, key-on data KEYONn in the timbre register TONEPARn and each operator-on parameter OPONm are set to "1" (on). Further, in step S39, the computational order is determined among the sound channels assigned for sounding such that music tone generating computations are performed in the order of note-on event occurrence times. To be more specific, the channel numbers are rearranged according to the determined computational order and the rearranged channel numbers are stored in CH sequence register CHSEQ allocated at a predetermined position in the RAM 3, upon which this MIDI processing comes to an end. The CH sequence register CHSEQ is illustrated in FIG. 13.

In step S40 of FIG. 12, it is determined whether the MIDI event is a note-off event. If the MIDI event is found a note-off event, the SSM passes control to step S41; otherwise, the SSM passes control to step S44. In step S41, the note-off event data concerned is decoded. The note number turned off is stored in the register NN. At the same time, data indicating the time at which the note-off event should occur is stored in the register TM. In step S42, the sound channel with the note number NN assigned for sounding is searched. The channel number obtained is stored in register i (this value is hereafter referred to as "sound channel i") allocated at a predetermined position in the RAM 3. In step S43, key-off is designated for timbre register TONEPARi corresponding to sound channel i. Namely, after note-off is reserved in the timing corresponding to time TM, this MIDI processing is ended.

In step S44, it is determined whether the MIDI event is a program change event for changing timbres. If the MIDI event is found a program change event, the data of VOICENOp at the position corresponding to the part p (this part p is not necessarily the part number stored in step S33) designated by the received program change event is changed to value PCHNG designated by the received program change event, upon which this MIDI processing comes to an end (step S45). On the other hand, if the MIDI event is found other than a program change event, the corresponding processing is performed, upon which this MIDI processing comes to an end.

In this MIDI processing, the timbres corresponding to a plurality of parts are designated in the MIDI-CH voice table. If a note-on event of a plurality of designated parts occurs, a music tone having timbres of the plurality of parts is generated and sounded. Namely, this MIDI processing uses multi-timbre operation specifications. Alternatively, this MIDI processing may use a single-timbre mode in which only a note-on event of a particular part is accepted to generate a music tone of the corresponding timbre.

Figure 14:
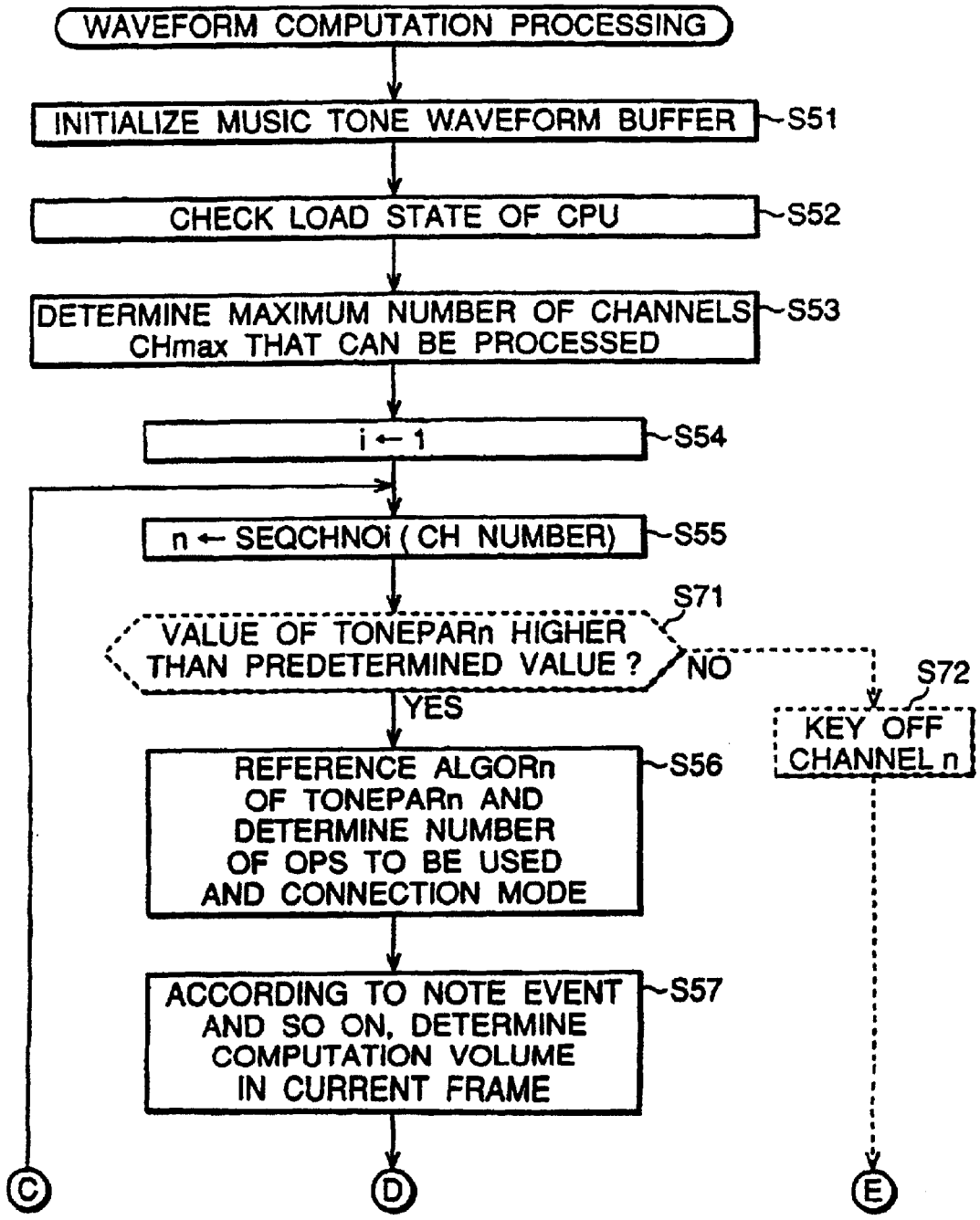
FIG. 14 is a flowchart indicating detailed procedure of a waveform computation processing subroutine contained in the main routine of FIG. 10.
Figure 15:
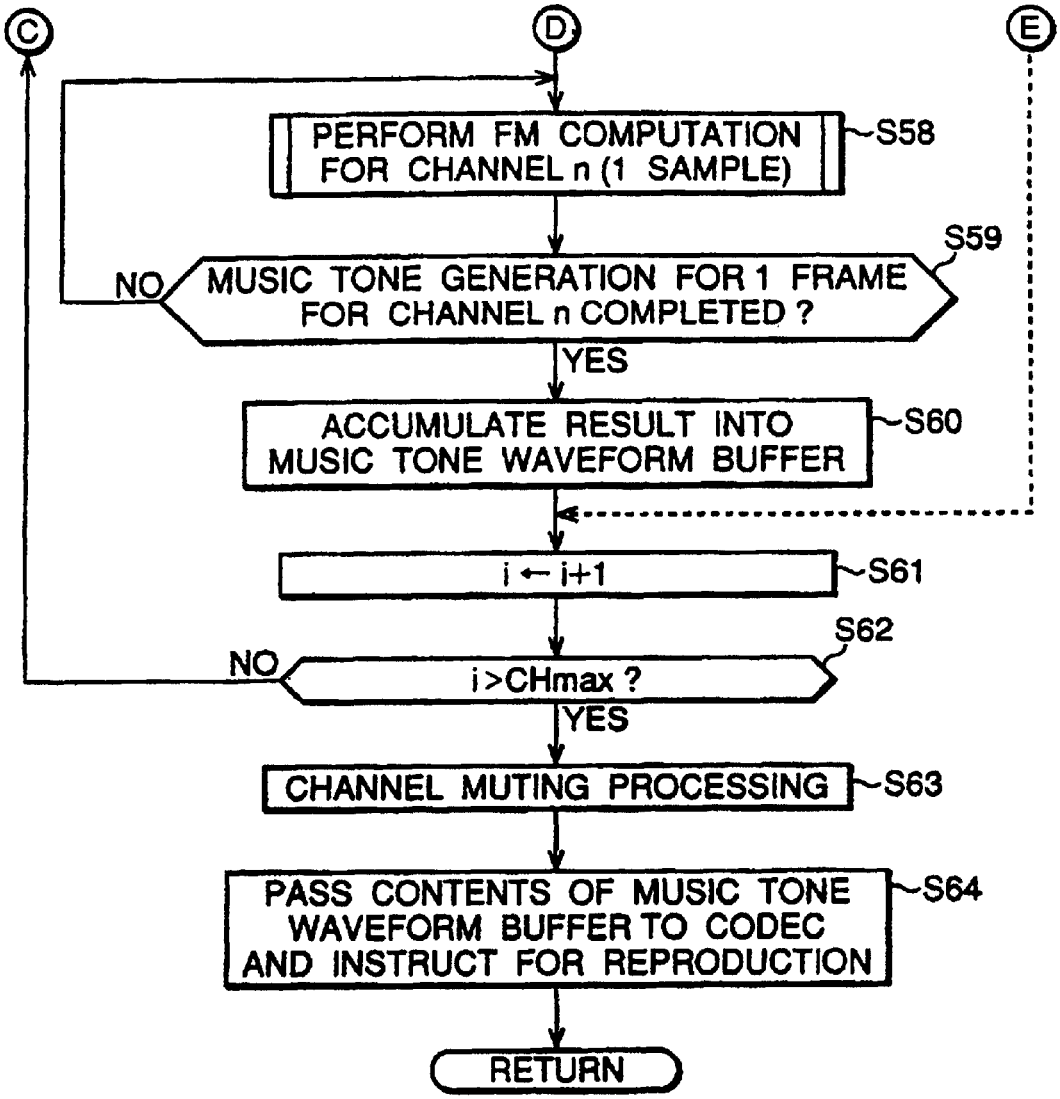
FIG. 15 is a flowchart indicating a continued part from the waveform computation processing subroutine of FIG. 14.

FIGS. 14 and 15 are flowcharts indicating detailed procedures of the waveform computation processing subroutine performed in step S17 of FIG. 10. First, a music tone waveform buffer is initialized (step S51). A music tone waveform buffer exists in an area other than a reserved area (buffer) for reproduction in the output buffer. The music tone waveform buffer provides an area for one frame time of waveforms to be generated this time. The initialization of this music tone waveform buffer is to allocate that area in the output buffer and to clear that area. Next, the load state of the CPU 1 is checked (step S52). Based on the check result, a maximum number of channels CHmax that can execute the waveform computation processing is determined (step S53). If the OS always checks the load state of the CPU 1, the check of step S52 may be performed using this load state information. If the OS does not always check the load state of the CPU 1, a routine may be provided that counts a time for looping the main program of FIG. 10 once. The check of step S52 may be performed using a value obtained based on the measured time. Instead of the processing of step S53, processing similar to the processing of step S35 of FIG. 11 may be performed. Namely, the timbre changing process is conducted for changing the timbre assigned to the part to an alternate timbre having a smaller number of constituting operators.

Then, index i indicating a channel number is initialized to "1" (step S54). In step S55, the channel number SEQCHNOi stored in SEQCHi at i position in the CH sequence register CHSEQ shown in FIG. 13 is stored in variable n (in this waveform computation processing subroutine, this value is referred to as "channel n"). In step S56, algorithm designation data ALGORn of the music tone register TONEPARn corresponding to channel n is referenced to determine the number of operators (OPs) and the connection mode of each operator to be used in the FM computation processing for channel n.

Moreover, a computation amount in the current frame is determined according to the note events and the like (step S57). The determination of the computation amount actually denotes determining a net area of the music tone waveform buffer for which the waveform computation processing is to be performed in channel n. The music tone waveform buffer is the area sufficient to store waveform data of one frame time in which the current computation is made. On the other hand, the music tone waveform data of each channel is not necessarily generated all over the area for one frame. Namely, since the sounding timing and muting timing of music tones are different for different channels, a music tone of a certain channel may be turned on or off halfway in the music tone waveform buffer. In view of this, the computation amount must be determined for each channel.

Next, in step S58 of FIG. 15, the FM computation processing subroutine for generating music tone waveform data for one sample is generated for channel n. In step S59, it is determined whether the music tone generation processing for one frame for channel n has been completed. It should be noted that the determination of step S59 is performed by considering the computation amount determined in step S57. In step S59, if the music tone generation processing for one frame for channel n has not been completed, the SSM passes control back to step S58, in which the music tone waveform data of next sample is generated. If, in step S59, the music tone generation processing for one frame for channel n has been completed, the SSM passes control to step S60.

In step S60, the music tone waveform data for one frame generated in steps S58 and S59 is written to the music waveform buffer. At this moment, if music tone waveform data is already stored in the music waveform buffer, the data obtained this time is accumulated to the existing data and a result of the addition is written to the music tone waveform buffer. Then, the value of index i is incremented by one (step S61) to determine whether the resultant value of index i is greater than the above-mentioned maximum number of channels CHmax (step S62).

In step S62, if i≦CHmax, or if there are more channels to be processed for the waveform generation, the SSM returns control to step S55, in which the above-mentioned processing operations are repeated. If i>CHmax, or if there is no channel to be processed, muting channel processing for gradually decreasing the size of a volume envelope is performed for the sound channel turned off this time (step S63). In step S64, the music tone waveform data thus generated is removed from the music tone waveform buffer, and the removed data is passed to the CODEC hardware which is an output device. Then, reproduction of the data is instructed, upon which this waveform computation processing comes to an end.

If the velocity value of channel n gets smaller than a predetermined value, the FM computation for that channel n may not be performed. In order to implement this operation, step S71 is provided after the above-mentioned step S55 as shown in FIG. 14. In step S71, it is determined whether touch velocity data VELn in the timbre register TONEPARn of channel n is higher than predetermined value VELn1. If VELn≧VELn1, the SSM passes control to step S56; if VELn<VELn1, key-off is designated for channel n in the similar manner as that of step S43 shown in FIG. 12. Then, the SSM passes control to step S61.

Figure 16:
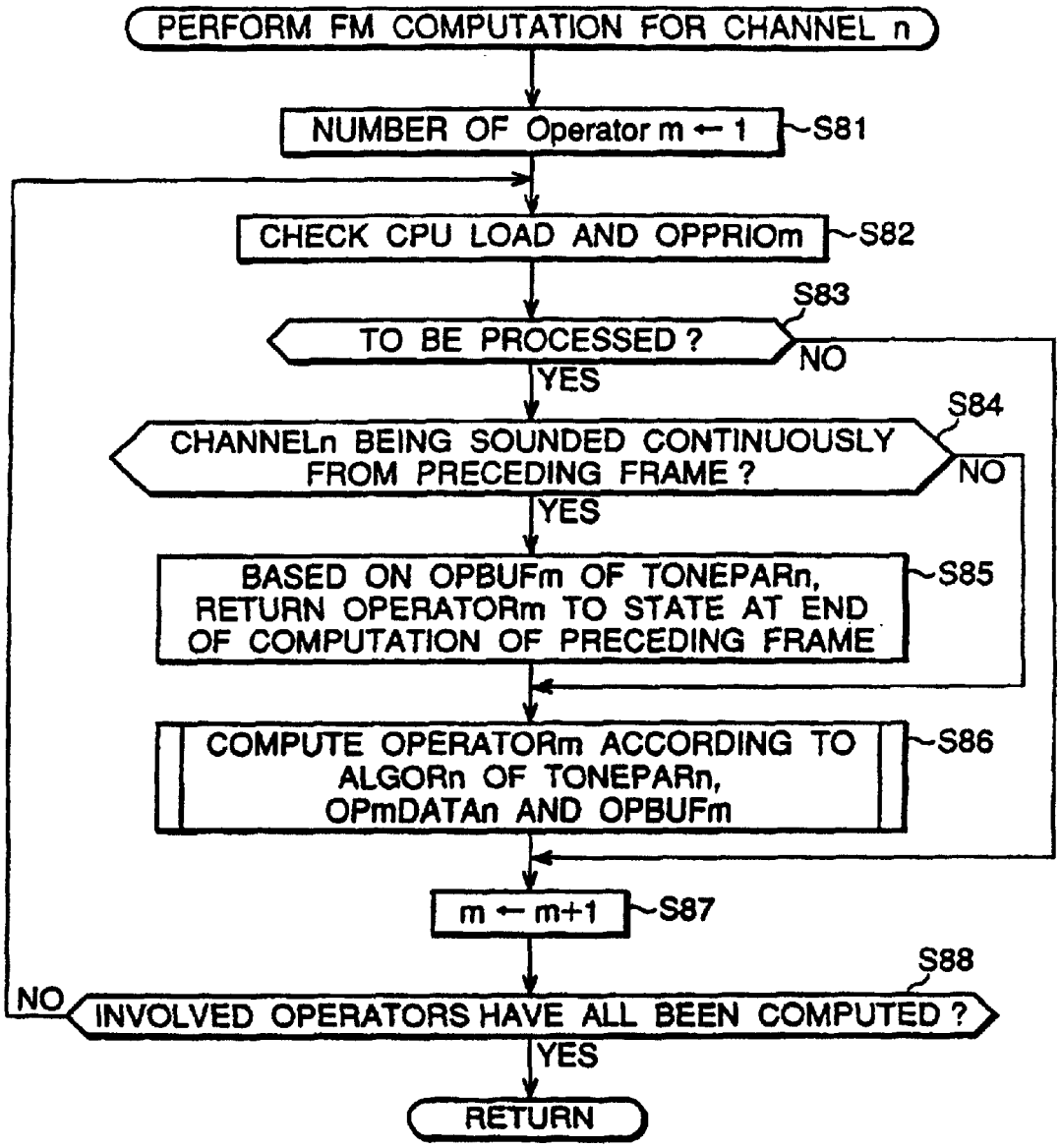
FIG. 16 is a flowchart indicating detailed procedure of an FM computation processing subroutine for one channel.

FIG. 16 is a flowchart indicating the detailed procedure of the FM computation processing subroutine for channel n executed in step S57. Referring to FIG. 16, variable m for storing the operator number of an operator to be processed is initialized (set to "1"). Hereafter, such an operator is referred to as the operator m to be computed. Next, the load state of the CPU 1 is checked and, at the same time, operator priority data OPPRIOm of the operator m to be computed is checked (step S82). Based on the check results, it is determined whether the operator computation processing for the operator m is to be performed (step S83).

In step S83, if the operator computation processing for the operator m is to be performed, it is determined whether channel n is currently sounding continuously from the preceding frame (step S84). If channel n is found continuously sounding, based on each data stored in the buffer OPBUFm in the operator data OPmDATAn of the timbre register ONEPARn, the operator data OPmDATAn is returned to the state of the operator m at the end of computation of the preceding frame (step S85). The buffer OPBUFm in each operator data OPmDATAn holds the result obtained by the computation performed immediately before. Using this result allows the return to the state of the immediately preceding operator data OPmDATAn. The operator data OPmDATAn is returned to the state at the end of computation of the preceding frame because the music tone waveform data of channel n in the current frame must be generated as the continuation from the preceding frame.

On the other hand, if channel n is found not sounding continuously from the preceding frame in step S84, the SSM skips step S85 and passes control to step S86. In step S86, the operator computation processing subroutine for the operator m is executed. In step S87, the value of variable m is incremented by one. In step S88, if there are more operators to be processed, the SSM returns control to step S82, in which the above-mentioned processing operations are repeated. If there is no more operator to be processed, the FM computation processing for channel n comes to an end.

In steps S82 and S83, the load state of the CPU 1 is checked to determine whether the computation of the operator m is to be performed. Alternatively, the computation for the operators having lower priority may not be performed regardless of the load state of the CPU 1. This can increase the number of sound channels when the capacity of the CPU 1 is not so high.

Figure 17:
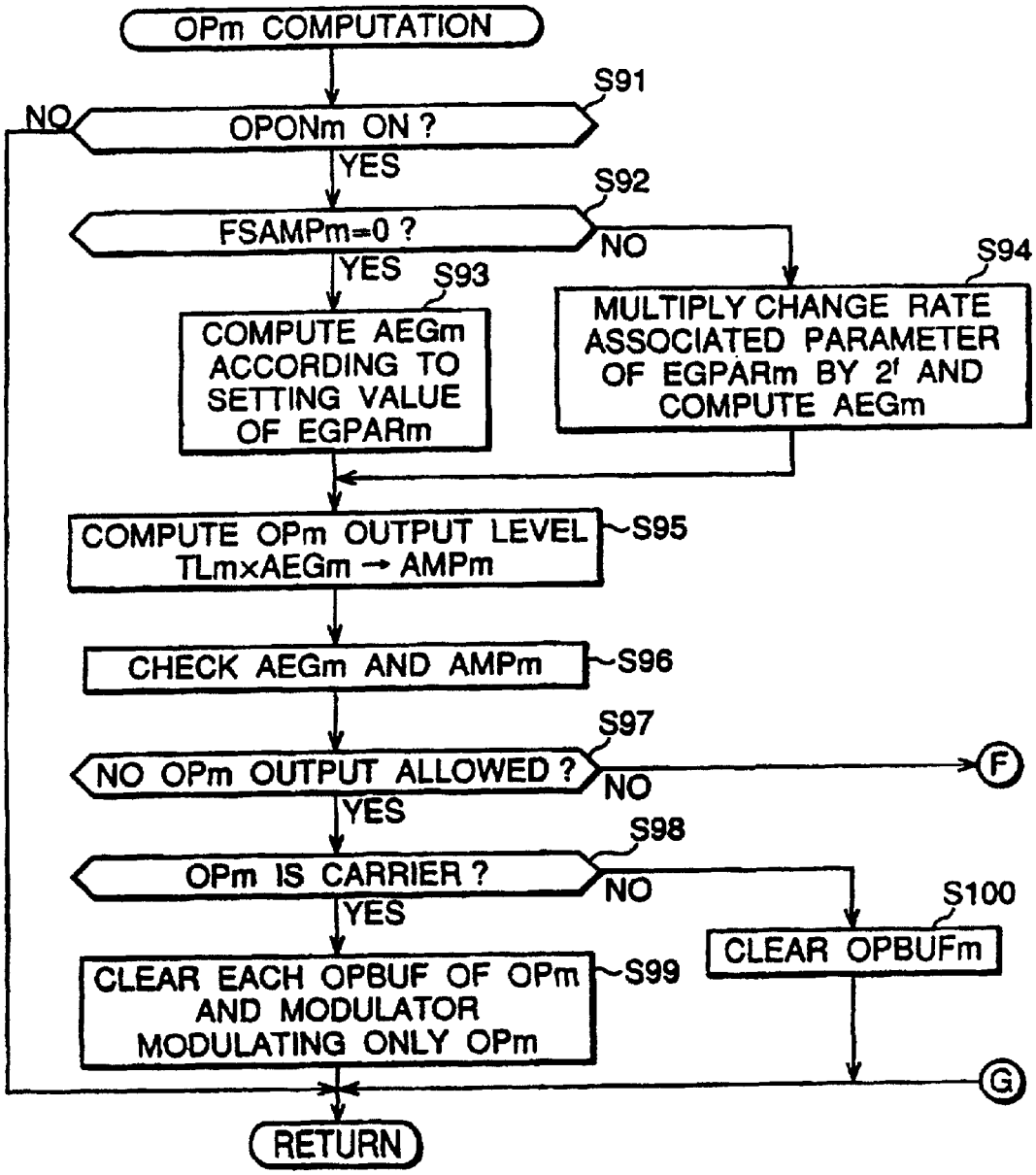
FIG. 17 is a flowchart indicating detailed procedure of an operator computation processing subroutine for one operator.
Figure 18:
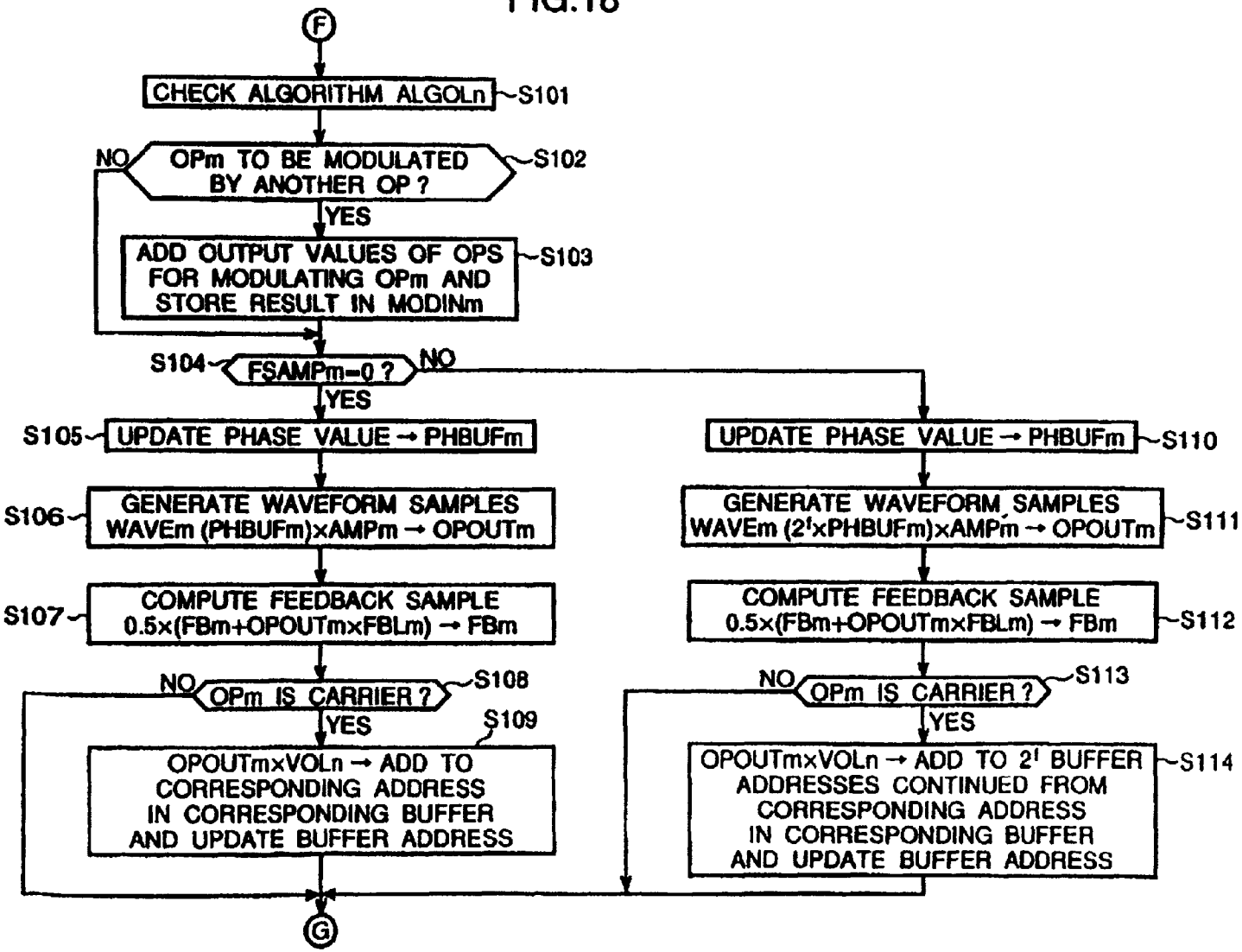
FIG. 18 is a flowchart indicating a continued part from the operator computation processing subroutine.
Figure 19:
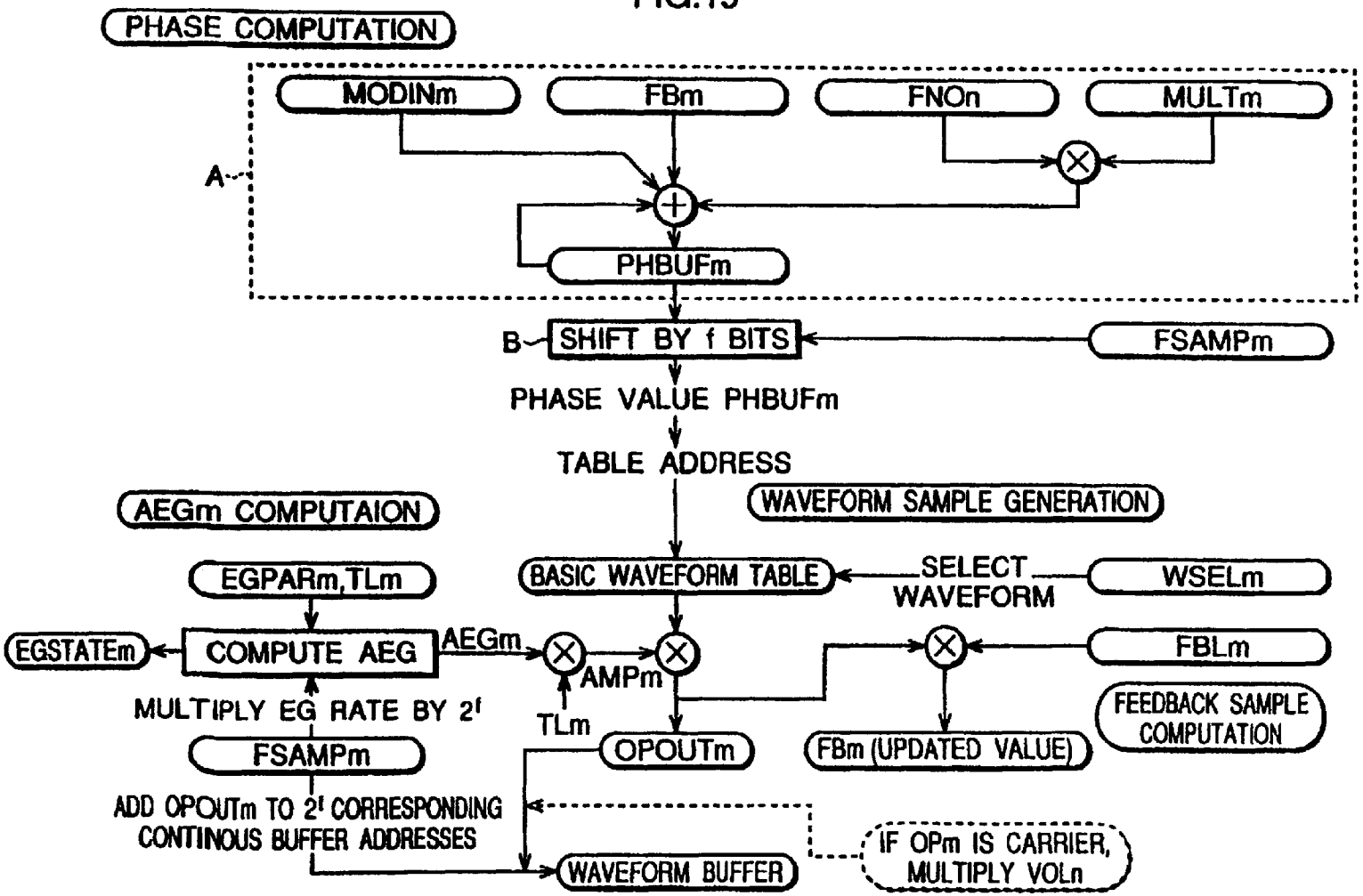
FIG. 19 is a diagram illustrating a basic flow of an operator computation performed in the operator computation processing of FIGS. 17 and 18.

FIGS. 17 and 18 are flowcharts indicating the detailed procedure of the operator computation processing subroutine for the operator m performed in step S86. FIG. 19 is a diagram illustrating the basic flow of the operator computation to be performed in this operator computation processing. The following explains the operator computation processing for the operator m with reference to FIGS. 17 through 19. Referring to FIG. 17, it is determined whether the operator-on parameters OPONm in the operator data OPmDATAn of the operator m is on ("1") (step S91). If OPONm is "0", or the operator m does not require operator computation, this operator computation processing is ended immediately. If OPONm is "1", or the operator m requires operator computation, the SSM passes control to step S92.

In step S92, it is determined whether the sampling frequency designation data FSAMPm in the operator data OPmDATAn is "0" or not. Namely, it is determined whether a music tone waveform is to be generated at the sampling frequency FSMAX of standard mode. If FSAMPm="0", it indicates the standard mode in which each operator performs the music tone waveform generation at the standard sampling frequency. Then, AEGm computation is performed according to the setting value of the envelope parameter EGPARm in the operator data OPmDATAn. The result of this computation is stored in the EG state buffer EGSTATEm (step S93).

On the other hand, if FSAMPm≠"0", for example, FSAMPm=f, the sampling frequency FSMAX of the standard mode is multiplied by $2^{-f}$ and the music tone waveform generation is performed at the resultant frequency. Namely, in step S94, a parameter of which rate varies (hereafter referred to as a variable-rate parameter) in the envelope parameters EGPARm is multiplied by $2^{f}$ to perform the AEG computation. The result is stored in the EG state buffer EGSTATEm. The rate of the variable-rate parameter is multiplied by $2^{f}$ before the envelope generating computation for the following reason. Namely, since the sampling frequency is reduced to FSMAX×$2^{-f}$, the time variation of the variable-rate parameter of the envelope parameter EGPARm is made faster to perform the music tone waveform generation at the sampling frequency concerned. Subsequently, the generated waveform samples are written to $2^{f}$ continuous addresses of the buffer, thereby making adjustment such that the resultant music tone has the same pitch as that of the original music tone. Thus, step S93 or S94 performs the computation of envelope data AEGm as shown in FIG. 19.

In step S95, the data AEGm obtained by the AEGm computation is multiplied by the value of a total level parameter TLm in the operator data OPmDATAn to compute an output level AMPm (=AEGm×TLm) of the operator m as shown in FIG. 19. Then, the amplitude controlling envelope data AEGm computed in step S93 or S94 and the output level AMPm of the operator m computed in step S95 are checked independently (step S96). Based on the check results, it is determined whether the data value AEGm and the data value AMPm are lower than a predetermined time and a predetermined level, respectively, thereby determining in turn whether the operator m is to be operated or not (step S97). In other words, it is determined whether the music tone waveform computation in the operator m may be ended or not. If the decision is YES, the SSM passes control to step S98; if the decision is NO, the SSM passes control to step S101 shown in FIG. 18.

In step S98, it is determined whether the operator m is a carrier. If the operator m is found a carrier, the SSM passes control to step S99. In step S99, the buffer OPBUF for the operator m and the modulator modulating only the operator m are cleared, the waveform computation is stopped, and this operator computation processing is ended. Thus, if the operator m is a carrier, not only the waveform computation of the operator m but also the waveform computation of the modulator modulating only the operator m is stopped. The carrier is an operator that eventually outputs the music tone waveform data as shown in FIGS. 4A through 4C. If there is no output from the carrier, or if the SSM passes control from step S97 to S99 via S98, it may be assumed that nothing is outputted from the modulator preceding the carrier. If that modulator is modulating another carrier, the waveform computation of that modulator cannot be stopped. On the other hand, if the operator m is found not a carrier in step S98, or the operator is a modulator, only the buffer OPBUFm of the operator m is cleared to stop the waveform computation (step S100), upon which this operator computation processing comes to an end.

In step S101 shown in FIG. 18, algorithm designation data ALGORn is checked. In step S102, it is determined whether the operator m is being modulated from another operator. In step S102, if the operator m is found being modulated from another operator, the operator output data stored in the operator output value buffer OPOUTk in each operator data OPkDATAn under modulation are added together, and the result is stored in the data input buffer MODINm of the operator m (step S103). On the other hand, if the operator m is not being modulated by another operator, the SSM passes control to step S104, skipping step S103. In step S104, it is determined whether the sampling frequency designation data FSAMPm in the operator data OPmDATAn is "0". If FSAMPm="0", the SSM passes control to step S105; if FSAMPm="0", the SSM passes control to step S110.

In step S105, a phase value update computation is performed. The updated result is stored in the phase value buffer PHBUFm (the contents thereof hereafter being referred to as phase value PHBUFm) in the operator data OPmDATAn of the operator m. The phase value update computation denotes herein the computation enclosed by dashed line A in FIG. 19. To be more specific, computation MODINm+FBm+FNOn×MULTm+PHBUFm is performed. MODINm and FBm denote the values stored in the modulation data input buffer MODINm in the operator data OPmDATAn and the feedback output value buffer FBm, respectively. FNOn denotes the frequency number FNOn in the music tone parameter VOICEn. MULTm denotes the frequency multiple data MULTm in the operator data OPmDATAn. PHBUFm denotes the last value of the values stored in the phase value buffer PHBUFm in the operator data OPmDATAn.

In step S106, a table address is computed based on the phase value PHBUFm computed in step S105. From the basic waveform (for example, a waveform selected from among the above-mentioned eight types of basic waveforms) data selected according to the wave select data WSELm of the operator m, data WAVEm (PHBUFm) at the position pointed by this computed address is read. It should be noted that basic waveform data is referred to "basic waveform table." The data WAVEm (PHBUFm) is multiplied by the output level AMPm computed in step S95. The result is stored in the operator output value buffer OPOUTm (=WAVEm (PHBUFm)×AMPm) of the operator m.

In step S107, feedback sample computation is performed by the following relation, storing the result in the feedback output value buffer FBm of the operator m.

$$0.5\times(FBm+OPOUTm\times FBLm)$$

OPOUTm denotes the waveform sample data generated in step S106. FBLm denotes the feedback level data FBLm of the parameter m to be computed. The feedback sample computation is performed to prevent parasitic exciter from occurring.

In step S108, it is determined, as with step S98, whether the operator m is a carrier or not. If the operator m is found a modulator, this operator computation processing is ended immediately. On the other hand, if the operator m is found a carrier, the waveform sample data OPOUTm generated in step S106 is multiplied by the volume data VOLn of the music tone parameter VOICEn. The multiplication result (=OPOUTm×VOLn) is added to the position indicated by the pointer for pointing the write position of this time in the corresponding waveform buffer. Further, the value of this pointer is incremented by one (step S109), upon which this operator computation processing comes to an end.

In step S110, phase value update computation is performed, and the result is stored in the phase value buffer PHBUFm. This computation processing in step S110 differs from the computation processing in step S105 only in the added processing indicated by block B in FIG. 19. Since FSAMPm=f(≠0), the phase value must be shifted by f bits, or the value of the phase value buffer PHBUFm must be multiplied by $2^f$ to change the read address of the basic waveform table to that obtained by multiplying the sampling frequency FSMAX by $2^{-f}$. Next, likewise step S106, waveform sample generation is performed by the following relation, storing the result in the operator output value buffer OPOUTm.

$$WAVEm(2^f\times PHBUFm)\times AMPm$$

Then, likewise step S107, a feedback sample computation is performed (step S112).

In step S113, it is determined likewise step S108 whether the operator m is a carrier. If the operator m is found a modulator, this operator computation processing is immediately ended. If the operator m is found a carrier, the waveform sample data OPOUTm generated in step S111 is multiplied by the volume data VOLn of music tone parameter VOICEn. The result (=OPOUTm×VOLn) is added to $2^f$ addresses of the buffer continued from the position indicated by the pointer in the above-mentioned waveform buffer. Then, the pointer is incremented by $2^f$ (step S114), upon which this operator computation processing comes to an end. It should be noted that, when writing the plural pieces of sample data of the same value in step S114, interpolation may be made between the pieces of sample data as required, writing the resultant interpolation value to the above-mentioned areas.

In the present embodiment, as explained in steps S106 and S111, the values stored in the basic waveform table are used for the basic waveform data. Alternatively, the basic waveform data may be generated by computation. Also, the basic waveform data may be generated by combining table data and computation. For the address by which the basic waveform table is read in steps S106 and S10, the address obtained based on the phase value PHBUFm computed in steps S105 and S110 is used. Alternatively, the address obtained by distorting this phase value PHBUFm by computation or by a nonlinear characteristic table may be used.

Figure 20:
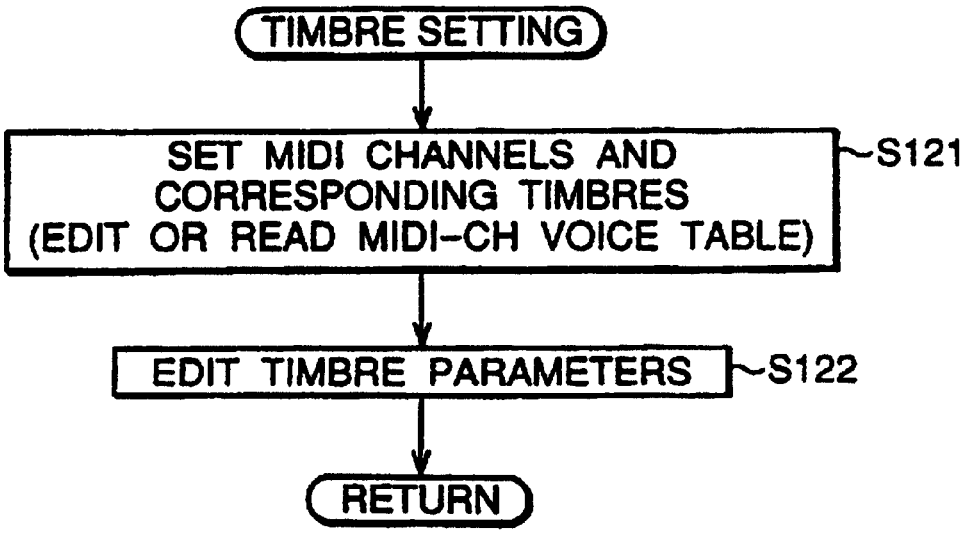
FIG. 20 is a flowchart indicating detailed procedure of a timbre setting processing subroutine contained in the main routine of FIG. 10.

FIG. 20 is a flowchart indicating the detailed procedure of the timbre setting processing subroutine of step S19 shown in FIG. 10. Referring to FIG. 20, first, MIDI channels and corresponding timbres are set (step S121). As explained before, in the present embodiment, the MIDI channels and the corresponding timbres are determined from the MIDI-CH voice table. The data to be loaded into this MIDI-CH voice table is stored in the hard disk or the like. When the MIDI file selected by the user is loaded, the corresponding table data is loaded into the MIDI-CH voice table at the same time. Therefore, the processing performed in step S121 is only the editing of the currently loaded data table or the loading of new table data.

It should be noted that the user may alternatively set the desired number of operators for each of MIDI channels. If the desired number of operators is set to the channel concerned when changing the voice numbers in the MIDI-CH voice table, the voice numbers corresponding to the music tone parameters VOICE equal to or lower than the number of operators may be displayed in a list. From among these voice numbers, the user may select and set desired ones. At this time, the desired number of operators set to the channel concerned may also be automatically changed. The voice numbers within the automatically changed number of operators may be displayed in a list. Moreover, when the user has changed the voice numbers in the MIDI-CH voice table, the total number of operators constituting the music tone parameters VOICE corresponding to the changed voice numbers may be checked. According to the load state of the CPU 1, warning that this timbre cannot be assigned to the channel concerned may be displayed. In addition to such a warning, the voice number of the channel concerned may be automatically changed to the voice number of an alternate timbre obtained by the smaller number of operators.

As described, the present embodiment is constituted such that the number of operators for use in the FM computation processing can be flexibly changed according to the capacity of the CPU 1, the operating environment of the embodiment, the purpose of use, and the setting of processing. Consequently, the novel constitution can adjust the load of the CPU 1 and the quality of output music tone waveforms without restriction, thereby significantly enhancing the degree of freedom of the sound source system in its entirety. In the present embodiment FM tone generating is used for the music tone waveform generation. It will be apparent that the present invention is also applicable to a sound source that performs predetermined signal processing such as AM (Amplitude Modulation) and PM (Phase Modulation) by combining music tone waveform generating blocks. Further, the CPU load mitigating method according to the invention is also applicable to a sound source based on waveform memory reading and to a physical model sound source in software approach. The present embodiment is an example of personal computer application. It will be apparent that the present invention is also easily applicable to amusement equipment such as game machines, karaoke apparatuses, electronic musical instruments, and general-purpose electronic equipment. Further, the present invention is applicable to a sound source board and a sound source unit as personal computer options.

The software associated with the present invention may also be supplied in disk media such as a floppy disk, a magneto-optical disk, and a CD-ROM, or machine-readable media such as a memory card. Further, the software may be added by means of a semiconductor memory chip (typically ROM) which is inserted in a computer unit. Alternatively, the sound source software associated with the present invention may be distributed through the communication interface I/F 11. It may be appropriately determined according to the system configuration or the OS whether the sound source software associated with the present invention is to be handled as application software or device software. The sound source software associated with the present invention or the capabilities of this software may be incorporated in other software; for example, amusement software such as game and karaoke and automatic performance and accompaniment software.

The inventive machine readable media is used for a processor machine including a CPU and contains program instructions executable by the CPU for causing the processor machine having operators in the form of submodules composed of softwares to compute waveforms for performing operation of generating a plurality of musical tones through a plurality of channels according to performance information. The operation comprises the steps of setting an algorithm which determines a module composed of selective ones of the submodules logically connected to each other to compute a waveform specific to one of the musical tones, designating one of the channels to be used for generating said one musical tone in response to the performance information, loading the selective submodules into said one channel, and logically executing the loaded selective submodules according to the algorithm so as to compute the waveform to thereby generate said one musical tone through said one channel.

Preferably, the step of setting sets different algorithms which determine different modules corresponding to different timbres of the musical tones. Each of the different modules is composed of selective ones of the submodules which are selectively and sequentially connected to each other to compute a waveform which is specific to a corresponding one of the different timbres.

Preferably, the step of setting comprises adjusting a number of the submodules to be loaded into the channel dependently on a condition during the course of generating the musical tone.

Preferably, the step of adjusting comprises compacting the module so as to reduce the number of the submodules when the condition indicates that an amplitude envelope of the waveform attenuates below a predetermined threshold level.

Preferably, the step of adjusting comprises compacting the module so as to reduce the number of the submodules when the condition indicates that an output volume of the musical tone is tuned below a predetermined threshold level.

Preferably, the step of adjusting comprises eliminating one submodule so as to reduce the number of the submodules to be loaded into the channel when the condition indicates that said one submodule loses contribution to computation of the waveform without substantially affecting other submodules.

The inventive machine readable media contains instructions for causing a processor machine having a software module to compute samples of a waveform in response to a sampling frequency for performing operation of generating a musical tone according to performance information. The operation comprises the steps of periodically operating the processor machine to execute the software module based on a variable sampling frequency for successively computing samples of the waveform so as to generate the musical tone, detecting a load of computation imposed on the processor machine during the course of generating the musical tone, and changing the variable sampling frequency according to the detected load to adjust a rate of computation of the samples.

Preferably, the step of changing provides a fast sampling frequency when the detected load is relatively light, and provides a slow sampling frequency when the detected load is relatively heavy such that the rate of the computation of the samples is reduced by 1/n where n denotes an integer number.

Figure 21:
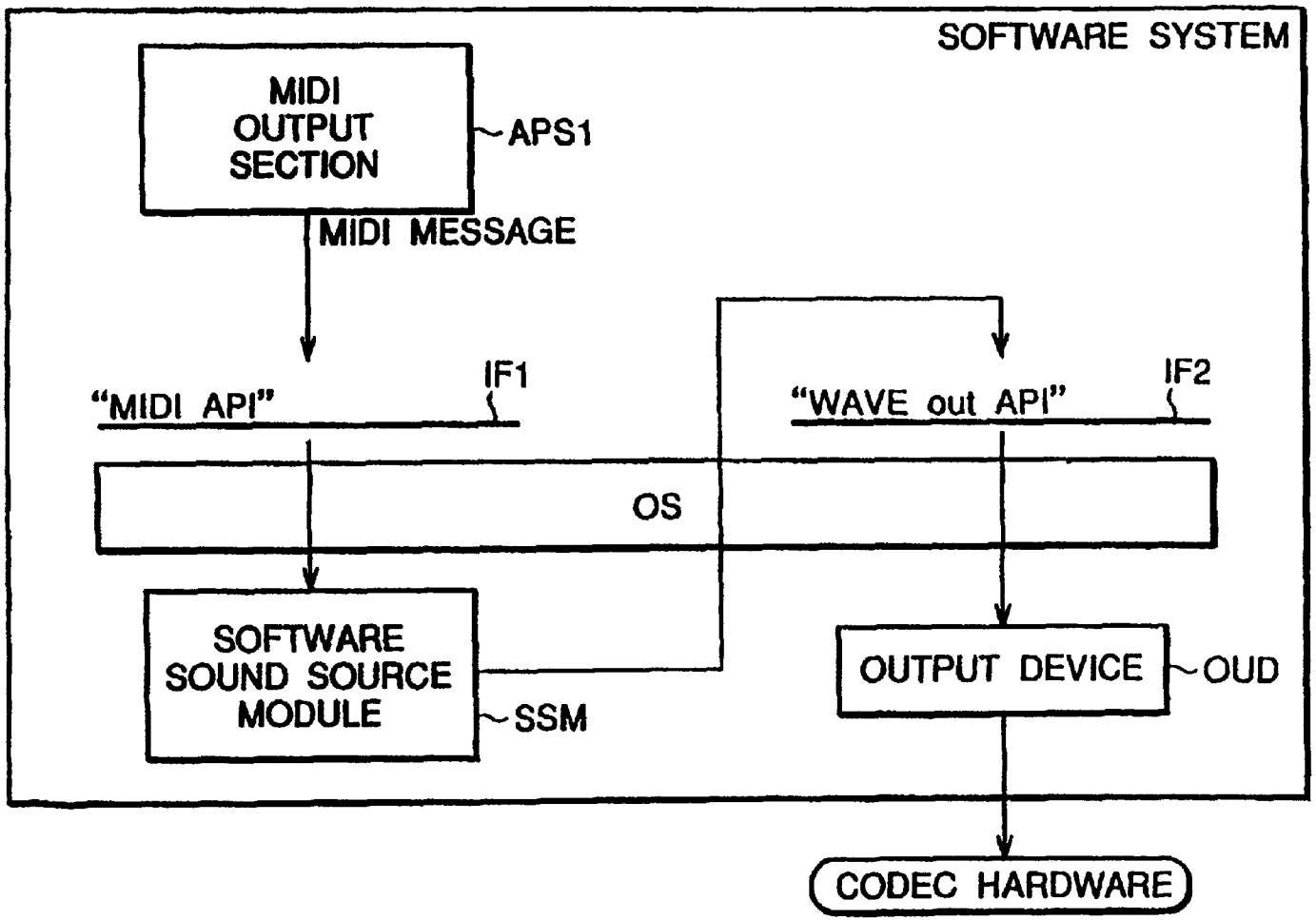
FIG. 21 is a diagram illustrating a constitution of a software sound source system practiced as a second preferred embodiment of the present invention.

FIG. 21 shows a software sound source system practiced as a second preferred embodiment of the present invention. Referring to FIG. 21, a MIDI output section denoted by APS1 is a module for outputting a MIDI message. The APS1 is a performance operator device such as a keyboard, a sequencer for outputting a MIDI message, or application software for outputting a MIDI message. A MIDI API denoted by AF1 is a first application program interface that transfers MIDI messages to an operation system OS. A software sound source module SSM is application software installed in the operating system OS as a driver. The software sound source module SSM receives a MIDI message from the MIDI output section APS1 via the interface IF1. Based on the received MIDI message, the software sound source module SSM generates tone waveform data. The generated tone waveform data is received by the operating system OS via a second application program interface (WAVE out API) IF2 of the OS. An output device OUD is a driver module installed in the operating system OS. The OUD receives the tone waveform data from the software sound source module SSM via the interface IF2, and outputs the received tone waveform data to external CODEC hardware. The output device OUD is software and operates in direct access memory (DMA) manner to read the tone waveform data which is generated by the computation by the software sound source module SSM and stored in a buffer. The OUD supplies the read tone waveform data to the external hardware composed of a digital-to-analog converter (DAC). The software sound source module SSM includes a tone generator for generating samples of tone waveform data at a predetermined sampling frequency FS by computation, and a MIDI output driver for driving this tone generator. This MIDI output driver reads tone control parameters corresponding to the received MIDI message from a table or the like, and supplies the read parameters to the tone generator.

Figure 22:
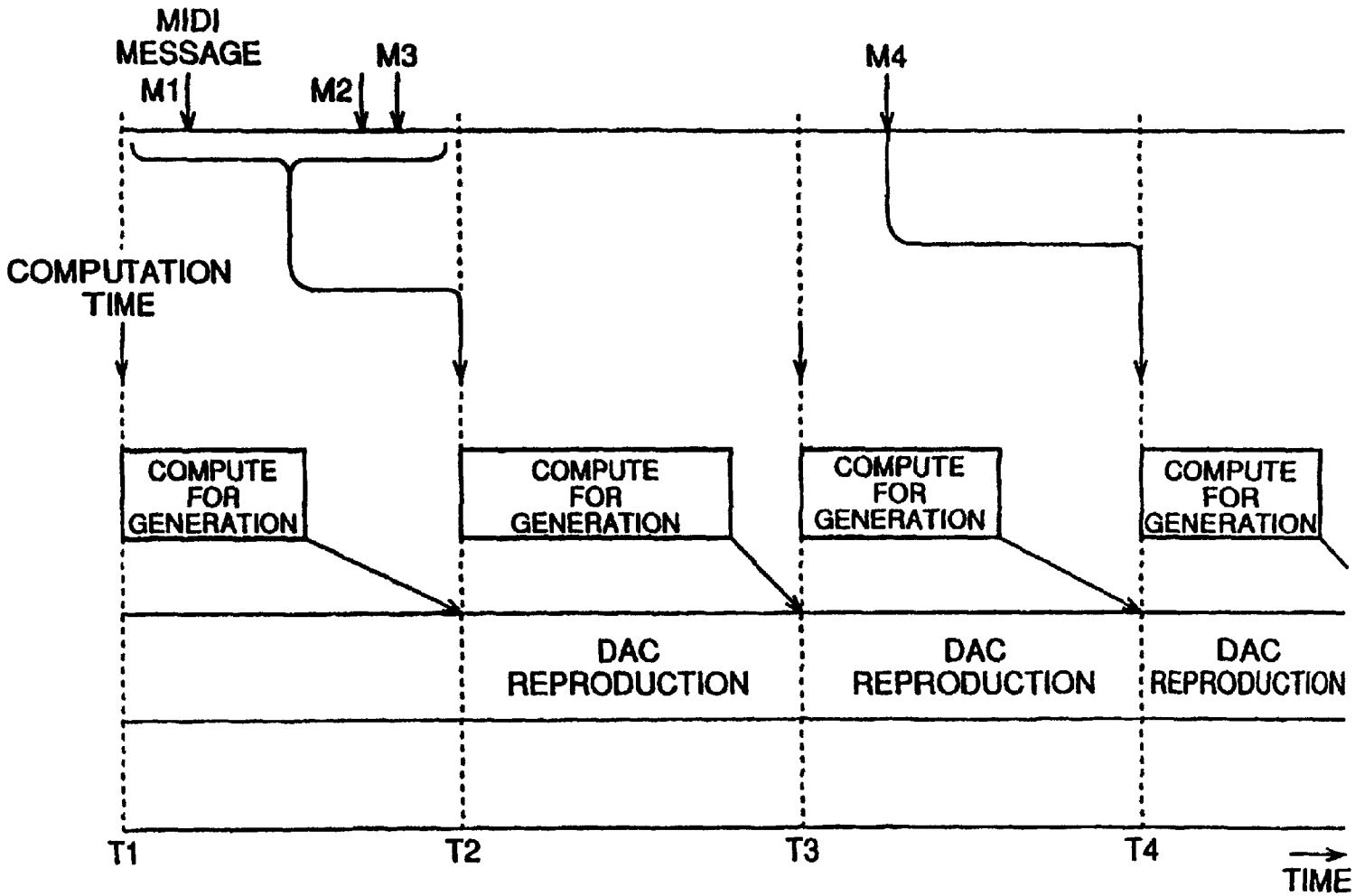
FIG. 22 is a diagram illustrating an operation timing chart of the software sound source system shown in FIG. 21.

FIG. 22 is a timing chart indicating the operation of the software sound source module SSM. As shown, the software sound source module SSM is periodically driven at every frame having a predetermined time length. In computation, the tone control parameters corresponding to the MIDI message received in an immediately preceding frame have been read and stored in a buffer. Based on the various tone parameters stored in the buffer, the SSM generates tone waveform. As shown in FIG. 22, the SSM receives three MIDI messages in a first frame from time T1 to time T2. When computation time T2 comes, the software sound source module SSM is started, upon which the various parameters corresponding to the received MIDI messages are read and stored in the buffer. Based on the received MIDI messages, the SSM performs computation to generate tone waveform data to be newly sounded continuously from the preceding frame.

In the computation for generating the tone waveform data, a number of samples for one frame is generated for each sound channel. The tone waveform data for all sound channels are accumulated and written to a waveform output buffer. Then, reproduction of the waveform output buffer is reserved for the output device OUD. This reservation is equivalent to outputting of the generated tone waveform data from the software sound source module SSM to the second interface "WAVE out API." The output device OUD reads, for each frame, the tone waveform data a sample by sample from the waveform output buffer reserved for reproduction, and sends the read tone waveform data to the DAC which is the external hardware. For example, from the waveform output buffer which is reserved for reproduction and written with the tone waveform data generated in the first frame from time T1 to time T2, the tone waveform data is read in the second frame from time T2 to Time T3. The read tone waveform data is converted by the DAC into an analog music tone waveform signal to be sounded from a sound system.

Figure 23:
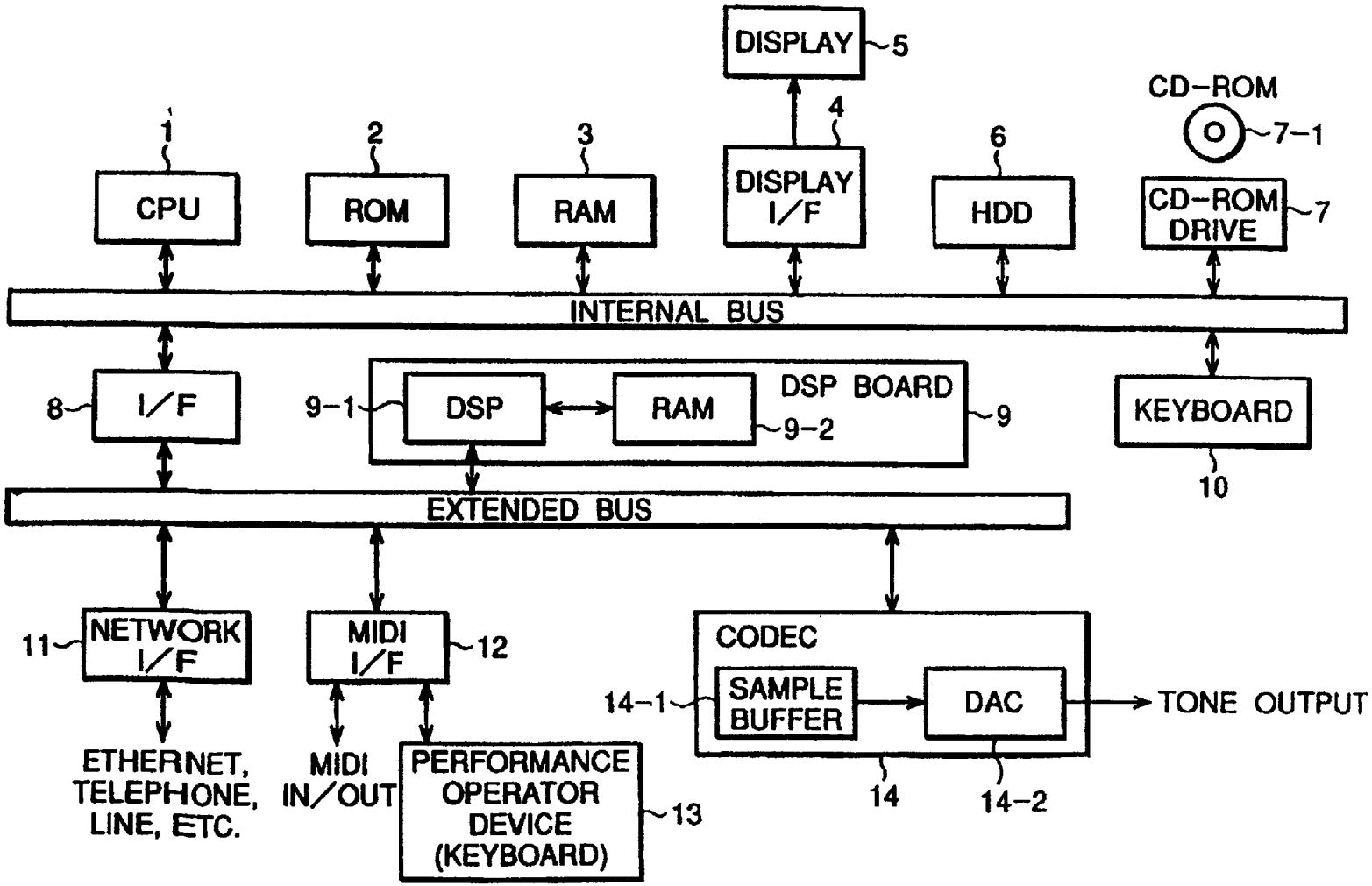
FIG. 23 is a block diagram illustrating a processing apparatus having a tone waveform data generator implemented according to the tone waveform data generating method of the present invention.

FIG. 23 outlines a processing apparatus having a tone waveform data generator provided by implementing the tone waveform generating method according to the invention. The processor shown in FIG. 23 uses a CPU 1 as the main controller. Under the control of the CPU 1, the tone waveform generating method according to the invention is executed as the tone waveform generation processing based on a software sound source program. At the same time, other application programs are executed in parallel. The CPU 1 is connected, via an internal bus, to a ROM (Read Only Memory) 2, a RAM (Random Access Memory) 3, a display interface 4, an HDD (Hard Disk Drive) 6, a CD-ROM drive 7, an interface 8 for transferring data between the internal bus and an extended bus, and a keyboard 10 which is a personal computer user interface. The CPU 1 is also connected, via the internal bus, the interface 8 and the extended bus, to a digital signal processor (DSP) board 9, a network interface 11, a MIDI interface 12, and a CODEC 14 having a DAC 14-2.

The ROM 2 stores the operating program and so on. The RAM 3 includes a parameter buffer area for storing various tone control parameters, a waveform output buffer area for storing music tone waveform data generated by computation, an input buffer area for storing a received MIDI message and a reception time thereof, and a work memory area used by the CPU 1. The display 5 and the display interface 4 provide means for the user to interact with the processing apparatus. The HDD 6 stores the operation system OS such as Windows 3.1 (registered trademark) or Windows 95 (registered trademark) of Microsoft Corp., programs for implementing the software sound source module, and other application programs for implementing "MIDI API" and "WAVE API." A CD-ROM 7-1 is loaded in the CD-ROM drive 7 for reading programs and data from the CD-ROM 7-1. The read programs and data are stored in the HDD 6 and so on. In this case, a new sound source program for implementing a software sound source is recorded on the CD-ROM 7-1. The old sound source program can be upgraded with ease by the CD-ROM 7-1 which is a machine readable media containing instructions for causing the personal computer to perform the tone generating operation.

The digital signal processor board 9 is an extension sound-source board. This board is a hardware sound source such as an FM synthesizer sound source or a wave table sound source. The digital signal processor board 9 is composed of a DSP 9-1 for executing computation and a RAM 9-2 having various buffers and various timbre parameters.

The network interface 11 connects this processing apparatus to the Internet or the like via a LAN such as Ethernet or via a telephone line, thereby allowing the processing apparatus to receive application software such as sound source programs and data from the network. The MIDI interface 12 transfers MIDI messages between an external MIDI equipment and, receives MIDI events from a performance operator device 13 such as a keyboard instrument. The contents and reception times of the MIDI messages inputted through this MIDI interface 12 are stored in the input buffer area of the RAM 2.

The CODEC 14 reads the tone waveform data from the waveform output buffer of the RAM 3 in direct memory access manner, and stores the read tone waveform data in a sample buffer 14-1. Further, the CODEC 14 reads samples of the tone waveform data, one by one, from the sample buffer 14-1 at a predetermined sampling frequency FS (for example, 44.1 kHz), and converts the read samples through a DAC 14-2 into an analog music tone signal, thereby providing a music tone signal output. This tone output is inputted into the sound system for sounding. The above-mentioned constitution is generally the same as that of a personal computer or a workstation. The tone waveform generating method according to the present invention can be practiced by such a machine.

The following outlines the tone waveform generating method according to the present invention by means of the software sound source module under the control of the CPU 1. When the application program APS1 is started, MIDI messages are supplied to the software sound source module SSM via the first interface IF1. Then, the MIDI output driver of the software sound source module SSM is started to set tone control parameters corresponding to the supplied MIDI messages. These tone control parameters are stored in sound source registers of respective sound channels assigned with the MIDI messages. Consequently, a predetermined number of samples of waveform data are generated by computation in the sound source that is periodically activated every computation frame as shown in FIG. 22.

Figure 24:
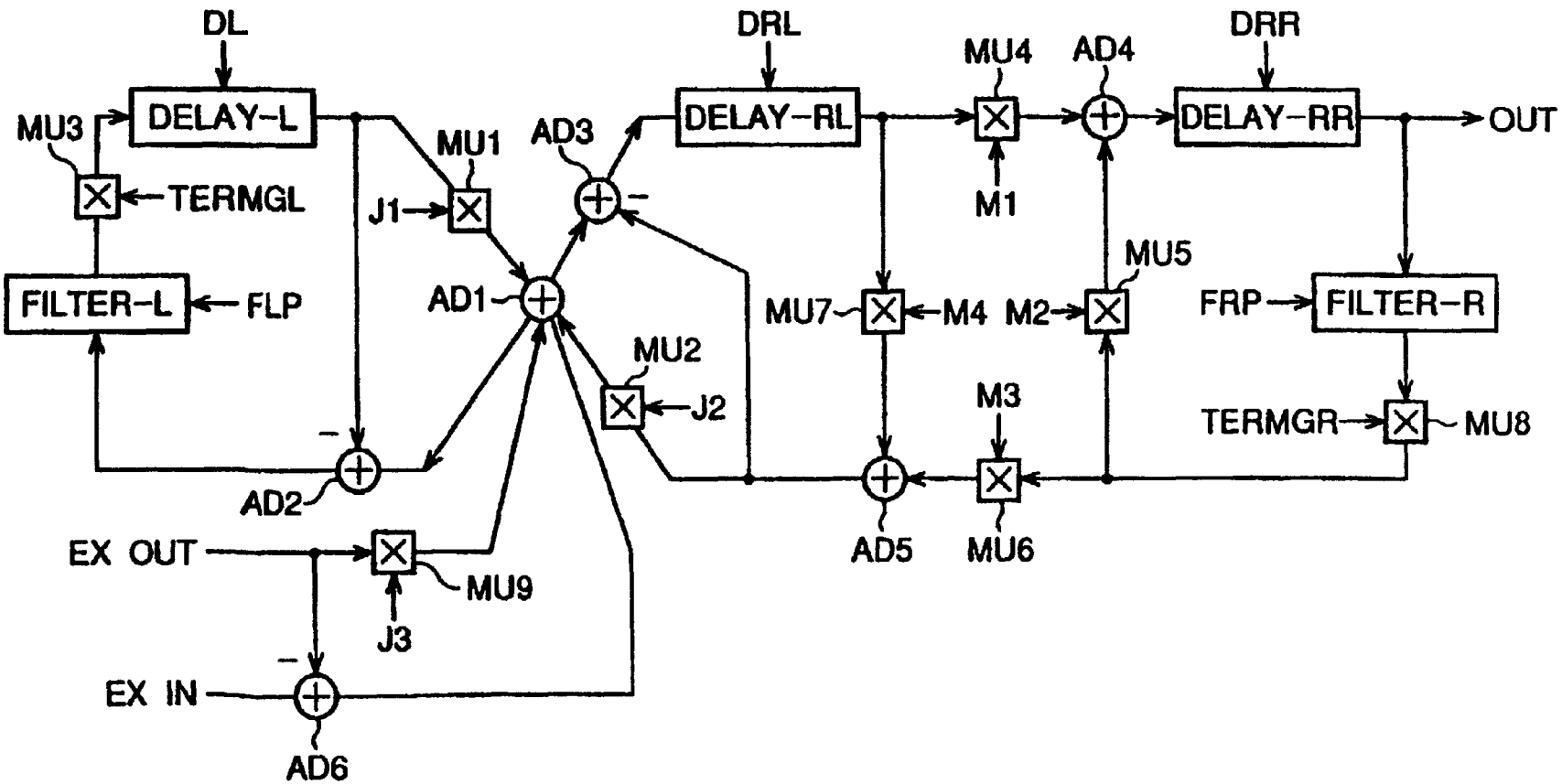
FIG. 24 is a block diagram illustrating a constitutional example of a tube/string model section of a sound source model implemented according to the tone waveform data generating method of the present invention.
Figure 25:
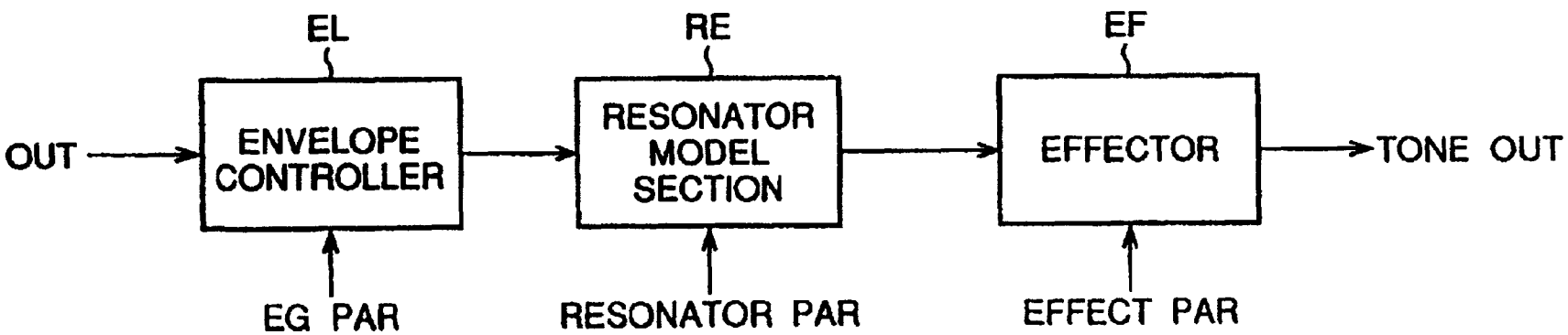
FIG. 25 is a block diagram illustrating a constitutional example of a timbre effect attaching section provided in the sound source model implemented according to the tone waveform data generating method of the present invention.
Figure 26:
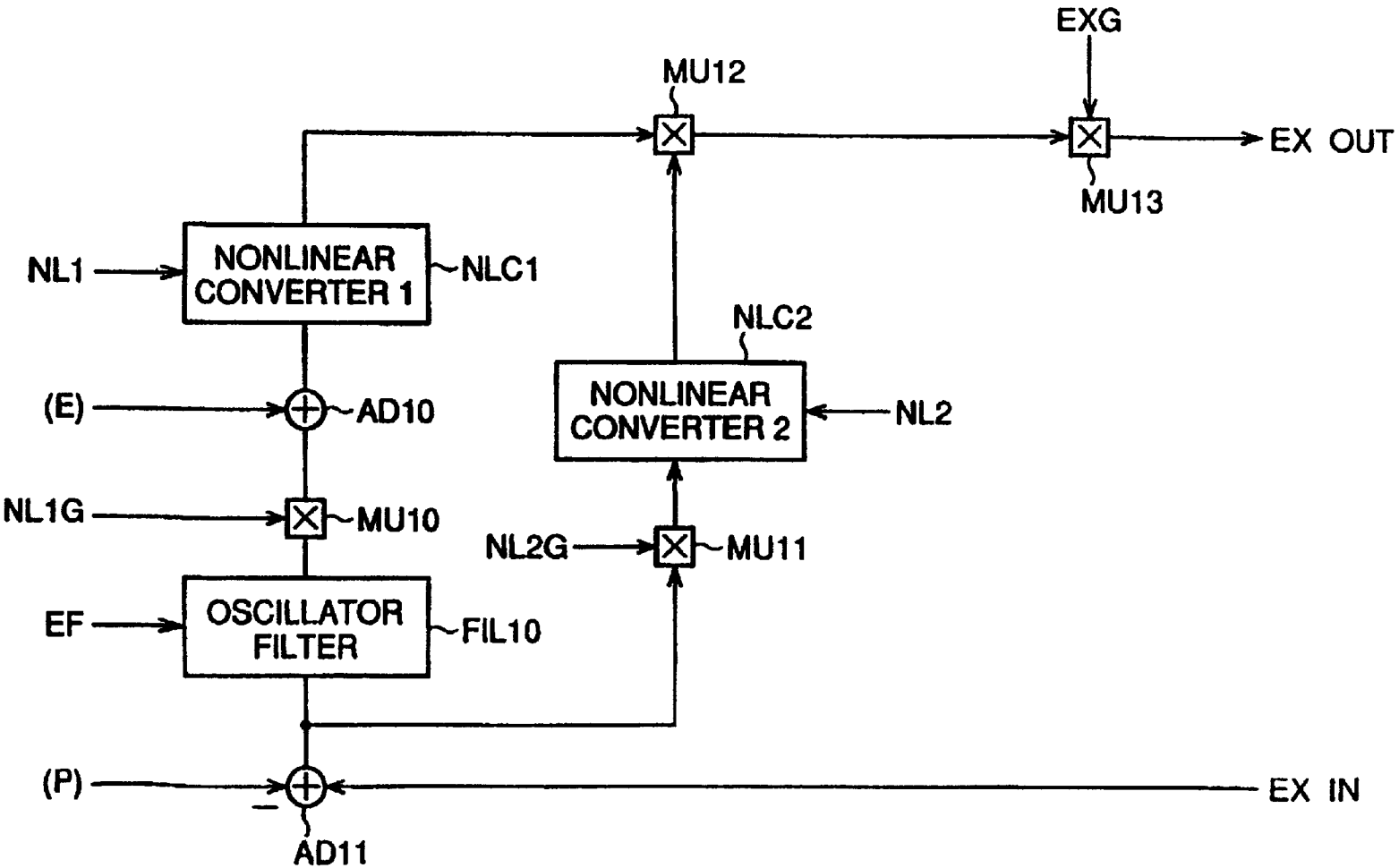
FIG. 26 is a block diagram illustrating a constitutional example of an exciter section provided in the sound source model implemented according to the tone waveform data generating method of the present invention.

FIGS. 24 through 26 show an example of a sound source model based on the tone waveform data generating method according to the present invention. It should be noted that this sound source model is implemented not by hardware but by software. The sound source model illustrated in FIG. 24 through FIG. 26 simulates a wind instrument system or a string instrument system. This model is hereafter referred to as a physical model sound source. The physical model sound source of the wind instrument system simulates an acoustic wind instrument having a mouthpiece at a joint of two tubes as shown in FIG. 24. The physical model sound source of the string instrument system simulates a plucked string instrument or a rubbed string instrument having strings fixed at both ends with bridges.

The physical model sound source shown in FIG. 24 is composed of a looping circuit. The total delay time in the loop corresponds to a pitch of a music tone to be generated. When the physical model sound source simulates a wind instrument, the sound source includes a circuit for simulating the tube disposed rightward of the mouthpiece. In this circuit, a junction of 4-multiplication grid type composed of four multipliers MU4 through MU7 and two adders AD4 and AD5 simulates a tone hole. Further, a propagation delay in the tube from the mouthpiece to the tone hole is simulated by a delay circuit DELAY-RL. The propagation delay in the tube from the tone hole to the tube end is simulated by a delay circuit DELAY-RR. Acoustic loss of the tube is simulated by a lowpass filter FILTER-R. Reflection at the tube end is simulated by a multiplier MU8. Similarly, in a circuit for simulating the tube disposed leftward of the mouthpiece, the propagation delay of this tube is simulated by a delay circuit DELAY-L. The acoustic loss of the tube is simulated by a lowpass filter FILTER-L. The reflection at the tube end is simulated by a multiplier MU3.

It should be noted that delay times DRL, DRR, and DL read from a table according to the pitch of the music tone to be generated are set to the delay circuits DELAY-R, DELAY-RR, and DELAY-L, respectively. Filter parameters FRP and FRL for obtaining selected timbres are set to the lowpass filters FILTER-R and FILTER-L, respectively. In order to simulate the acoustic wave propagation mode that varies by opening or closing the tone hole, multiplication coefficients M1 through M4 corresponding to the tone hole open/close operations are supplied to the multipliers MU4 through MU7, respectively. In this case, the pitch of the output tone signal is generally determined by the sum of delay times to be set to the delay circuits DELAY-RL, DELAY-RR, and DELAY L. Since an operational delay time occurs on the lowpass filters FILTER-R and FILTER-L, a net delay time obtained by subtracting this operation delay time is distributively set to the delay circuits DELAY-RL, DELAY-RR, and DELAY-L in a.

The mouthpiece is simulated by a multiplier MU2 for multiplying a reflection signal coming from the circuit for simulating the right-side tube by multiplication coefficient J2 and a multiplier MU1 for multiplying a reflection signal coming from the circuit for simulating the left-side tube by multiplication coefficient J1. The output signals of the multipliers MU1 and MU2 are added together by an adder AD1, outputting the result to the circuits for simulating the right-side tube and the circuit for simulating the left-side tube. In this case, the reflection signals coming from the tube simulating circuits are subtracted from the output signals by subtractors AD2 and AD3, respectively, the results being supplied to the tube simulating circuits. An exciting signal EX OUT supplied from an exciter and multiplied by coefficient J3 is supplied to the adder D1. An exciter return signal EXT IN is returned to the exciter via an adder AD6. It should be noted that the exciter constitutes a part of the mouthpiece.

The output from this physical model sound source may be supplied to the outside at any portion of the loop. In the illustrated example, the output signal from the delay circuit DELAY-RR is outputted as an output signal OUT. The outputted signal OUT is inputted into an envelope controller EL shown in FIG. 25, where the signal is attached with an envelope based on envelope parameters EG PAR. These envelope parameters include a key-on attack rate parameter and a key-off release rate parameter. Further, the output from the EL is inputted into a resonator model section RE. The RE attaches resonation formant of the instrument body to the signal based on the supplied resonator parameter. The output signal from the EL is inputted into an effector EF. The EF attaches a desired effect to a music signal TONE OUT based on supplied effect parameters. The EF is provided for attaching various effects such as reverberation, chorus, delay, and pan. The music tone signal TONE OUT is provided in the form of samples of tone waveform data at every predetermined sampling period.

FIG. 26 shows an example of the exciter that constitutes a part of the mouthpiece. The exciter return signal EX IN is supplied to a subtractor AD11 as a signal equivalent to the pressure of an air vibration wave to be fed back to the reed in the mouthpiece. From this signal, a blowing pressure signal P is subtracted. The output from the subtractor AD11 provides a signal equivalent to the pressure inside the mouthpiece. This signal is inputted into an exciter filter FIL10 simulating the response characteristics of the reed relating to pressure change inside the mouthpiece. At the same time, this signal is inputted into a nonlinear converter 2 (NLC2) simulating saturation characteristics of the velocity of the air flow inside the mouthpiece relating to the air pressure inside the mouthpiece when gain adjustment is performed by a multiplier MU11. A cutoff frequency of the exciter filter FIL10 is controlled selectivity by a supplied filter parameter EF. The output signal from the exciter filter FIL10 is adjusted in gain by a multiplier MU10. The adjusted signal is added with an embouchure signal E equivalent to the mouthing pressure of the mouthpiece by an adder AD10, providing a signal equivalent to the pressure applied to the reed. The output signal from the adder AD10 is supplied to the nonlinear converter (NLC1) simulating the reed open/close characteristics. The output of the nonlinear converter 1 and the output of the nonlinear converter 2 are multiplied with each other by a multiplier MU12, from which a signal equivalent to the volume velocity of the air flow passing the gap between the mouthpiece and the reed is outputted. The signal outputted from the multiplier MU12 is adjusted in gain by a multiplier MU13, and is outputted as the exciting signal EX OUT.

The source model simulating a wind instrument has been explained above. In simulating a string instrument, a circuit for simulating a rubbed string section or a plucked string section in which a vibration is applied to a string is used instead of the circuit for simulating the mouthpiece. Namely, the signal P becomes an exciting signal corresponding to a string plucking force and a bow velocity, and the signal E becomes a signal equivalent to a bow pressure. It should be noted that, in simulating a string instrument, a multiplication coefficient NL2G supplied to the multiplier MU11 is made almost zero. Further, by setting the output of the nonlinear converter 2 to a predetermined fixed value (for example, one), the capability of the nonlinear converter 2 is not used. The delay circuits DELAY-RL, DELAY-RR, and DELAY-L become to simulate string propagation times. The lowpass filters FILTER-R and FILTER-L become to simulate string propagation losses. In the exciter, setting of the multiplication coefficients NLG1, NLG2, NL1, and NL2 allows the exciter to be formed according to a model instrument to be simulated.

Figure 27:
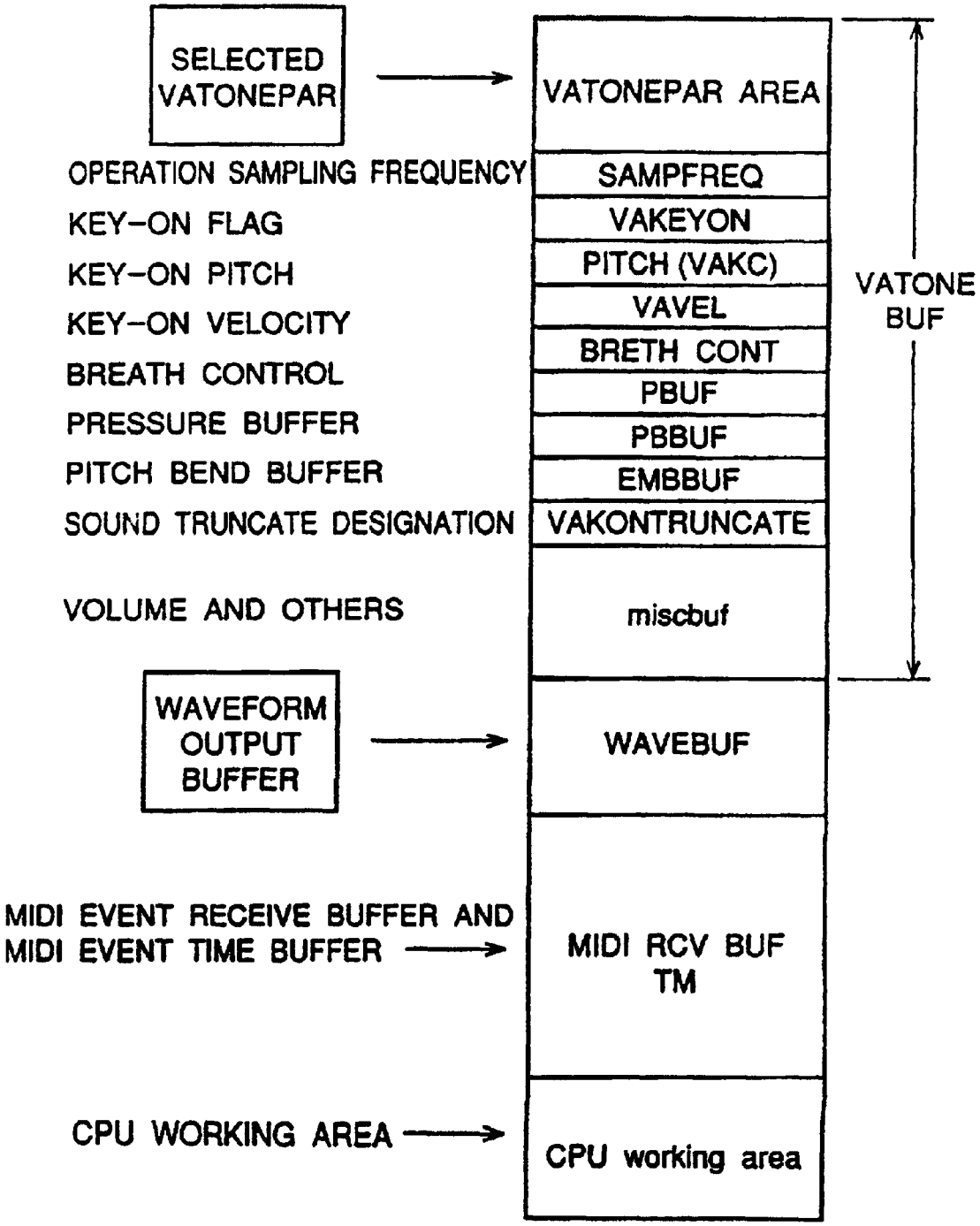
FIG. 27 is a diagram illustrating a variety of data expanded in a RAM shown in FIG. 23.

The following explains various data expanded in the RAM 3 with reference to FIG. 27. As described above, when the software sound source module SSM is started, the MIDI output driver therein is activated, upon which various tone control parameters are stored in the RAM according to the inputted MIDI messages. Especially, if the MIDI messages designate a physical model sound source (also referred to as a VA sound source) as shown in FIGS. 24 through 26, a tone control parameter VATONEPAR for the selected VA sound source is stored in the control parameter buffer (VATONEBUF) arranged in the RAM 3. The tone waveform data generated by computation by the software sound source module SSM for every frame is stored in the waveform output buffer (WAVEBUF) in the RAM 3. Further, the contents of each MIDI message inputted via the interface MIDI API and the event time of reception of the inputted message are stored in MIDI input buffers (MIDI RCV BUF and TM) in the RAM 3. Further, the RAM 3 has a CPU work area.

The buffer VATONEBUF stores the tone control parameter VATONEPAR as shown in FIG. 28. The VATONEBUF also stores a parameter SAMPFREQ indicating an operation sampling frequency at which samples of the tone waveform data are generated, a key-on flag VAKEYON which is set when a key-on event contained in a MIDI message designates the VA sound source, a parameter PITCH(VAKC) for designating a pitch, a parameter VAVEL for designating a velocity when the key-on event designates the VA sound source, and a breath controller operation amount parameter BRETH CONT. Moreover, the VATONEBUF has a pressure buffer PBUF for storing breath pressure and bow velocity, a PBBUF for storing a pitch bend parameter, an embouchure buffer EMBBUF for storing an embouchure signal or a bow pressure signal, a flag VAKONTRUNCATE for designating sounding truncate in the VA sound source, and a buffer miscbuf for storing volume and other parameters.

The parameter SAMPFREQ can be set to one of two sampling frequencies, for example. The first sampling frequency is 44.1 kHz and the second sampling frequency is a half of the first sampling frequency, namely 22.05 kHz. Alternatively, the second sampling frequency may be double the first sampling frequency, namely 88.2 kHz. These sampling frequencies are illustrative only, hence not limiting the sampling frequencies available in the present invention. Meanwhile, if the sampling frequency is reduced ½ times FS, the number of the tone waveform samples generated in one frame may be reduced by half. Consequently, if the load of the CPU 1 is found heavy, the sampling frequency of ½ times FS may be selected to mitigate the load of the CPU 1, thereby preventing dropping of samples from generation.

If the sampling frequency is set to 2 times FS, the number tone waveform samples generated is doubled, allowing the generation of high-precision tone waveform data. Consequently, if the load of the CPU 1 is found light, the sampling frequency of 2 times FS may be selected to generate samples having high-precision tone waveform data. For example, let the standard sampling frequency in the present embodiment be FS1, a variation sampling frequency FS2 is represented by:

FS1=n times FS2 (n being an integer) . . . first example,

FS1=1/n times FS2 (n being an integer) . . . second example.

Because the present invention mainly uses the first example, the following description will be made mainly with reference to the first example.

In the present invention, the sampling frequencies of the tone waveform data to be generated are variable. If there is another acoustic signal to be reproduced by the CODEC, the sampling frequency of the DA converter in the CODEC may be fixed to a particular standard value. For example, when mixing the music tone generated by the software sound source according to the present invention with the digital music tone outputted from a music CD, the sampling frequency may be fixed to FS1=44.1 kHz according to the standard of the CD. The following explains an example in which the sampling frequency of the CODEC is fixed to a standard value. The relation between this standard sampling frequency FS1 and the variation sampling frequency FS2 is represented by FS1=n times FS2 as described before. The sampling frequency of the DA converter is fixed to the standard value. Therefore, it is required for the waveform output buffer WAVEBUF which is read a sample by sample every period of this fixed standard sampling frequency FS1 to store beforehand a series of the waveform data in matching with the standard sampling frequency FS1 regardless of the sampling frequency selected for the waveform computation. If the sampling frequency FS2 which is 1/n of the sampling frequency FS1 is selected, the resultant computed waveform samples are written to the waveform output buffer WAVEBUF such that n samples of the same value are arranged on continuous buffer addresses. When the waveform data for one frame has been written to the waveform output buffer WAVEBUF, the contents of the waveform buffer WAVEBUF may be passed to the CODEC. Since the sampling frequency FSb of the data series stored in the waveform output buffer WAVEBUF differs from the operation sampling frequency FSc of the CODEC (or DAC), sampling frequency matching may be required. For example, if FSb=k times FSc (K>1), then the tone waveform data may be sequentially passed from the waveform output buffer WAVEBUF in skipped read manner by updating every n addresses. Namely, during the time from the processing of storing the music waveform samples in the waveform output buffer WAVEBUF to the processing of the DAC of the CODEC, a sampling frequency conversion circuit may be inserted to match the write and read sampling frequencies.

Information about the time at which storage is made in the MIDI event time buffer TM is required for performing the time-sequential processing corresponding to occurrence of note events. If the frame time is set to a sufficiently short value such as 5 ms or 2.5 ms, adjustive fine timing control for various event processing operations is not required substantially in the frame, so that these event processing operations need not be performed by especially considering the time information. However, it is preferable that the information from the breath controller and so on be handled on a last-in first-out basis, so that, for the event of this information, processing on the last-in first-out basis is performed by use of the time information. In addition to the above-mentioned buffers, the RAM 3 may store application programs.

FIG. 28 shows details of the tone control parameters VATONEPAR. The tone control parameters VATONPAR include an exciter parameter (EXCITER PARAMETERS), a wind instrument/string instrument parameter (P/S PARAMETERS), an envelope parameter (EG PAR), a resonator parameter (RESONATOR PAR), an effect parameter (EFFECT PAR), and sampling frequency data (SAMPLING FREQ). Each of these parameters includes a plurality of parameter items. Each delay amount parameter and each tone hole junction multiplication coefficient are determined by a pitch of a musical tone. In this case, DL through DRR are tables listing a delay amount for a pitch. Delay amounts are read from these tables and set so that a total delay amount corresponds to a desired pitch. Each of these delay amount tables is prepared by actually sounding a tone having a predetermined pitch and by feeding back a deviation in the pitch frequency. The filter parameters such as FLP and FRP are set according to the contour of the tube to be simulated, the characteristics of the string, and the operation amount of the operator device. It should be noted that preferred tone control parameters VATONEPAR are set according to the sampling frequency used. The sampling frequency of these tone control parameters VATONEPAR is indicated by SAMPLING FREQ in FIG. 28. The processing for waveform generation by computation is performed by using the tone control parameters VATONEPAR prepared for the sampling frequency concerned by referencing this SAMPLING FREQ information. In this example, the standard sampling frequency is FS1 and the alternative sampling frequency FS2 is ½ times FS1, for example.

As described above, the inventive sound source apparatus has a software module used to compute samples of a waveform in response to sampling frequency for generating a musical tone according to performance information. In the inventive apparatus, a processor device composed of the CPU 1 periodically executes the software module SSM for successively computing samples of the waveform corresponding to a variable sampling frequency so as to generate the musical tone. A detector device included in the CPU 1 detects a load of computation imposed on the processor device during the course of generating the musical tone. A controller device implemented by the CPU 1 operates according to the detected load for changing the variable sampling frequency to adjust a rate of computation of the samples.

Preferably, the controller device provides a fast sampling frequency when the detected load is relatively light, and provides a slow sampling frequency when the detected load is relatively heavy such that the rate of the computation of the samples is reduced by 1/n where n denotes an integer number.

The processor device includes a delay device having a memory for imparting a delay to the waveform to determine a pitch of the musical tone according to the performance information. The delay device generates a write pointer for successively writing the samples into addresses of the memory and a read pointer for successively reading the samples from addresses of the memory to thereby create the delay corresponding to an address gap between the write pointer and the read pointer. The delay device is responsive to the fast sampling frequency to increment both of the write pointer and the read pointer by one address for one sample. Otherwise, the delay device is responsive to the slow sampling frequency to increment the write pointer by one address n times for one sample and to increment the read pointer by n addresses for one sample.

The processor device may include a delay device having a pair of memory regions for imparting a delay to the waveform to determine a pitch of the musical tone according to the performance information. The delay device successively writes the samples of the waveform of one musical tone into addresses of one of the memory regions, and successively reads the samples from addresses of the same memory region to thereby create the delay. The delay device is operative when said one musical tone is switched to another musical tone for successively writing the samples of the waveform of said another musical tone into addresses of the other memory region and successively reading the samples from addresses of the same memory region to thereby create the delay while clearing the one memory region to prepare for a further musical tone.

Preferably, the processor device executes the software module composed of a plurality sub-modules for successively computing the waveform. The processor device is operative when one of the sub-modules declines to become inactive without substantially affecting other sub-modules during computation of the waveform for skipping execution of said one sub-module.

The inventive sound source apparatus has a software module used to compute samples of a waveform for generating a musical tone. In the inventive apparatus, a provider device variably provides a trigger signal at a relatively slow rate to define a frame period between successive trigger signals, and periodically provides a sampling signal at a relatively fast rate such that a plurality of sampling signals occur within one frame period. The processor device is resettable in response to each trigger signal and is operable based on each sampling signal to periodically execute the software module for successively computing a number of samples of the waveform within one frame. The detector device detects a load of computation imposed on the processor device during the course of generating the musical tone. The controller device is operative according to the detected load for varying the frame period to adjust the number of the samples computed within one frame period. A converter device composed of CODEC 14 is responsive to each sampling signal for converting each of the samples into a corresponding analog signal to thereby generate the musical tones.

The following explains the operations of the present invention in detail with reference to flowcharts.

Figure 29:
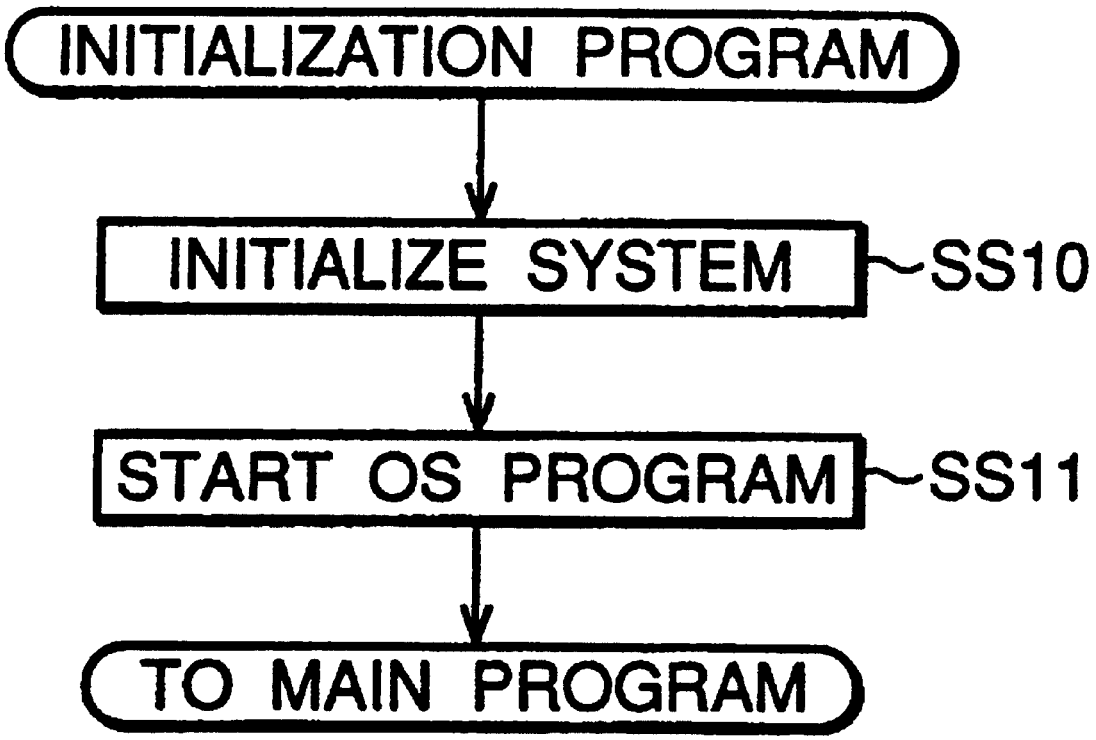
FIG. 29 is a flowchart of an initialization program used in the present invention.

FIG. 29 is a flowchart showing an initialization program to be executed at a power-on or reset sequence. When the initialization program is started, system initialization such as hardware initialization is performed in step SS10. Next, in step SS11, the OS program is started to place other programs in an executable state in which a main program for example is executed.

Figure 30:
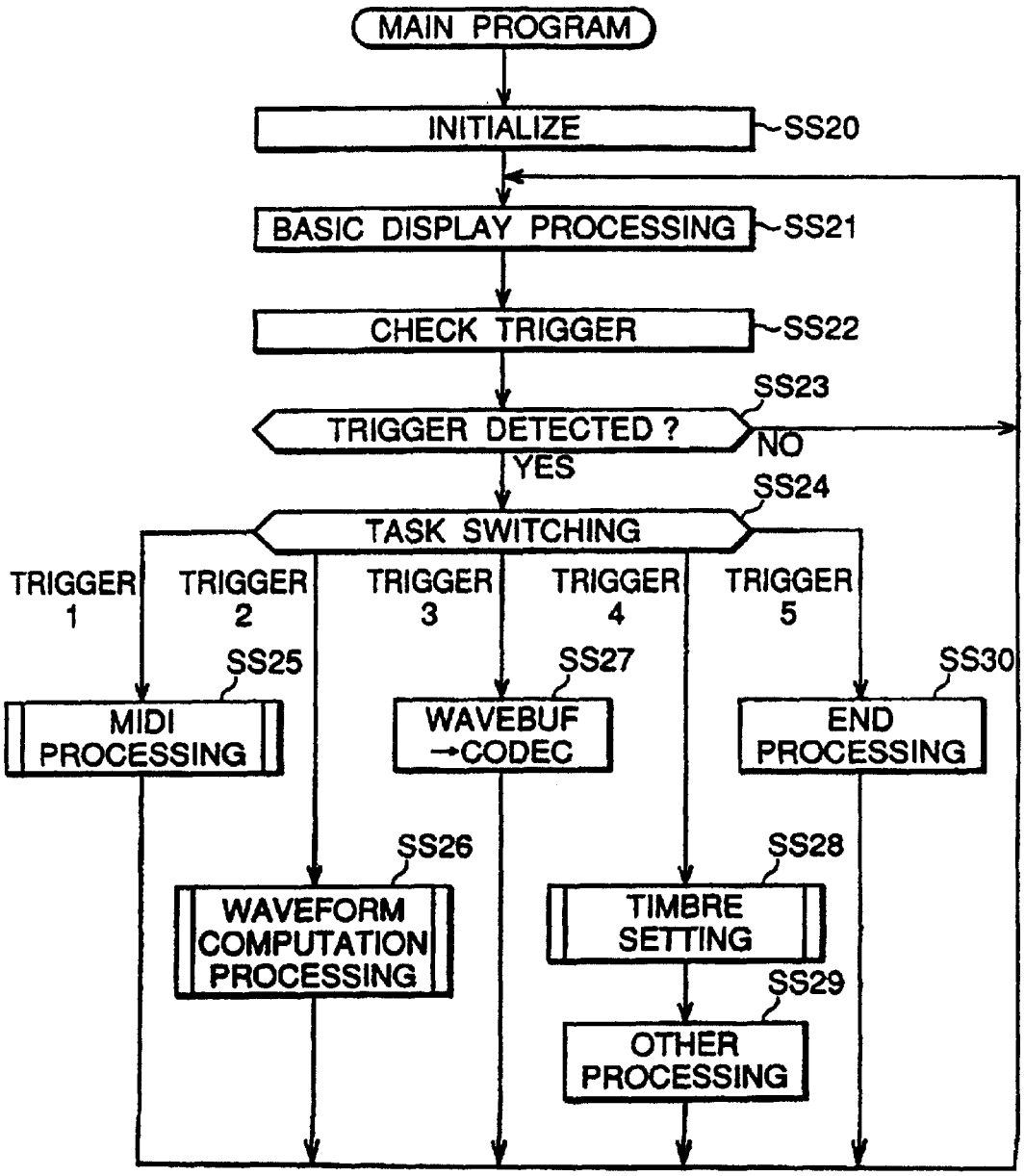
FIG. 30 is a flowchart of a main program in the present invention.

FIG. 30 is a flowchart showing the main program to be executed by the CPU 1. When the main program is started, initialization such as resetting of registers is performed in step SS20. Next, in step SS21, basic display processing such as arranging windows for display screens such as desktop is performed. Then, in step SS22, trigger check is performed for task switching. In step SS23, it is determined whether a trigger has taken place. The operations of steps SS21 through SS23 are repeated cyclically until a trigger is detected. If a trigger is found, the decision in step SS23 turns YES. In step SS24, the task switching is performed so that a task corresponding to the detected trigger is executed.

There are five types of triggers for commencing the task switching. If supply of a MIDI message from an application program or the like via the sound source API (MIDI API) is detected, it indicates trigger 1. In this case, the software sound source module SSM is started in step SS25 to perform MIDI processing. If an internal interrupt has been caused by a software timer (tim) that outputs the interrupt every frame period, it indicates trigger 2. In this case, the software sound source module SSM is started in step SS26 to perform waveform computation processing, thereby generating tone waveform data for the predetermined number of samples. If a transfer request for tone waveform data has been made by an output device (CODEC) based on DAM, it indicates trigger 3. In this case, transfer processing is performed in step SS27 in which the tone waveform data is transferred from the waveform output buffer WAVEBUF to the output device.

If an operation event based on manual operation of the input operator device such as the mouse or the keyboard of the processing apparatus has been detected, it indicates trigger 4. In the case of the operation event for timbre setting, timbre setting processing is performed in step SS28. For other operation events, corresponding processings are performed in step SS29. If the end of the operation has been detected, it indicates trigger 5. In this case, end processing is performed in step S30. If no trigger has been detected, trigger 4 is assumed and the processing of steps SS28 and SS29 is performed. When the processing of trigger 1 to trigger 5 has been completed, the SSM returns control to step SS21. The processing operations of steps SS21 through SS30 are repeated cyclically.

Figure 31:
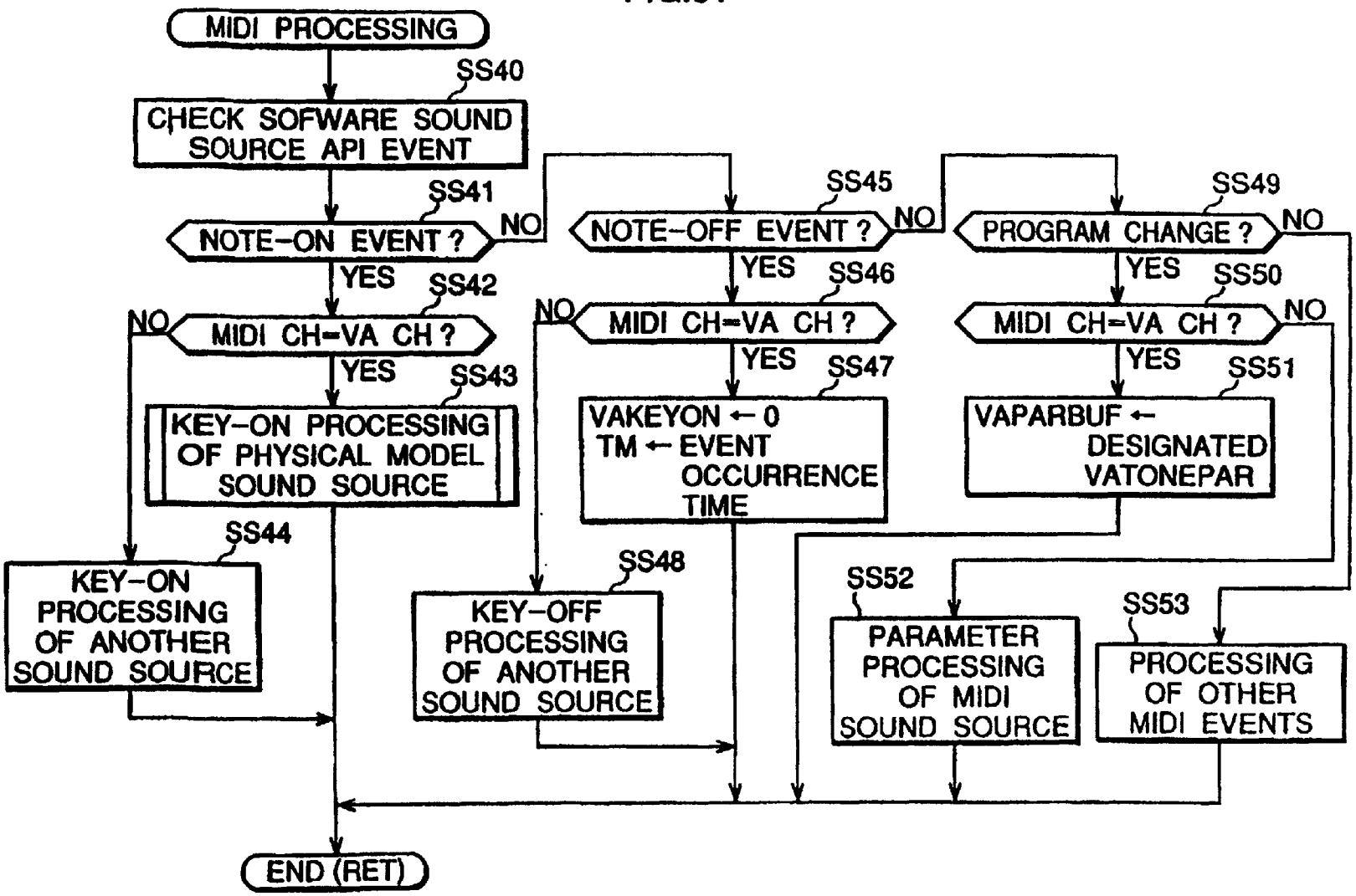
FIG. 31 is a flowchart of MIDI processing in the main program.

FIG. 31 is a flowchart showing the MIDI processing to be performed in step SS25. When the MIDI processing is started, the contents of the MIDI event are check in step S40. This check is specifically performed on the MIDI message written to "MIDI API" constituted as a buffer. Then, it is determined in step SS41 whether the MIDI event is a note-on event. If the MIDI event is found a note-on event, the SSM passes control to step SS42, in which it is determined whether the sound channel (MIDI CH) assigned to that note-on event belongs to a physical model sound source or a VA sound source. If the sound channel assigned to the note-on event is found in the physical model sound source (hereafter, such a MIDI CH is labeled "VA CH"), the key-on processing in the physical model sound source is performed in step SS43 and control is returned. If the sound channel assigned to the note-on event is not found in the physical model sound source, the key-on processing of another sound source is performed in step SS44, upon which control is returned. This key-on processing is performed in the DSP 9-1 of the digital signal processing board 9, for example.

If the MIDI event is found not a note-on event in step SS41, it is determined in step SS45 whether the MIDI event is a note-off event. If the MIDI event is found a note-off event, it is determined in step SS46 whether the sound channel (MIDI CH) assigned to the note-off event belongs to the physical model sound source. If the sound channel assigned to the note-off event is found in the physical model sound source, the key-on flag VAKEYON in the physical model sound source is set to "0" in step SS47, and the occurrence time of the note-off event is stored in the MIDI event time buffer TM, upon which control is returned. If the sound channel assigned to the note-off event is not found in the physical model sound source, the key-off processing of another sound source is performed in step SS48, upon which control is returned.

Further, if the MIDI event is found not a key-off event in step SS45, it is determined in step SS49 whether the MIDI event is a program change. If the MIDI event is found the program change, it is determined in step SS50 whether the sound channel (MIDI CH) assigned to the MIDI event of program change belongs to the physical model sound source. If the sound channel assigned to the MIDI event of program change is found in the physical model sound source, the tone control parameters VATONEPAR designated in the program change are stored in step SS51, upon which control is returned. If the sound channel assigned to the MIDI event of program change is not found in the physical model sound source, the timbre parameter processing corresponding to that sound channel is performed in step SS52, upon which control is returned. If the MIDI event is not a program change in step SS49, the processing of the corresponding MIDI event is performed in step SS53, upon which control is returned. In this MIDI event processing, the processing for a breath controller operation is performed, for example.

Figure 32A:
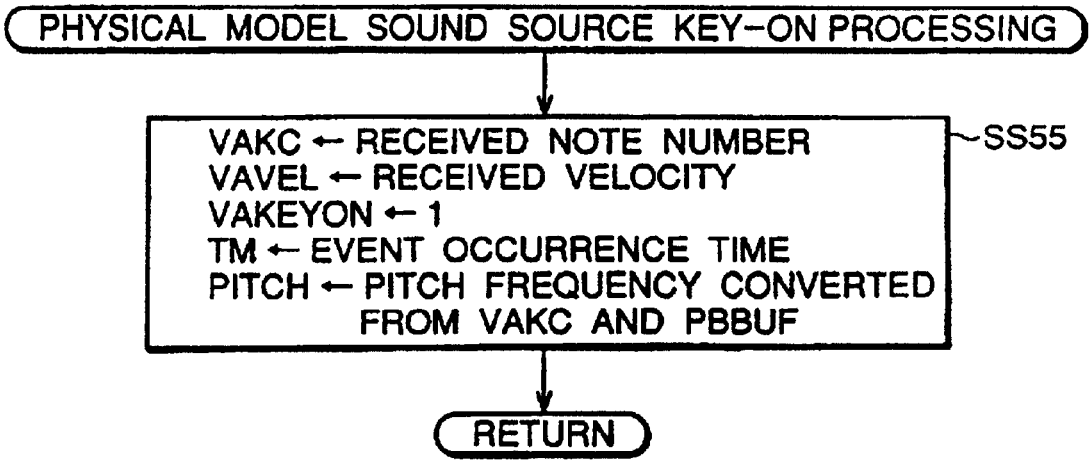
FIGS. 32A through 32C are a flowchart of physical model sound source key-on processing in the MIDI processing, a flowchart of the MIDI event processing and a flowchart of timbre setting processing activated by a user.

FIG. 32A is a flowchart showing the key-on processing of the physical model sound source to be performed in step SS43. When the physical model sound source key-on processing is started, the note number contained in the received MIDI message is stored in the buffer VATONEBUF as a parameter VAKC in step SS55. The velocity information contained in the same MIDI message is stored in the VATONEBUF as a parameter VAVEL. The VAKEYON flag is set to "1". Further, the MIDI message receive time is stored in the buffer TM as an event occurrence time. Pitch frequency data converted from the parameter VAKC and the pitch bend value stored in the pitch bend buffer PBBUF are stored in the buffer VATONEBUF as a parameter PITCH. When these processing operations come to an end, control is returned. It should be noted that, instead of using the pitch bend value for obtaining the pitch frequency, the pitch bend value may be used for setting an embouchure parameter.

Figure 32B:
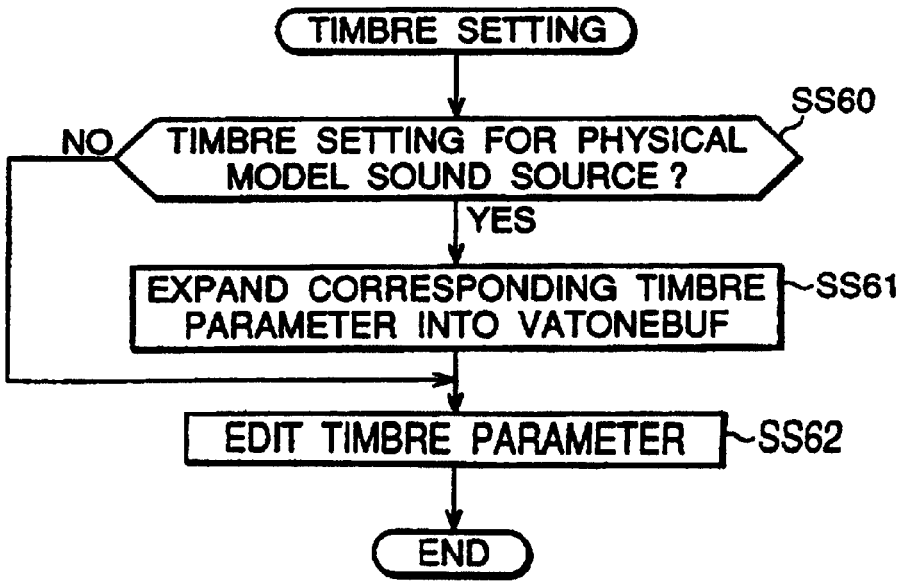

FIG. 32B is a flowchart showing the timbre setting processing to be performed in step SS28 when the above-mentioned trigger 4 has been detected. When the user performs a timbre setting operation by manipulating the mouse or keyboard, the timbre setting processing is started. In step SS50, it is determined whether timbre setting of the physical model sound source has been designated. If the timbre setting is found designated, the timbre parameter corresponding to the designated timbre is expanded in the buffer VATONEBUF as shown in FIG. 27 in step SS61. Then, in step SS62, the timbre parameter is edited by the user, upon which the timbre setting processing comes to an end. If the timbre setting is found not designated in step SS60, control is passed to step SS62, in which the timbre parameter is edited by the user and the timbre setting processing comes to an end.

Figure 32C:
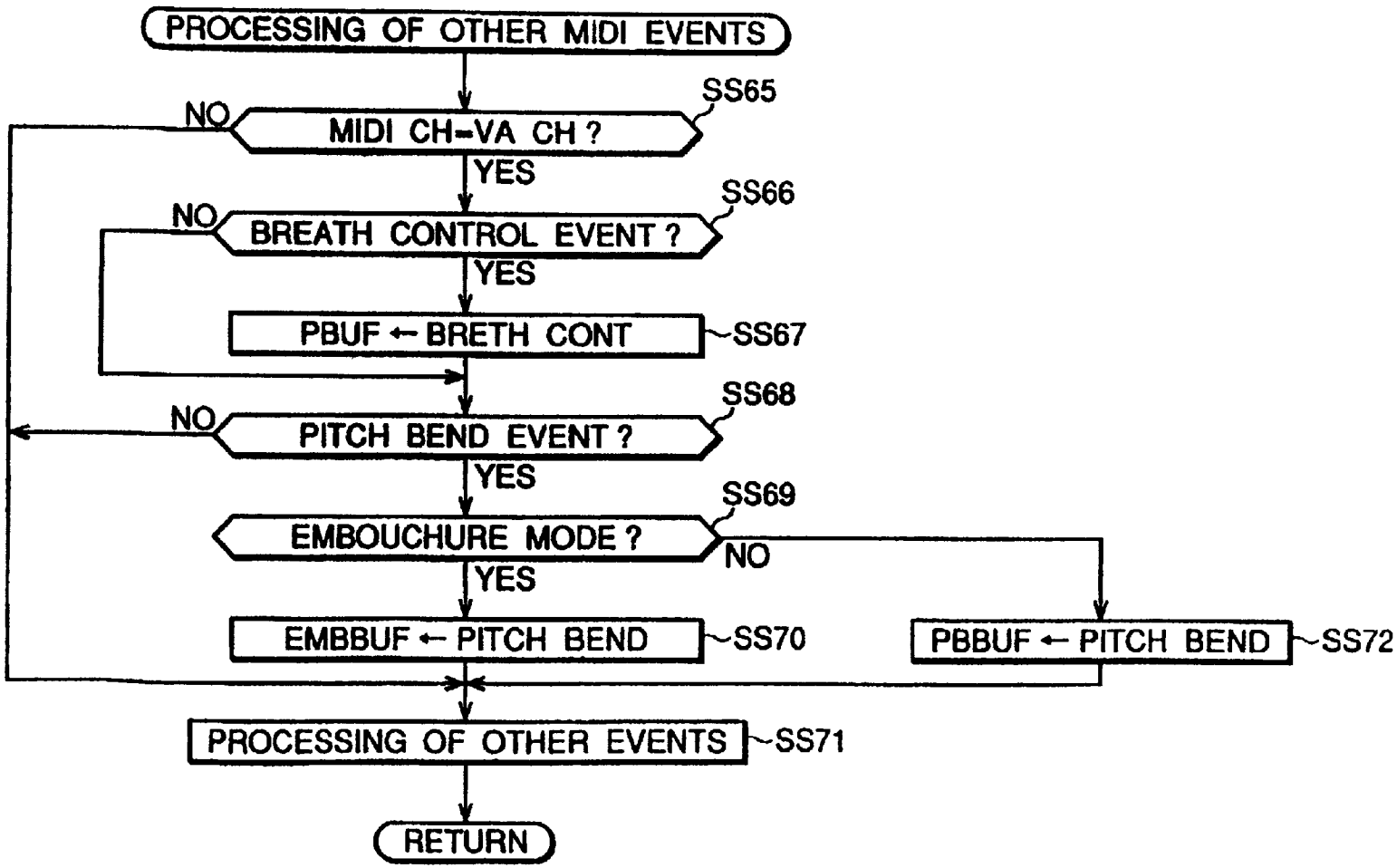

FIG. 32C is a flowchart showing other MIDI event processing to be performed in step SS53. When the other MIDI event processing is started, it is determined in step SS65 whether the sound channel (MIDI CH) assigned to the MIDI event belongs to the physical model sound source. If the sound channel assigned to the MIDI event is found in the physical model sound source, it is determined in step SS66 whether the MIDI event is a breath control event. If the MIDI event is found a breath control event, the parameter BRETH CONT in the breath control event is stored in the pressure buffer PBUF in step SS67.

If the MIDI event is found not a breath control event, step SS67 is skipped, and, in step SS68, it is determined whether the MIDI event is a pitch bend event. If the MIDI event is found a pitch bend event, it is determined in step SS69 whether the embouchure mode is set. If the embouchure mode is set, the parameter PITCHBEND in the pitch bend event is stored in the embouchure buffer EMBBUF in step SS70. If the embouchure mode is not set, the parameter PITCHBEND in the pitch bend event is stored in the pitch bend buffer PBBUF in step SS72.

Further, if it is found that the sound channel does not belong to the physical model sound source in step SS65 and if the MIDI event is found not a pitch bend event in step SS68, control is passed to step SS71, in which it is assumed that the received MIDI event does not correspond to any of the above-mentioned events, then processing corresponding to the received event is performed, and control is returned. It should be noted that the embouchure signal indicates a pressure with which the player mouths the mouthpiece. Since the pitch varies based on this embouchure signal, the parameter PITCHBEND is stored in the embouchure buffer EMBBUF in the embouchure mode. As described, every time a MIDI event is received, the parameters associated with music performance are updated by the MIDI event processing.

Figure 33:
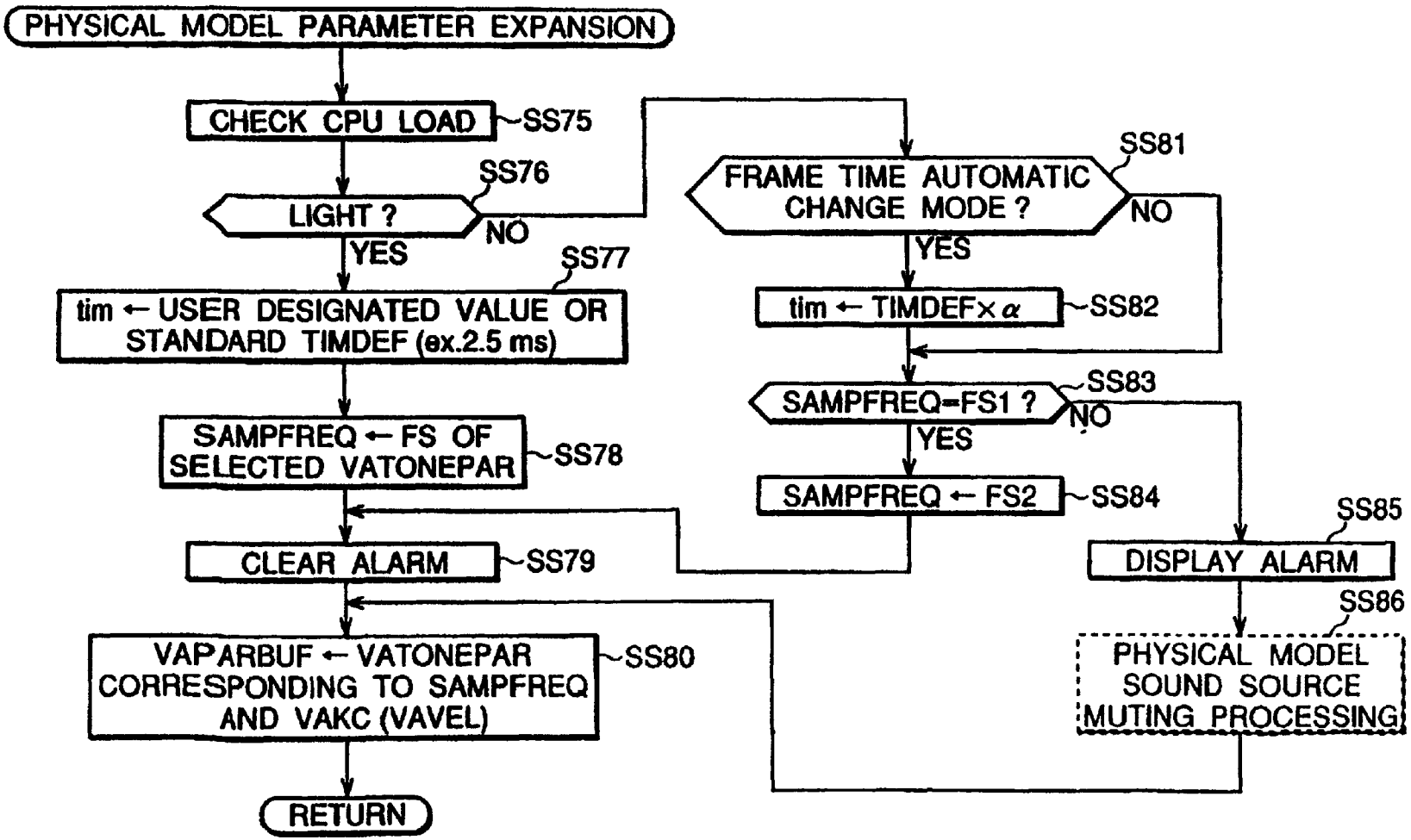
FIG. 33 is a flowchart of physical model parameter expansion processing in the timbre setting processing.

FIG. 33 is a flowchart showing the physical model parameter expanding processing. This processing is performed in step SS61 of the above-mentioned timbre setting processing before sounding. When the physical model parameter expanding processing is started, the CPU load state is checked in step SS75. This check is performed based on a status report from the CPU 1 for example and by considering the setting value of the sampling frequency FS. If this check indicates in step SS76 that the load of the CPU 1 is not yet heavy, the shortest frame period of one frame set by the user or the standard frame period TIMDEF is set in step SS77 as a period tim of the software timer that causes a timer interrupt for conducting the waveform generation processing every frame. It should be noted that the standard frame period TIMDEF is set to 2.5 ms, for example.

In step SS78, the sampling frequency FS specified by the tone control parameter VATONEPAR for the selected physical model sound source is set as the operation sampling frequency SAMPFREQ. Further, in step SS79, alarm clear processing is performed. In step SS80, the tone control parameters VATONEPAR containing to the parameter SAMPFREQ and the parameter VAKC are read to be stored in the buffer VAPARBUF, upon which control is returned. In this case, the tone control parameters VATONEPAR considering the parameter VAVEL may be stored in the buffer VAPARBUF.

If the load of the CPU 1 is found heavy in step SS76, it is determined in step SS81 whether the frame time automatic change mode is set. If this mode is set, a value obtained by multiplying the standard frame period TIMDEF by integer $\alpha$ is set as the period tim of the software timer in step SS82. Integer $\alpha$ is set to a value higher than one. When the frame period is extended, the frequency at which parameters are loaded into the physical model sound source can be lowered, thereby reducing the number of processing operations for transferring the changed data and the number of computational operations involved in the data updating.

In step SS83, the current operation sampling frequency SAMPFREQ is checked. If the operation sampling frequency SAMPFREQ is the sampling frequency FS1, it indicates that the load of the CPU 1 is heavy, so that the sampling frequency FS2 which is ½ of FS1 is set as the operation sampling frequency SAMPFREQ in step SS84. Then, the processing operations of step SS79 and subsequent steps are performed. In this case, a new tone control parameter VATONEPAR corresponding to the changed parameter SAMPFREQ is read and stored in the buffer VAPARBUF.

In step SS83, if the operation sampling frequency SAMPFREQ is found not the standard sampling frequency FS1, alarm display processing is performed in step SS85. This is because the current operation sampling frequency SAMPFREQ is already 1/n times FS1. Although the sampling frequency FS2 that should comparatively reduce the load of the CPU 1 is already set, the load of the CPU 1 has been found heavy. This may disable the normal waveform generation processing in the physical model sound source. If the physical model sound source is found sounding in step SS86, the physical model sound source is muted and the processing of step SS80 is performed.

Figure 34:
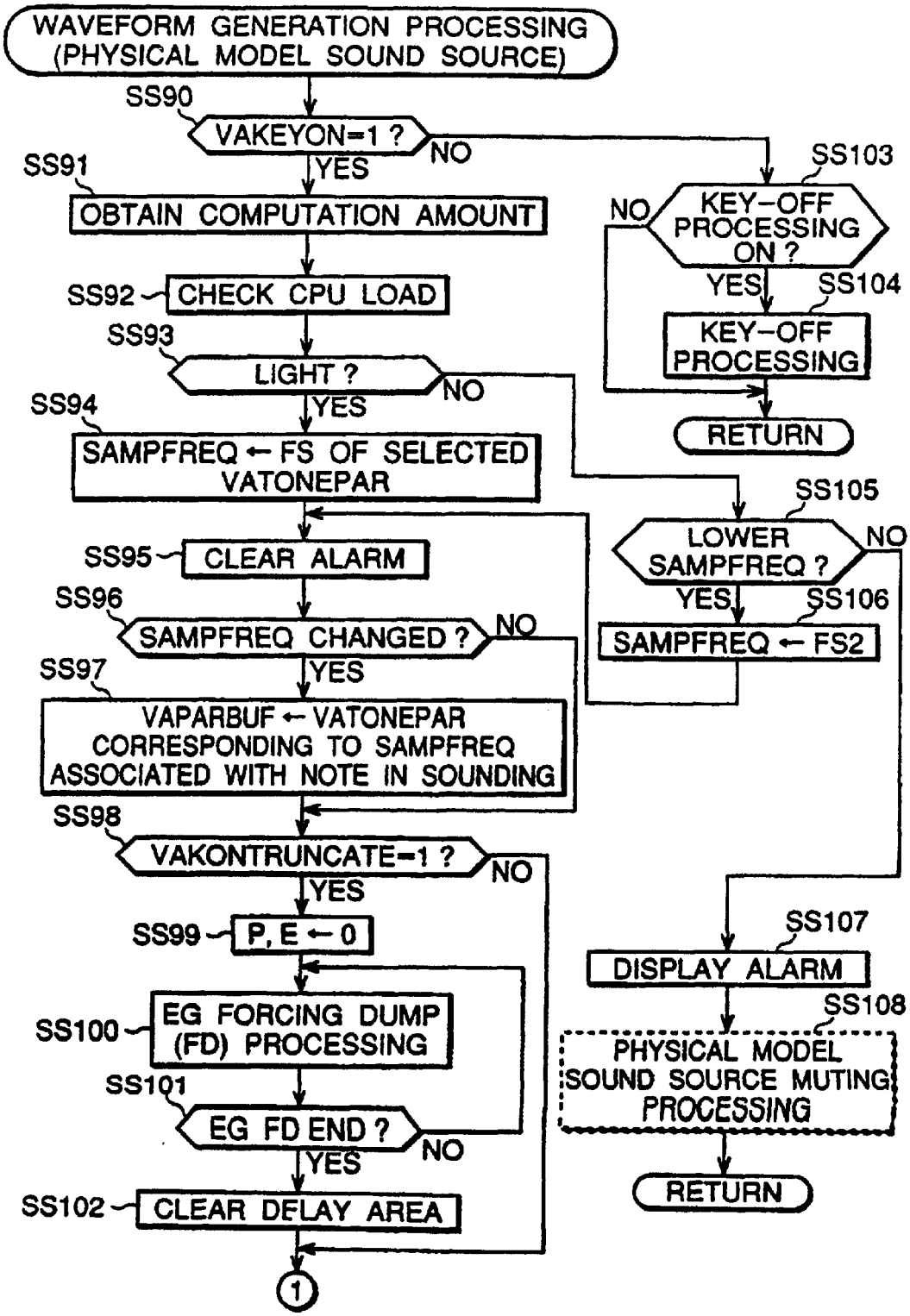
FIG. 34 is a part of a flowchart of waveform generation processing of a physical model sound source of the present invention.
Figure 35:
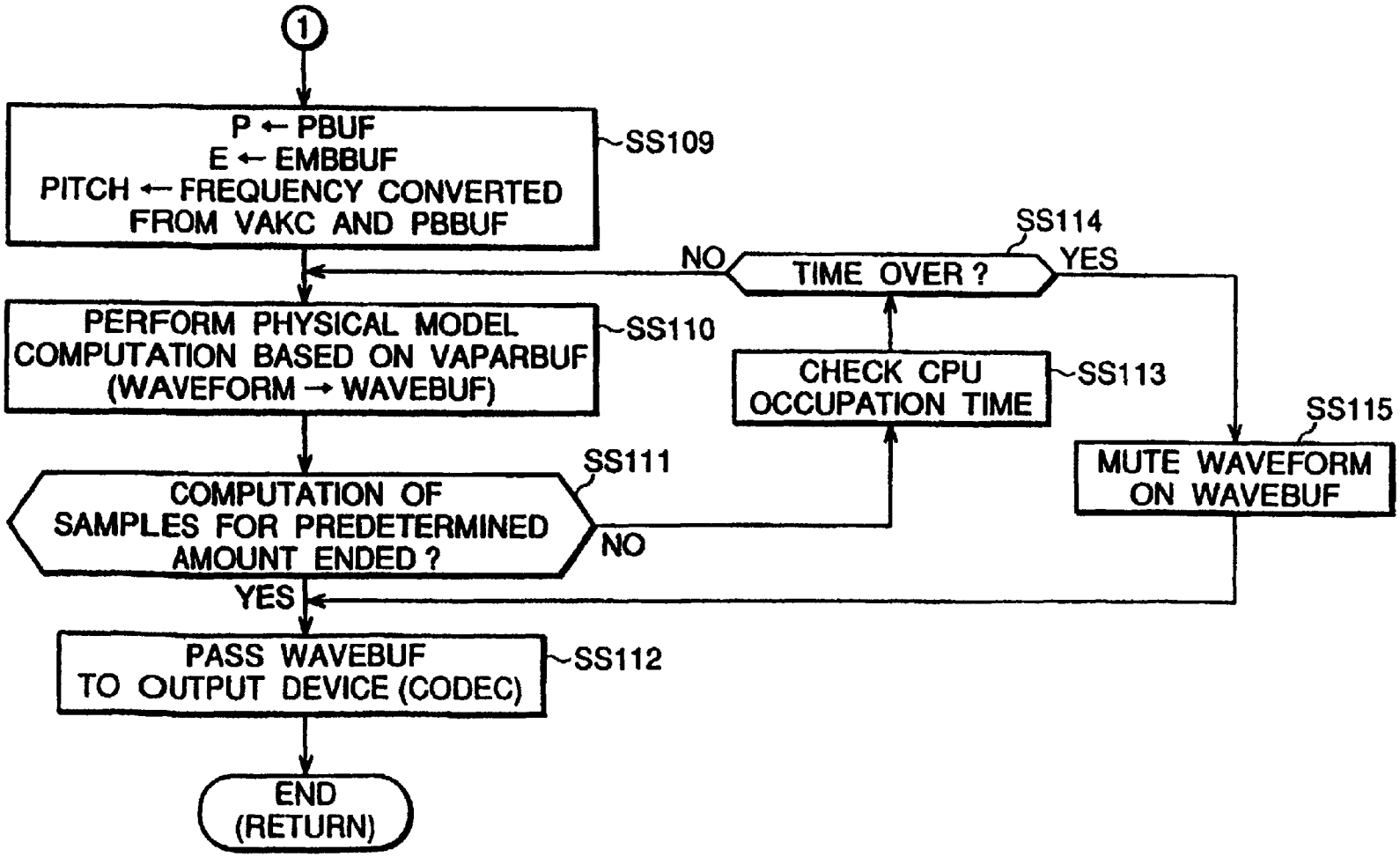
FIG. 35 is the remaining part of the flowchart of the waveform generation processing of the physical model sound source of the present invention.

The above-mentioned processing operations cause the tone control parameters VATONEPAR necessary for the physical model sound source to generate the waveform data which are stored in the buffer VAPARBUF. This allows the generation of waveforms by computation. In this waveform generation processing, the operation sampling frequency is dynamically changed depending on the load of the CPU 1. Flowcharts for this waveform generation processing of the physical model sound source are shown in FIGS. 34 and 35. The waveform generation processing is started by the timer interrupt outputted from the software timer in which the period tim is set. In step SS90, it is determined whether the key-on flag VAKEYON is set to "1". If the key-on flag VAKEYON is found "1", a computation amount necessary for one frame is computed in step SS91. This computation amount includes the number of samples for generating a continued tone. If the MIDI message received in an immediately preceding frame includes a key-on event, this computation amount includes those for generating the number of samples of a tone to be newly sounded. The number of samples of the tone to be newly sounded may be the number of samples necessary during the time from reception of the MIDI message to the end of the frame concerned.

Then, in step SS92, the load state of the CPU 1 is checked. This check is performed by considering the occupation ratio of the waveform computation time in one frame period in the preceding frame. If this check indicates in step SS93 that the load of the CPU 1 is not heavy, the sampling frequency FS in the selected tone control parameters VATONEPAR is set as the operation sampling frequency SAMPFREQ in step SS94. If the check indicates that the load of the CPU 1 is heavy, it is determined in step SS105 whether the operation sampling frequency SAMPFREQ can be lowered. If it is found that the operation sampling frequency SAMPFREQ can be lowered, the same is actually lowered in step SS106 to 1/n, providing the sampling frequency FS2. If the sampling frequency is already FS2, and therefore the operation sampling frequency SAMPFREQ cannot be lowered any more, alarm display is performed in step SS107. This is because the operation sampling frequency SAMPFREQ is already set to 1/n times FS1. Although the sampling frequency is already set to the sampling frequency FS2 that should comparatively lower the load of the CPU 1, the actual load of the CPU 1 is found yet heavy. In this case, the necessary computation amount cannot be provided in one frame time or a predetermined time. Then, if the physical model sound source is found sounding in step SS108, the sound channel is muted, upon which control is returned.

When the processing of step SS94 or step SS106 comes to an end, alarm clear processing is performed in step SS95. Then, in step SS96, it is determined whether the operation sampling frequency SAMPFREQ has been changed. If the operation sampling frequency SAMPFREQ is found changed, the parameter change processing due to the operation sampling frequency change is performed in step SS97. Namely, the tone control parameter VATONEPAR corresponding to the operation sampling frequency SAMPFREQ is read and stored in the buffer VAPARBUF. If the change processing is found not performed, step SS97 is skipped.

In step SS98, it is determined whether truncate processing is to be performed. This truncate processing is provided for monotone specifications. In the truncate processing, a tone being sounded is muted and a following tone is started. If a truncate flag VATRUNCATE is set to "1", the decision is YES and the truncate processing is started. Namely, in step SS99, the signal P for breath pressure or bow velocity and the signal E for embouchure or bow pressure are set to "0". In step SS100, envelope dump processing is performed. This dump processing is performed by controlling the EG PAR to be supplied to the envelope controller. In step SS101, it is determined whether the envelope dump processing has ended. If this dump processing is found ended, the delay amount set to the delay circuit in the loop is set to "0" in step SS102. This terminates the processing for muting the sounding tone.

Then, in step SS109 shown in FIG. 35, the data stored in the pressure buffer PBUF is set as a signal P. The data stored in the embouchure buffer EMBBUF is set as a signal E. Further, the frequency data converted based on the key code parameter VAKC and the pitch bend parameter stored in the pitch bend buffer PBBUF is set as a pitch parameter PITCH. In step SS110, based on the tone control parameters VATONEPAR stored in the buffer VAPARBUF, physical model computation processing is performed. Every time this computation processing is performed, the tone waveform data for one sample is generated. The generated tone waveform data is stored in the waveform output buffer WAVEBUF.

In step SS111, it is determined whether the waveform computation for the number of samples calculated in step SS91 has ended. If the computation is found not ended, control is passed to step SS113, in which the time occupied by computation by the CPU 1 in one frame time or a predetermined time is checked. If this check indicates that the occupation time does not exceed the one frame time, next sample computation processing is performed in step SS110. The processing operations of steps SS110, SS111, SS113, and SS114 are cyclically performed until the predetermined number of samples is obtained as long as the occupation time does not exceed the one frame time. Consequently, it is determined in step SS111 that the computation of the predetermined number of samples in one frame has ended. Then, in step SS112, the tone waveform data stored in the waveform output buffer WAVEBUF is passed to the output device (the CODEC).

If it is determined in step SS114 that one frame time has lapsed before the predetermined number of samples has been computed, then, in step SS115, the muting processing of the tone waveform data in the waveform output buffer WAVEBUF is performed. Next, in step SS112, the tone waveform data stored in the waveform output buffer WAVEBUF is passed to the output device (the CODEC). If, in step SS90, the key-on flag VAKEYON is found not to set "1", it is determined in step SS103 whether key-off processing is on. If the decision is YES, the key-off processing is performed in step SS104. If the key-off processing is found not on, control is returned immediately.

According to the invention, the tone generating method uses a hardware processor in the form of the CPU 1 and a software module in the form of the sound source module SSM to compute samples of a waveform in response to a sampling frequency for generating a musical tone according to performance information. The inventive method comprises the steps of periodically operating the hardware processor to execute the software module for successively computing samples of the waveform corresponding to a variable sampling frequency so as to generate the musical tone, detecting a load of computation imposed on the hardware processor during the course of generating the musical tone, and changing the variable sampling frequency according to the detected load to adjust a rate of computation of the samples. Preferably, the step of changing provides a fast sampling frequency when the detected load is relatively light, and provides a slow sampling frequency when the detected load is relatively heavy such that the rate of the computation of the samples is reduced by 1/n where n denotes an integer number.

The inventive method uses a hardware processor having a software module used to compute samples of a waveform for generating a musical tone. The inventive method comprises the steps of variably providing a trigger signal at a relatively slow rate to define a frame period between successive trigger signals, periodically providing a sampling signal at a relatively fast rate such that a plurality of sampling signals occur within one frame period, operating the hardware processor resettable in response to each trigger signal and operable in response to each sampling signal to periodically execute the software module for successively computing a number of samples of the waveform within one frame, detecting a load of computation imposed on the software processor during the course of generating the musical tone, varying the frame period according to the detected load to adjust the number of the samples computed within one frame period, and converting each of the samples into a corresponding analog signal in response to each sampling signal to thereby generate the musical tones.

Figure 38:
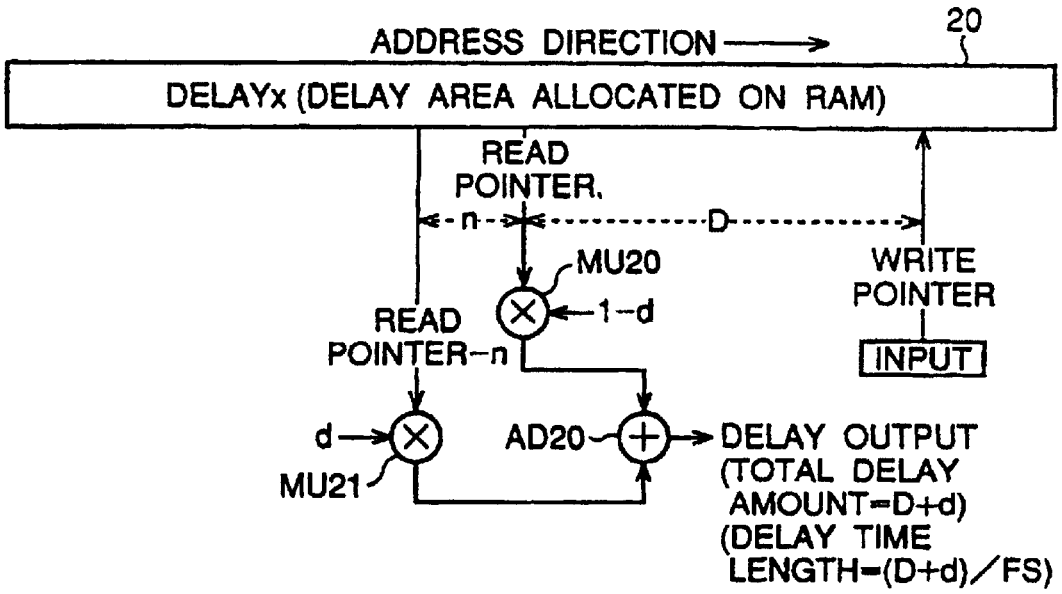
FIG. 38 is a diagram for explaining a method of controlling a delay time length of a delay circuit of the physical model sound source.

Meanwhile, in order to build the physical model sound source in which the sampling frequency is variable, a delay device is required in which the sampling frequency is variable while a delay time can be set without restriction from the sampling frequency. The following explains such a delay device with reference to FIG. 38. In the physical model sound source, each delay circuit uses a delay area in the RAM 3 as a shift register to obtain a predetermined delay amount. A DELAY×20 shown in FIG. 38 is the delay circuit constituted by the delay area allocated in the RAM 3. The integer part of the delay amount provides the number of shift register stages D between a write pointer indicating an address location at which inputted data is written and a read pointer indicating an address location at which the data is read. The decimal fraction of the delay amount provides multiplication coefficient d to be set to a multiplier MU21 to perform interpolation between a pair of the data read at an address location indicated by the read pointer and the data read at an address location (READ POINTER-n) n stages before that read pointer. It should be noted that a multiplication coefficient (1−d) is set to a multiplier MU20 for interpolation.

In this case, a total delay amount of the delay outputs of an adder AD20 in the DELAY×20 becomes (D+d) equivalent to the number of delay stages. In the equivalent of time, the total delay amount becomes (D+d)/FS for the sampling frequency FS. If the maximum value among the sampling frequencies is FS1, then it is desired to constitute the delay such that the periodic time of the sampling frequency FS1 basically corresponds to one stage of the delay circuit. In such a constitution, in order to lower the sampling frequency to 1/n of the FS1, one sample obtained by the computation may be written to n continuous stages of the delay circuit at n continuous addresses for each sample computation. On the other hand, the delay outputs may be read by updating the read pointer by n addresses. Therefore, in the above-mentioned constitution, the equivalent value of the number of delay stages (D+d) for implementing necessary delay time Td is (D+d)=Td times FS1 regardless of the sampling frequency. It should be noted that the write pointer and the read pointer are adapted to equivalently shift in the address direction indicated by arrow on the shift register. When the pointers reach the right end of the shift register, the pointers jump to the left end, thus circulating on the DELAY×20.

As described, since the delay time length of the time equivalent of one stage of delay is made constant (1/FS1) regardless of the sampling frequency FS, the write pointer is set to write one sample of the waveform data over continuous n addresses to maintain the delay time length of the delay output even if the sampling frequency FS is changed to the sampling frequency FS2 which is 1/n of FS1. Every time one sample of the waveform data is generated, the write pointer is incremented by n addresses. The read pointer is updated in units of n addresses (n−1) at once to read the sample delayed by address skipping. This constitution allows the delay output the one sample of the generated waveform data to correspond to the delay output read from the address location before n addresses. Therefore, for the decimal fraction delay part shown in FIG. 38, data before one sample for interpolation is read from an address location n stages (n addresses) before the read pointer.

Figure 39:
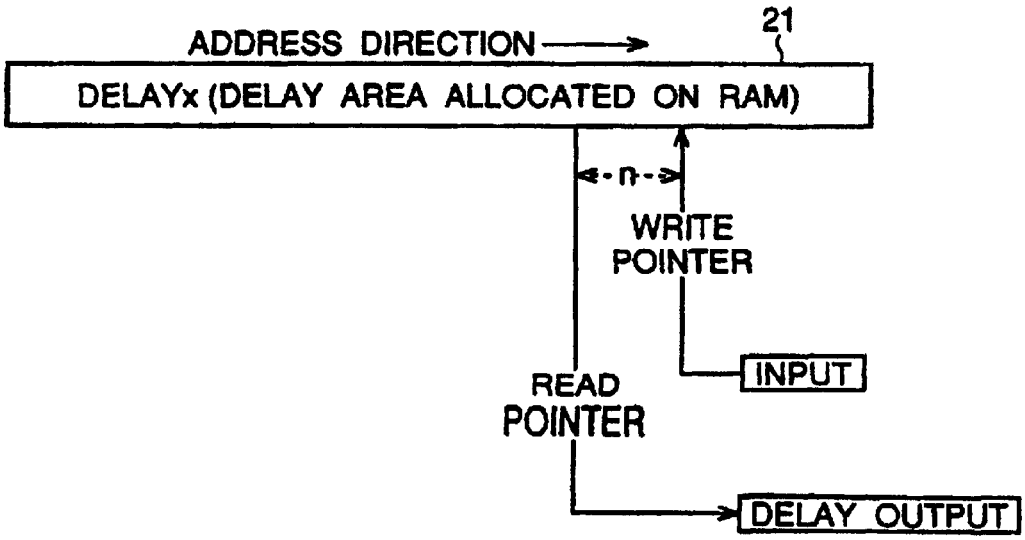
FIG. 39 is a diagram for explaining a method of controlling a delay time length in the physical model sound source.

Also, in a unit delay means provided for a filter and so on in the physical model sound source, a means generally similar to the above-mentioned delay circuit is used to prevent the delay time length from being changed even if the preset sampling frequency is changed. The following explains this unit delay means with reference to FIG. 39. The unit delay means also uses the delay area in the RAM 3 as a shift register. A DELAY×21 shown in FIG. 39 is the unit delay means composed of the delay area allocated in the RAM 3. The unit delay amount of this means is obtained by the shift register through n stages between an address location indicated by a write pointer to which data is written and an address location indicated by a read pointer from which data is read.

As described with the delay circuit shown in FIG. 38, one sample is written into n consecutive addresses (n stages). Therefore, the address difference between the write pointer and the read pointer is n addresses. In this case, the write pointer is set such that the same value of one sample is written over n addresses. The read pointer is set such that data is read by updating the read pointer in units of n addresses. It should be noted that the unit delay means, by nature, may be constituted only by n stages of delay areas.

The inventive sound source apparatus has a software module used to compute samples of a waveform in response to a sampling frequency for generating a musical tone according to performance information. In the inventive apparatus, a processor device responds to a variable sampling frequency to periodically execute the software module for successively computing samples of the waveform so as to generate the musical tone. A detector device detects a load of computation imposed on the processor device during the course of generating the musical tone. A controller device operates according to the detected load for changing the variable sampling frequency to adjust a rate of computation of the samples. The controller device provides a fast sampling frequency when the detected load is relatively light, and provides a slow sampling frequency when the detected load is relatively heavy such that the rate of the computation of the samples is reduced by 1/n where n denotes an integer number. The processor device includes a delay device having a memory for imparting a delay to the waveform to determine a pitch of the musical tone according to the performance information. The delay device generates a write pointer for successively writing the samples into addresses of the memory and a read pointer for successively reading the samples from addresses of the memory to thereby create the delay corresponding to an address gap between the write pointer and the read pointer. The delay device is responsive to the fast sampling frequency to increment both of the write pointer and the read pointer by one address for one sample. Otherwise, the delay device is responsive to the slow sampling frequency to increment the write pointer by one address n times for one sample and to increment the read pointer by n addresses for one sample.

The reproduction sampling frequency of the CODEC 14 is generally fixed as described before. If the sampling frequency of the waveform data generated by computation is changed to 1/n, one sample of the generated tone waveform data is repeatedly written, in units of n pieces, to the continuous address locations in the waveform output buffer of the RAM 3. Consequently, in the present embodiment, a series of the waveform data for one frame is written into the waveform output buffer WAVEBUF in the manner corresponding to the sampling frequency FS1. The CODEC 14 operates at the sampling frequency FS1. The CODEC 14 may receive the contents of the waveform output buffer WAVEBUF without change, and may perform DA conversion on the received contents at the sampling frequency FS1. If the reproduction sampling frequency of the CODEC 14 is synchronously varied with the sampling frequency of the waveform data to be generated, the generated waveform data may be written, a sample by sample, to the waveform output buffer WAVEBUF in the RAM 3.

Figure 40A:
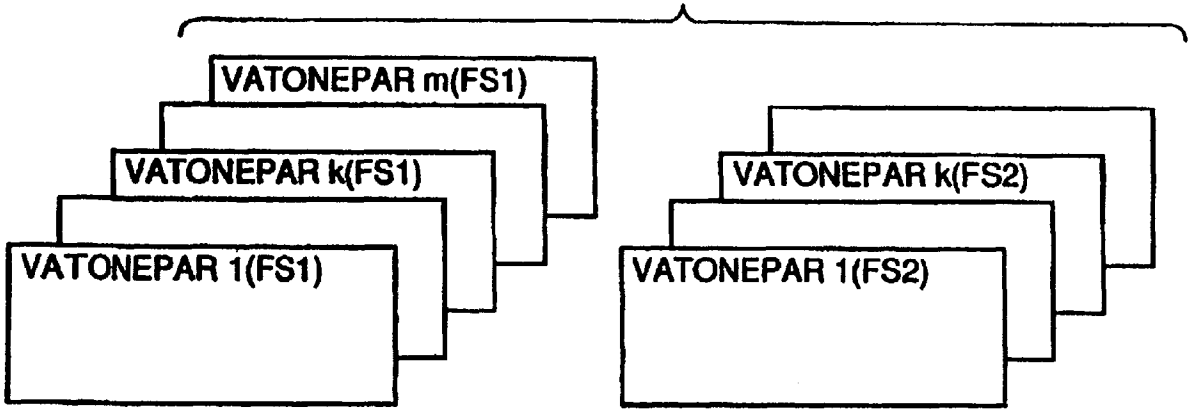
FIGS. 40A and 40B are a diagram illustrating a storage state of the control parameter VATONEPAR of each timbre.

In the waveform generation processing shown in FIGS. 34 and 35, the tone control parameter VATONEPAR adapted to the sampling frequency FS is read and stored in the buffer VAPARBUF as a parameter to be used for generating tone waveform data. Hence, the tone control parameters VATONEPAR of various timbres are stored in a storage means for each possible sampling frequency FS. An example of the arrangement of these parameters is shown in FIG. 40A. In this example, VATONEPAR1(FS1) and VATONEPAR1(FS2) are tone control parameters for piano. VATONEPARk(FS1) and VATONEPARk(FS2) are tone control parameters for violin. Thus, the tone control parameters having voice numbers VATONEPAR1 through VATONEPARk are a set of parameters prepared for each sampling frequency. The tone control parameters having voice numbers subsequent to VATONEPAR(K+1) provide separate timbres, and correspond to one of the sampling frequency FS1 and the sampling frequency FS2.

Figure 40B:
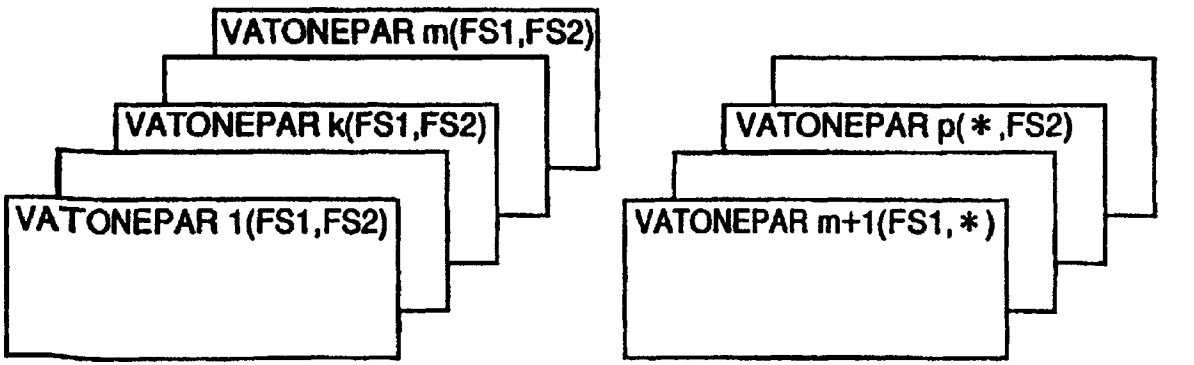

Another example of the arrangement of the parameters is shown in FIG. 40B. In this example, each piece of the timbre data for each sampling frequency FS that can be set is prepared for the same tone control parameter VATONEPARi. Namely, for VATONEPAR1(FS1, FS2) through VATONEPARm(FS1, FS2), the parameters having the same timbre for each of the sampling frequencies FS1 and FS2 are prepared all in one tone control parameter VATONEPARi. In this case, the timbre parameter corresponding to the sampling frequency FS is extracted from one tone control parameter VATONEPARi, and the extracted parameter is stored in the buffer VAPARBUF. The tone control parameters having the voice numbers subsequent to VATONEPARm+1 are the tone control parameters having independent timbres corresponding to one of the sampling frequency FS1 and the sampling frequency FS2. Namely, VATONEPARm+1(FS1, *) corresponds only to the sampling frequency FS1. VATONEPARp(*, FS2) corresponds only to the sampling frequency FS2. In order to prevent changing of the sampling frequency from affecting uniqueness of the tone in terms of auditory sensation, the parameters to be adjusted according to the changed sampling frequency include the delay parameters of the delay loop section, the filter coefficients, and the nonlinear characteristics of the nonlinear converter of the exciter.

Figure 36:
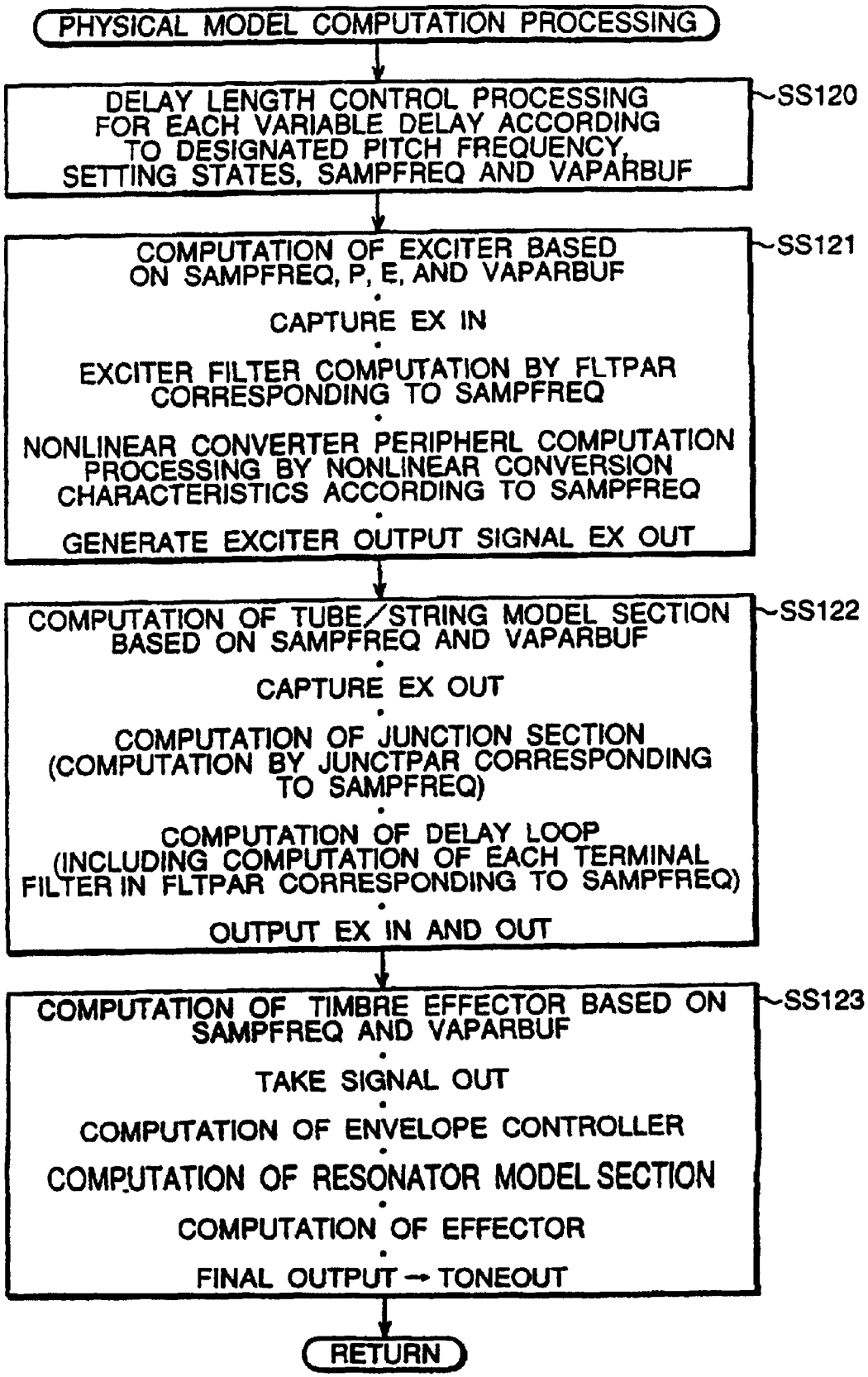
FIG. 36 is a flowchart of physical model computation processing in the tone waveform generation.

FIG. 36 is a flowchart of the physical model sound source processing to be performed in step SS110 of the above-mentioned waveform generation processing. When the physical model sound source processing is started, the delay length setting processing of each variable delay section is performed in step SS120 according to the designated pitch frequency, the operation sampling frequency SAMPFREQ indicating the setting state of each section, and the tone control parameter VATONEPAR stored in the buffer VAPAR- BUF. Each delay time length is set as shown in FIG. 38. Then, in step SS121, the computation processing associated with the exciter as shown in FIG. 26 is performed based on the operation sampling frequency SAMPFREQ, the signal P of breath pressure of bow velocity, the signal E of embouchure or bow pressure, and the tone control parameter VATONEPAR stored in the buffer VAPARBUF. Namely, the exciter return signal EX IN is captured. Then, based on the filter parameter FLTPAR corresponding to the operation sampling frequency SAMPFREQ, filter computation of the exciter filter FIL10 is performed. Further, computation of the nonlinear converter 1 is performed by the nonlinear conversion characteristics corresponding to the operation sampling frequency SAMPFREQ. If required, computation of the nonlinear converter 2 is performed. Also, computation of portions peripheral to these converters is performed. Then, the exciter output signal EX OUT is generated and outputted. In step SS122, computation processing associated with the tube/string model shown in FIG. 24 is performed based on the operation sampling frequency SAMPFREQ and the parameter VATONEPAR stored in the buffer VAPARBUF. Namely, the exciter output signal EX OUT is captured, and computation of the junction section is performed based on the junction parameter JUNCTPAR corresponding to the operation sampling frequency SAMPFREQ. Further, computation of the delay loop section is performed. Based on the filter parameter FLTPAR corresponding to the operation sampling frequency SAMPFREQ, computations of the terminal filters FILTER-R and FILTER-L are also performed. Then, the generated exciter return signal EX IN and the output sample signal OUT are outputted.

In step SS123, computation of the timbre effector as shown in FIG. 25 is performed based on the operation sampling frequency SAMPFREQ and the parameter VATONEPAR stored in the buffer VAPARBUF. Namely, the output sample signal OUT is taken out, and computations of the envelope controller EL, the resonator model section RE, and the effector EF are performed, respectively. Then, the generated final output is outputted as the tone waveform data TONEOUT. This tone waveform data TONEOUT is written into the waveform output buffer WAVEBUF in response to the sampling frequency FS as described above.

Figure 37:
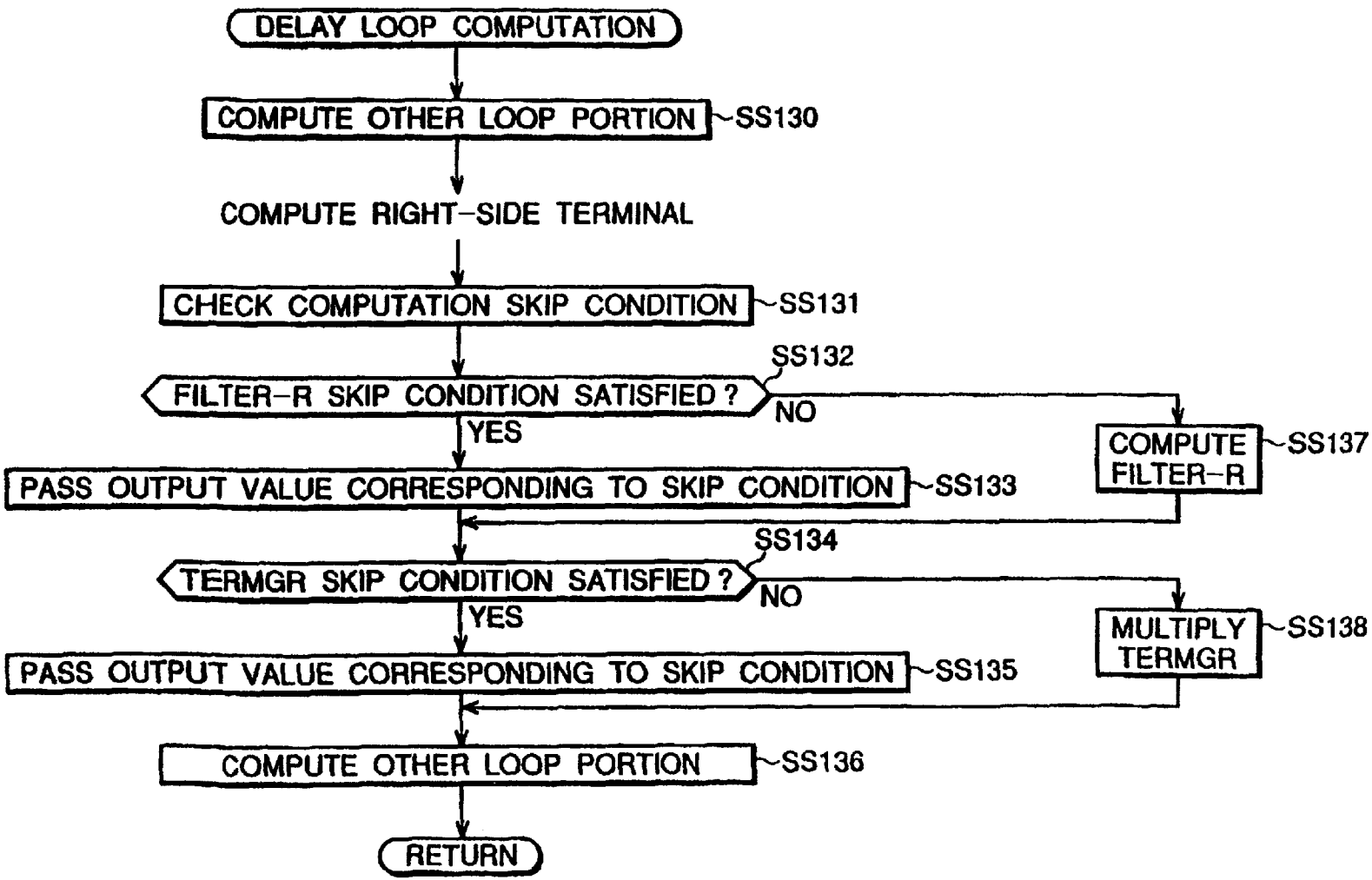
FIG. 37 is a flowchart of delay loop section computation processing in the physical model sound source computation processing.

FIG. 37 is a flowchart of the delay loop computation processing performed in step SS122 of the physical model section computation processing. This flowchart shows in detail only the computation processing associated with the terminal filter FILTER-R and the multiplier MU8. The computation processing of the FILTER-L and the multiplier MU3 is performed in the same manner. When the delay loop computation processing is started, computation of the loop up to the right-side end immediately before the terminal filter FILTER-R is performed in step SS130. Then, the computation skip condition is checked in step SS131. This check is performed to skip the computation of the section of which loop gain is substantially zero, thereby saving the total computation amount. Specifically, there are three computation skip conditions. The first computation skip condition is that the output of the terminal filter FILTER-R is 0. This condition may also be that the value 0 is continuously outputted from the terminal filter FILTER-R for a predetermined time. Further, the input of the terminal filter FILTER-R and the contents of the internal delay register may be checked. This condition may also be satisfied when the final output TONEOUT is sufficiently attenuated. The second computation skip condition is that the input signal of the terminal filter FILTER-R is not substantially changed. In this case, the computation is skipped and the output value from the immediately preceding terminal filter FILTER-R is assumed to be the current output value. Further, the immediately preceding output value may be the current output value also in the multiplier MU8. The third computation skip condition is that the multiplication coefficient TERMGR of the multiplier MU8 is zero or nearly zero. In this case, the computation is skipped and the right-side output is made zero.

When any of the above-mentioned computation skip conditions that is associated with the terminal filter FILTER-R has been satisfied, the decision is made YES in step SS132. Then, in step SS133, processing for passing the output value corresponding to the satisfied condition is performed. If the computation skip condition associated with the terminal filter FILTER-R is found not satisfied, the computation associated with the terminal filter FILTER-R is performed in step SS137. When the processing in step SS133 or SS137 has been completed, it is determined in step SS134 whether the computation skip condition associated with the multiplication coefficient TERMGR is satisfied. If this condition is found satisfied, the decision is YES. Then, in step SS135, the processing for passing the output value corresponding to the satisfied condition is performed. If the condition is found not satisfied, computation for multiplying the multiplication coefficient TERMGR in the multiplier MU8 is performed in step SS138. When the processing of step SS135 or SS138 has been completed, computation processing of the remaining delay loop portions is performed in step SS136, upon which control is returned.

Computation may be skipped not only with the delay loop but also with the exciter or the timbre effector. For the exciter, whether the computation is to be skipped or not is determined by checking the signal amplitude of the signal path and the associated parameters if the values of the amplitude and the parameters are nearly zero. For the timbre effector, when the output of the envelope controller EL, the resonator model section RE, or the effector EF has been sufficiently attenuated to nearly zero, the computation for each block of which output is nearly zero may be skipped to make the output value zero. In the second embodiment described so far, control of changing the sampling frequency FS may cause an aliening noise depending on the nonlinear conversion characteristics in the nonlinear section. This problem may be overcome by performing over-sampling on the input side of the nonlinear conversion and by band-limiting the obtained nonlinear conversion output by a filter to return the sampling frequency to the original sampling frequency.

If a new key-on occurs during the current key-on state in the physical model sound source shown in FIG. 24, processing for sounding the music tone corresponding to the new key-on is performed. If the sounding is made by inheriting the music tone corresponding to the preceding key-on, the signals that circulate inside the physical model, for example, the signals inside the delay sections such as the tube/string model section may be basically handled without change. New exciter signals may only be generated according to the new key-on. If a highly independent music tone is set up without making such inheritance, or a music tone having a timbre different from that of the immediately preceding key-on is to be sounded in response to the new key-on, the delay circuit in the physical model sound source must be initialized or reset according to the new key-on. In this case, if the number of sound channels in the physical model sound source is one, the delay area in the RAM 3 constituting all delay circuits on the physical model sound source are cleared and initialized to generate the music tone corresponding to the new key-on. If the number of sound channels in the physical model sound source is plural, the delay area in the RAM 3 constituting the delay circuit for the sound channel attenuated most is cleared to mute the music tone of that sound channel. Then, using the initialized delay area, the music tone corresponding to the new key-on is generated.

Figure 41:
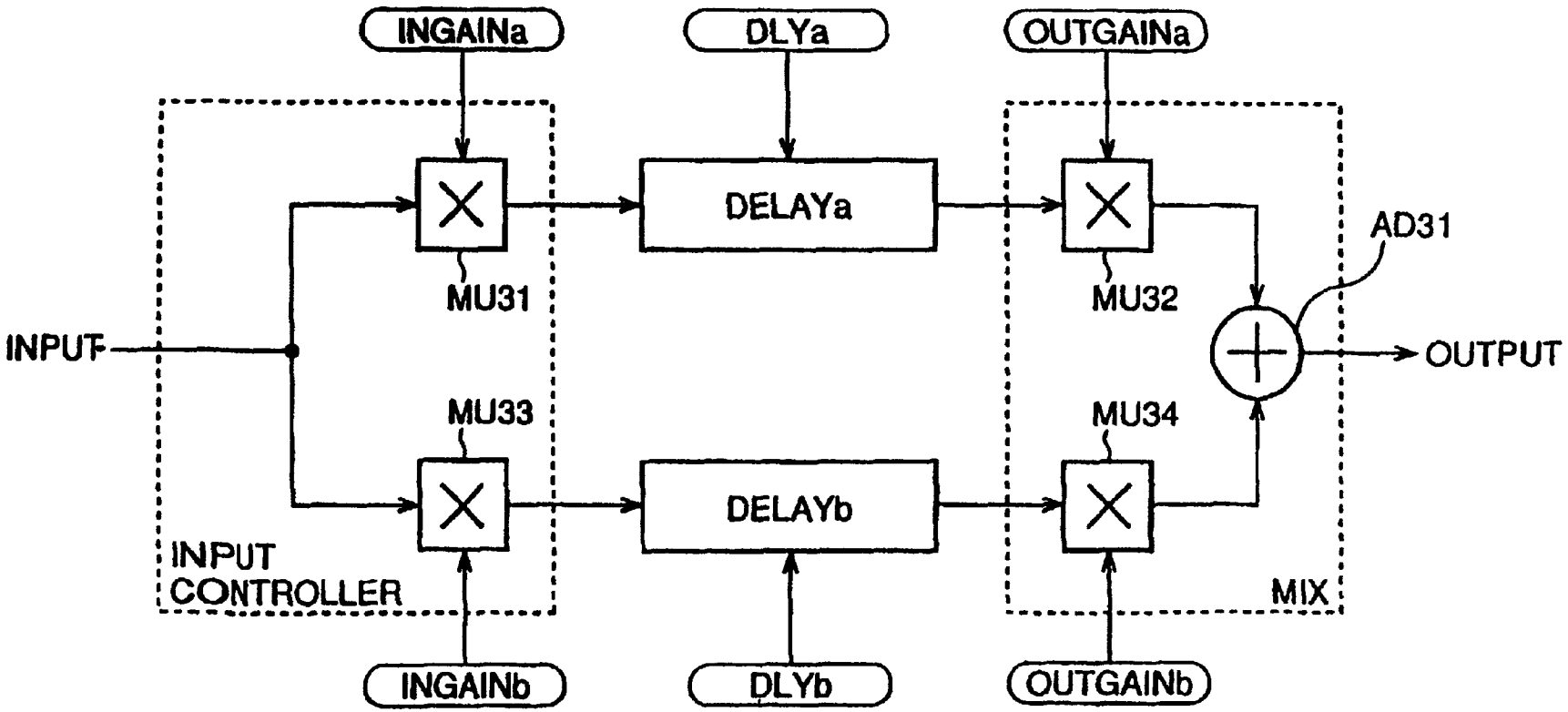
FIG. 41 is a diagram illustrating a hardware constitution of a delay circuit in the physical model sound source associated with the present invention.

Clearing the delay area in the RAM 3 is realized by writing data "0" to that area, so that the music tone generation is unnaturally delayed by the time of clearing. FIG. 41 shows a hardware constitution of a delay circuit that can eliminate the wait time for clearing the delay area. As shown in FIG. 41, the delay circuit is made up of two systems of delay means. The delay means of the first delay system is composed of a multiplying means MU31, a delay means DELAYa, and a multiplying means MU32 interconnected in series. The delay means of the second delay system is composed of a multiplying means MU33, a delay means DELAYb, and a multiplying means MU34 interconnected in series. Input data INPUT is inputted in both the first and second delay systems. The outputs of both of the delay systems are added by an adding means AD31,and outputted as delay output data OUTPUT. The multiplying means MU31 is provided with a multiplication coefficient INGAINa, the multiplying means MU33 is provided with a multiplication coefficient INGAINb, the multiplying means MU32 is provided with a multiplication coefficient OUTGAINa, and the multiplying means MU34 is provided with a multiplication coefficient OUTGAINb. As shown in FIG. 41, an input controller is composed of the multiplying means MU31 and MU32. A mixer (MIX) is composed of the multiplying means MU32 and MU34 and the adding means AD31. In FIG. 41, the delay circuit is represented in hardware approach. Actually, the delay circuit is implemented by software, namely a delay processing program that uses the delay area in the RAM 3.

Figure 42A:
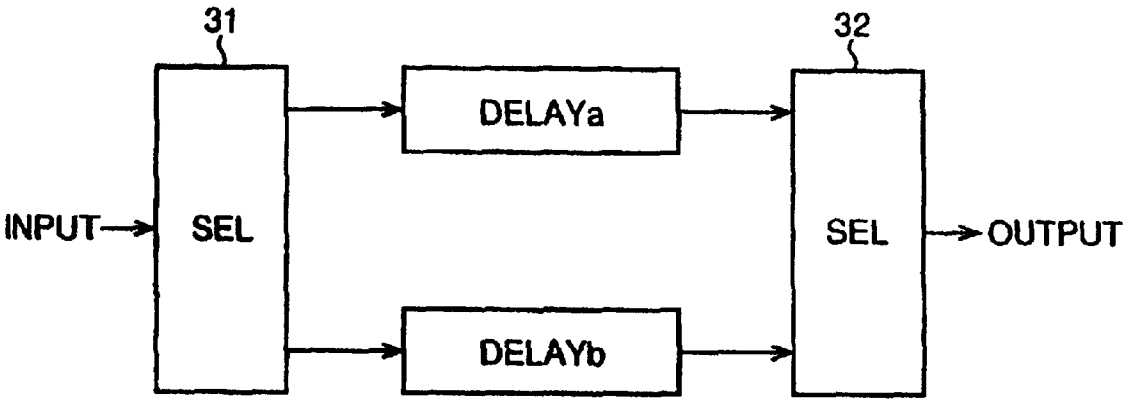
FIGS. 42A and 42B are a diagram for explaining an operation mode of the delay circuit shown in FIG. 41.
Figure 42B:
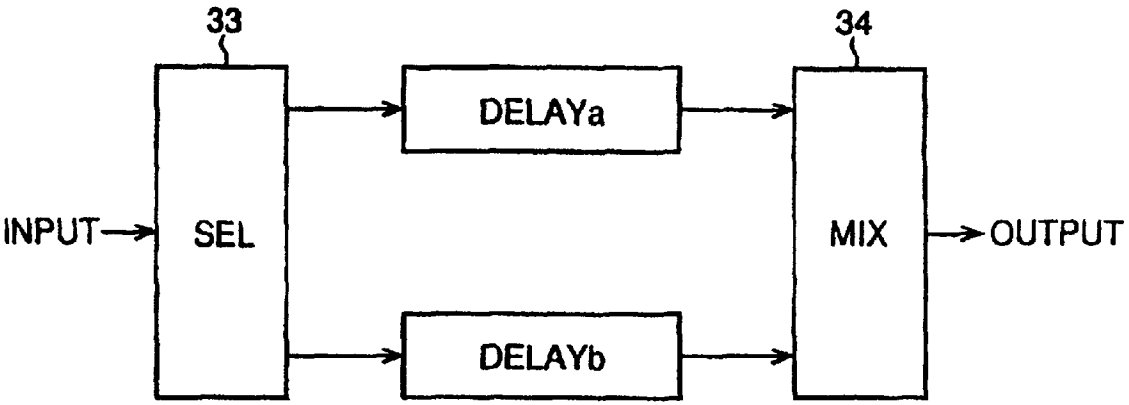

The following explains the operation of the delay circuit shown in FIG. 41 with reference to FIGS. 42A and 42B. FIG. 42A shows an equivalent circuit for controlling the selection between the first and second delay systems in a selective manner. The input data INPUT is led by a selector (SEL) 31 to the delay means DELAYa or the delay means DELAYb. Namely, the above-mentioned input controller constitutes the selector 31. The capability of the selector 31 is implemented by setting one of the multiplication coefficient INGAINa given to the multiplying means MU31 and the multiplication coefficient INGAINb given to the multiplying means MU33 to "0" and by setting the other multiplication coefficient to "1". The delay output data OUTPUT is outputted from one of the delay means DELAYa and the delay means DELAYb. Namely, the above-mentioned mixer constitutes a selector 32. The capability of the selector 32 is implemented by setting one of the multiplication coefficient OUTGAINa given to the multiplying means MU32 and the multiplication coefficient OUTGAINb given to the multiplying means MU34 to "0" and by setting the other multiplication coefficient to "1". The multiplication coefficient INGAINa and the multiplication coefficient OUTGAINa are controlled to be equal to each other. The multiplication coefficient INGAINb and the multiplication coefficient OUTGAINb are controlled to be equal to each other. Delay amounts DLYa and DLYb according to the pitches of assigned music tones are set to the delay means DELAYa and the delay means DELAYb, respectively.

The following describes in detail the operation of the delay circuits shown in FIG. 42A. A multiplication coefficient INPUTa and a multiplication coefficient OUTPUTa are set to "1". A multiplication coefficient INPUTb and a multiplication coefficient OUTPUTb are set to "0". In this case, the input data INPUT is led by the selector 31 to the delay means DELAYa and is delayed by a time corresponding to a delay amount DLYa set by the delay means DELAYa. The delay input data is outputted via the selector 32 as output data OUTPUT delayed by the predetermined time. If the multiplication coefficient INPUTa and the multiplication coefficient OUTPUTa are set to "0" and the multiplication coefficient INPUTb and the multiplication coefficient OUTPUTb are set to "1", the input data INPUT is led by the selector 31 to the delay means DELAYb and is delayed by a time corresponding to a delay amount DLYb set by the delay means DELAYb. The delayed input data is s outputted via the selector 32 as output data OUTPUT delayed by the predetermined time.

The first delay system and the second delay system can be switched to each other n a toggle manner. Therefore, if the first delay system is in use for example when a new key-on occurs, the multiplication coefficient between the multiplication coefficient INPUTa and the multiplication coefficient OUTPUTa in the first delay system is changed from "1" to "0". At the same time, the multiplication coefficient between the multiplication coefficient INPUTb and the multiplication coefficient OUTPUTb in the second delay system is changed from "0" to "1". These changing operations allow the use of the delay means DELAYb in the second delay system. Thus, it is ready to generate the music tone corresponding to the new key-on. Because the multiplication coefficient in the first delay system is changed to "0", data "0" is written to the delay means DELAYa of the first delay system in one period of music tone, thereby clearing this delay means.

The delay circuit shown in FIG. 42A is represented in hardware approach. When the above-mentioned delay control is performed by software, the selectors 31 and 32 need not be provided on the input side and the output side. The operations equivalent to these selectors can be performed by allocating a free delay area in the RAM 3 every time key-on occurs. When new key-on occurs, the delay means of the delay system to which multiplication coefficient "0" is set shifts by the delay length used so far by the write pointer (or by the memory area allocated to the delay concerned) and is written with data "0" to be cleared. The memory area may be kept in the wait state until the same is allocated with key-on to be generated next. Preferably, a flag is set on this memory area indicating that this area is free. Further, when new key-on occurs, the delay system released by truncate processing may be cleared when the load of the CPU is not heavy.

The delay circuit shown in FIG. 42B is obtained by replacing the selector 32 of the delay circuit shown in FIG. 42A by a mixer (MIX) 34. The delay circuit of FIG. 42B can perform the same delay control as that of the delay circuit shown in FIG. 42A. In the delay circuit shown in FIG. 42B, the delay systems can be switched by the selector 33 and, at the same time, cross-fade control can be performed in which the multiplication coefficients OUTGAINa and OUTGAINb set, respectively, to the multipliers MU32 and MU34 constituting the mixer 34 are gradually switched from "1" to "0" or from "0" to "1". Within one music tone period, gradual shift can be made from one music tone to another.

In the delay circuit shown in FIG. 41, the first delay system and the second delay system are always operated in parallel with the multiplication coefficients INGAINa and INGAINb both set to "1" and, every time key-on occurs, a delay amount DLY is set to the delay system other than the delay system assigned to the preceding key-on to provide the pitch corresponding to the new key-on. For example, if the first delay system is assigned to the last key-on, a delay amount DLYb corresponding to the pressing key pitch is set to the delay means DELAYb of the second delay system. At the same time, the multiplication coefficient OUTGAINa of the first delay system is gradually changed from "1" to "0" and the multiplication coefficient OUTGAINb is gradually changed from "0" to "1". When the first delay system and the second delay system are thus cross-fade controlled, the delay amount of the output data OUTPUT outputted from the adding means AD31 substantially changes from the delay amount DLYa to the delay amount DLYb smoothly. Namely, portamento can be achieved. Further, a music tone of which pitch changes at any pitch curve may be obtained by performing cross-fade control on the first delay system and the second delay system alternately and repeatedly, and by changing arbitrarily, every time cross-fade control is performed, the delay amount DLY set to the delay means of the delay system of which multiplication coefficient gradually changes to "1". Moreover, the first delay system and the second delay system are used as delay circuits corresponding to different sampling frequencies, and the delay amounts of these delay circuits are made equal to each other. Besides, while a sum of the multiplication coefficient INGAINa and the multiplication coefficient INGAINb becomes "1" and a sum of the multiplication coefficient OUTGAINa and the multiplication coefficient OUTGAINb becomes "1", each multiplication coefficient is controlled appropriately. This mixes timbres based on different sampling frequencies, thereby generating a music tone having a new timbre. If the signal amplitude of a branch path in the physical model sound source becomes small, shift from the preceding key-on to the current key-on may shift to the delay system having the lower sampling frequency. When the shift has been completed, the delay system of which assignment has been cleared can be assigned to the other delay circuit.

Figure 43:
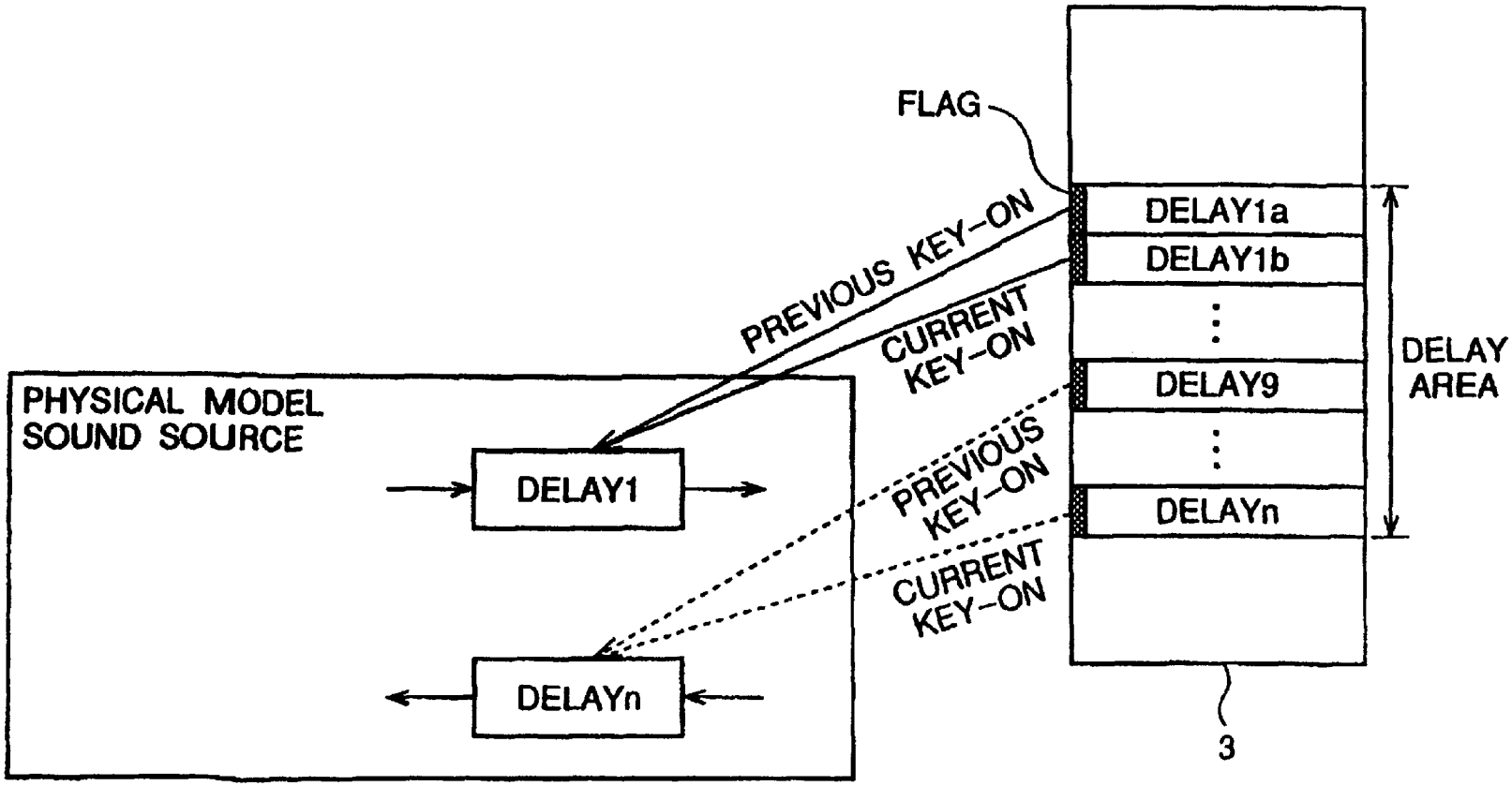
FIG. 43 is a diagram for explaining allocation of a delay memory area in a delay circuit included in the physical model sound source associated with the present invention.

The above-mentioned delay circuits are implemented by software by using the delay area set in the RAM 3. This is schematically illustrated in FIG. 43. As shown in the figure, a predetermined area in the RAM 3 is assigned to the delay area. This delay area is divided into a plurality of delay areas to provide unit delay areas (DELAY1a, DELAY1b, . . . , DELAYA9, . . . , DELAYn) for constituting the delay means. These unit delay areas are allocated to the delay means (DELAY1, . . . , DELAYn). A flag area may be provided for each of these unit delay areas. A free flag may be set to this flag area, indicating that the unit delay area is not used as a delay means and hence free.

The following explains the allocation of the delay area for implementing the delay circuit shown in FIG. 41 with reference to FIG. 43. It should be noted that the physical model sound source has first delay circuit through the n-th delay circuit. By the preceding key-on, the unit delay area DELAYa has been allocated to the delay means of the first delay system of the first delay circuit DELAY1 for example, and the delay amount of the unit delay area DELAY1a is set to delay amount DLYi according to the pitch associated with the preceding key-on. Further, by the preceding key-on, the unit delay area DELAY9 has been allocated to the delay means of the first delay system of the n-th delay circuit DELAYn for example, and the delay amount of the unit delay area DELAY9 is set to delay amount DLYi according to the pitch associated with the preceding key-on.

Next, when the current key-on occurs, the unit delay area DELAY1b is allocated to the delay means of the second delay system of the first delay circuit DELAY1 for example, and the delay amount of the unit delay area DELAY1a is set to delay amount DLYk according to the pitch of the current key-on. By the current key-on, the unit delay area DELAYn is allocated to the delay means DELAYn of the second delay system of the nth delay circuit for example, and the delay amount of the unit delay area DELAYn is set to delay amount DLYk according to the pitch associated with the current key-on. This can perform the operation of the delay circuit shown in FIG. 41.

Figure 44:
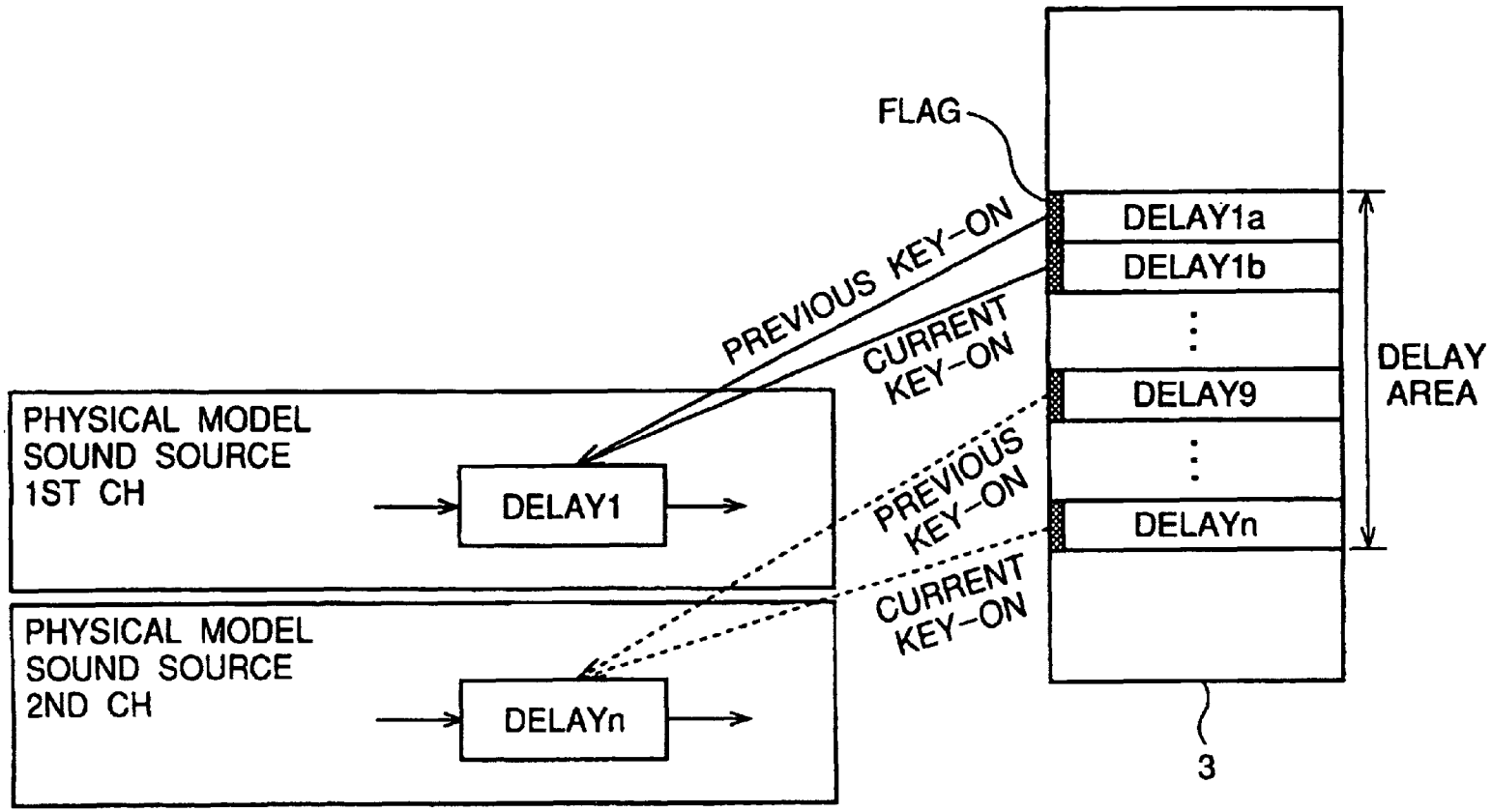
FIG. 44 is a diagram for explaining allocation of a delay circuit in a physical model sound source having a plurality of sound channels.

The constitution shown in FIG. 43 indicates that the physical model sound source has a single sound channel. FIG. 44 shows the allocation of the delay area for implementing the delay circuit when the physical model sound source has a plurality of sound channels. The following explains the operation of this constitution. When the unit delay area DELAY1a has been allocated to the delay means of the first delay system in the delay circuit DELAY1 of the first channel for example by the preceding key-on, the delay amount of the unit delay area DELAY1a is set to delay amount DLYp according to the pitch of the preceding key-on allocated to the first sound channel. Then, when the current key-on occurs and the unit delay area DELAY1b is allocated to the delay means of the second delay system in the delay circuit DELAY1 of the first sound channel for example, the delay amount of the unit delay area DELAY1a is set to delay amount DLYq according to the pitch associated with the current key-on allocated to the first sound channel. If the unit delay area DELAY9 has been allocated to the delay means of the first delay system in the delay circuit DELAYn of the second sound channel for example by the preceding key-on, the delay amount of the unit delay area DELAY9 is set to the delay amount DLYp according to the pitch associated with the preceding key-on. Then, if the unit delay area DELAYn is allocated to the delay means DELAYn of the second delay system of the second sound channel for example by the current key-on, the delay amount of the unit delay area DELAYn is set to the delay amount DLYq according to the pitch associated with the current key-on. This arrangement allows execution of the operation of the delay circuit shown in FIG. 41 if the physical model sound source has a plurality of sound channels. In the constitutions of FIGS. 43 and 44, the unit delay area to be allocated to each delay circuit may be previously determined in a fixed manner. Alternatively, the allocation may be performed dynamically by checking, every time key-on occurs, the free flag set to the unit delay area.

As described above, the inventive tone generating method uses a hardware processor having a software module used to compute samples of a waveform for generating a musical tone. The inventive method comprises the steps of periodically providing a trigger signal at a relatively slow rate to define a frame period between successive trigger signals, periodically providing a sampling signal at a relatively fast rate such that a plurality of sampling signals occur within one frame period, operating the hardware processor resettable in response to a trigger signal and operable in response to each sampling signal to periodically execute the software module for successively computing a number of samples of the waveform within one frame, and converting each of the samples into a corresponding analog signal in response to each sampling signal to thereby generate the musical tones. The step of operating includes delaying step using a pair of memory regions for imparting a delay to the waveform to determine a pitch of the musical tone according to the performance information. The delay step successively writes the samples of the waveform of one musical tone into addresses of one of the memory regions, and successively reads the samples from addresses of the same memory region to thereby create the delay. The delay step responds when the hardware processor is reset so that said one musical tone is switched to another musical tone for successively writing the samples of the waveform of said another musical tone into addresses of the other memory region and successively reading the samples from addresses of the same memory region to thereby create the delay while clearing the one memory region to prepare for a further musical tone.

Described so far is the software sound source that practices the second preferred embodiment of the invention on a personal computer. In the computer system, this sound source software can be handled as either application software or device drive software, for example. The way by which the sound source software is to be handled may be appropriately determined according to the system configuration or the operation system OS used.

The sound source software or the capabilities thereof may be incorporated in another software program such as amusement software, karaoke software, or automatic play and accompaniment software. Also this software may be directly incorporated in the operation system OS. The software according to the present invention can be supplied in a machine-readable disk media such as a floppy disk, a magneto-optical disk, and a CD-ROM or a memory card. Further, the software may be added by means of a semiconductor memory chip (typically ROM) which is inserted in a computer unit. Alternatively, the sound source software associated with the present invention may be distributed through the network I/F 11.

The above description has been made by using the application on a personal computer for example. Application to amusement equipment such as game and karaoke, electronic equipment, and general-purpose electrical equipment is also practical. In addition, application to a sound source board and a sound source unit is practical. Moreover, application to a sound source machine based on software processing using dedicated MPU (DS) is practical. In this case, if the processing capacity of the MPU is high, the sampling frequency can be raised, thereby multiplying the sampling frequency by n when high-precision waveform output is required. Further, when a plurality of sound channels are used on the sound source, variable control on the sampling frequency and skip control on the computation portion that can be skipped in the computation algorithm may be performed according to the number of channels being sounded. In this case, different sampling frequencies may be set to different performance parts or MIDI channels. Still further, in the above-mentioned embodiment, the sampling frequency of the CODEC is fixed. It will be apparent that this sampling frequency is variable. The sampling frequency is made variable by inserting the processing circuit for matching the sampling frequencies between the waveform output buffer WAVEBUF and the CODEC (DAC) by typically oversampling, downsampling, or data interpolation.

The present invention is applicable to a software sound source in which the CPU operates in synchronization with the sampling frequency to periodically execute the software module for successively computing waveform samples. For example, the CPU conducts an interrupt for computing one sample at a period of $1/(n \times f_s)$ where n denotes a number of tones and $f_s$ denotes a sampling frequency. Further, the invention is applicable to a hardware sound source using an LSI chip in order to reduce load of ALU and in order to use resources of LSI chip for other tasks than tone generation.

As described and according to the present invention, music tone waveform generating blocks indicated by a preset algorithm are assigned to selected sound channels, the assigned music tone waveform generating blocks are combined by the algorithm, and music tone waveform generating computation is performed to generate music tone waveform data. Consequently, the number of music waveform generating blocks for the sound channels may be arbitrarily changed before sounding assignment is made. This novel constitution allows, according to the capacity of a music waveform data generating means, flexible adjustment of the load state of the music waveform data generating means and the quality of the music waveform data to be generated.

The music tone waveform generating blocks indicated by an algorithm set according to the timbre of the music tone are assigned to the selected sound channels. The assigned music tone waveform generating blocks are combined by the algorithm to perform music tone waveform generating computation so as to generate the music tone waveform data.

Preferably, in setting timbres by a timbre setting means, if the number of music tone waveform generating blocks is set to a performance part concerned by a means for setting number of blocks, the timbre set to that performance part is changed to a timbre defined by music tone waveform generating blocks within that number of blocks. This novel constitution further enhances the above-mentioned effect.

Preferably, during the music tone waveform generating computation in the sound channel, the number of music tone waveform generating blocks assigned to that sound channel is changed according to a predetermined condition. Consequently, during sounding, the load state of the music tone waveform data generating means and the quality of the music waveform data to be generated may be changed flexibly according to the capacity of that music tone waveform generating means.

Further, according to the present invention, in a computer equipment which often executes a plurality of tasks such as word processing and network communication in addition to music performance, occurrence of troubles such as an interrupted music tone can be reduced when the CPU power is allocated to the tasks not associated with music performance during processing of the software sound source. In other words, more tasks can be undertaken during the execution of sound source processing.

Since the present invention is constituted as described above, when the CPU load is high, the sampling frequency can be lowered, thereby generating tone waveform data that prevents the interruption of a music tone. When the CPU load is low, a higher sampling frequency than the normal sampling frequency can be used, thereby generating high-precision tone waveform data. In this case, the number of sound channels may be changed instead of changing the sampling frequency.

If a particular condition is satisfied, corresponding computational operations are skipped, so that efficient computation can be performed, thereby preventing the CPU load from getting extremely high. Consequently, the tone waveform data can be generated that prevents the sounding of a music tone from being interrupted. Further, the efficient computation allows the use of the higher sampling frequency than the conventional sampling frequency, resulting in high-precision tone waveform data.

While the preferred embodiments of the present invention have been described using specific terms, such description is for illustrative purposes only, and it is to be understood that changes and variations may be made without departing from the spirit or scope of the appended claims.

What is claimed is:

1. A sound source apparatus having operation blocks composed of softwares used to compute waveforms for generating a plurality of musical tones through a plurality of channels according to performance information, the apparatus comprising:

a setting device for setting an algorithm which determines a system composed of selective ones of the operation blocks systematically combined with each other to compute a waveform specific to one of the musical tones;

a designating device responsive to the performance information for designating one of the channels to be used for generating said one musical tone; and a generating device for allocating the selective operation blocks to said one channel and for systematically executing the allocated selective operating blocks according to the algorithm so as to compute the waveform to thereby generate said one musical tone through said one channel.

2. A sound source apparatus according to claim 1, wherein the setting device sets different algorithms which determine different systems corresponding to different timbres of the musical tones, each of the different systems being composed of selective ones of the operation blocks which are selectively and sequentially combined with each other to compute a waveform which is specific to a corresponding one of the different timbres.

3. A sound source apparatus according to claim 2, wherein the setting device comprises a determining device that determines a first system combining a great number of operation blocks and corresponding to a regular timbre and that determines a second system combining a small number of operation blocks and corresponding to a substitute timbre, and a changing device operative when a number of operation blocks executable in the channel is limited under said great number and over said small number due to a load of the computation of the waveform for changing the musical tone from the regular timbre to the substitute timbre so that the second system is adopted for the channel in place of the first system.

4. A sound source apparatus according to claim 1, wherein the setting device comprises an adjusting device operative dependently on a condition during the course of generating the musical tone for adjusting a number of the operation blocks to be allocated to the channel.

5. A sound source apparatus according to claim 4, wherein the adjusting device comprises a modifying device that modifies the algorithm to eliminate a predetermined one or more of the operation blocks involved in the system so as to reduce a number of the operation blocks to be loaded into the channel for adjustment to the condition.

6. A sound source apparatus according to claim 4, wherein the adjusting device operates when the condition indicates that an amplitude envelope of the waveform attenuates below a predetermined threshold level for compacting the system so as to reduce the number of the operation blocks.

7. A sound source apparatus according to claim 4, wherein the adjusting device operates when the condition indicates that an output volume of the musical tone is tuned below a predetermined threshold level for compacting the system so as to reduce the number of the operation blocks.

8. A sound source apparatus according to claim 4, wherein the adjusting device operates when the condition indicates that at least one of the operation blocks declines to become inactive in the system without substantially affecting other operation blocks of the system for eliminating said at least one operation block so as to reduce the number of the operation blocks to be allocated to the channel.

9. A sound source apparatus according to claim 1, wherein the generating device comprises a computing device responsive to a variable sampling frequency for executing the operation blocks to successively compute samples of the waveform in synchronization to the variable sampling frequency so as to generate the musical tone, and a controlling device that sets the variable sampling frequency according to process of computation of the waveform by the operation blocks.

10. A sound source apparatus according to claim 1, wherein the generating device comprises a computing device responsive to a variable sampling frequency for executing the operation blocks to successively compute samples of the waveform in synchronization to the variable sampling frequency so as to generate the musical tone, and a controlling device for adjusting the variable sampling frequency dependently on a load of computation of the waveform during the course of generating the musical tone.

11. A sound source apparatus according to claim 1, wherein the generating device comprises a computing device responsive to a variable sampling frequency for executing the operation blocks to successively compute samples of the waveform in synchronization to the variable sampling frequency so as to generate the musical tone, and a controlling device for adjusting the variable sampling frequency according to result of computation of the samples during the course of generating the musical tone.

12. A sound source apparatus according to claim 1, wherein the generating device comprises a computing device responsive to a variable sampling frequency for executing the operation blocks to successively compute samples of the waveform in synchronization to the variable sampling frequency so as to generate the musical tone, and a controlling device for adjusting the variable sampling frequency dependently on a load of computation during the course of generating the musical tone.

13. A sound source apparatus having a software module used to compute samples of a waveform in response to a sampling frequency for generating a musical tone according to performance information, the apparatus comprising:

a processor device that periodically executes the software module for successively computing samples of the waveform corresponding to a variable sampling frequency so as to generate the musical tone;

a detector device for detecting a load of computation imposed on the processor device during the course of generating the musical tone; and a controller device operative according to the detected load for changing the variable sampling frequency to adjust a rate of computation of the samples.

14. A sound source apparatus according to claim 13, wherein the controller device provides a fast sampling frequency when the detected load is relatively light, and provides a slow sampling frequency when the detected load is relatively heavy such that the rate of the computation of the samples is reduced by 1/n where n denotes an integer number.

15. A sound source apparatus according to claim 14, wherein the processor device includes a delay device having a memory for imparting a delay to the waveform to determine a pitch of the musical tone according to the performance information, the delay device generating a write pointer for successively writing the samples into addresses of the memory and a read pointer for successively reading the samples from addresses of the memory to thereby create the delay corresponding to an address gap between the write pointer and the read pointer, the delay device being responsive to the fast sampling frequency to increment both of the write pointer and the read pointer by one address for one sample, otherwise the delay device being responsive to the slow sampling frequency to increment the write pointer by one address n times for one sample and to increment the read pointer by n addresses for one sample.

16. A sound source apparatus according to claim 14, wherein the processor device includes a delay device having a pair of memory regions for imparting a delay to the waveform to determine a pitch of the musical tone according to the performance information, the delay device successively writing the samples of the waveform of one musical tone into addresses of one of the memory regions and successively reading the samples from addresses of the same memory region to thereby create the delay, the delay device being operative when said one musical tone is switched to another musical tone for successively writing the samples of the waveform of said another musical tone into addresses of the other memory region and successively reading the samples from addresses of the same memory region to thereby create the delay while clearing the one memory region to prepare for a further musical tone.

17. A sound source apparatus according to claim 13, wherein the processor device executes the software module composed of a plurality sub-modules for successively computing the waveform, the processor device being operative when one of the sub-modules declines to become inactive without substantially affecting other sub-modules during computation of the waveform for skipping execution of said one sub-module.

18. A sound source apparatus according to claim 14, wherein the processor device includes a delay device having a memory for imparting a delay to the waveform to determine a pitch of the musical tone according to the performance information, the delay device generating a write pointer for successively writing the samples into addresses of the memory and a read pointer for successively reading the samples from addresses of the memory to thereby create the delay corresponding to an address gap between the write pointer and the read pointer, the delay device being responsive to the fast sampling frequency to increment both of the write pointer and the read pointer by one address for one sample, otherwise the delay device being responsive to the slow sampling frequency to increment the write pointer by one address n times for one sample.

19. A sound source apparatus according to claim 14, wherein the processor device includes a delay device for imparting a delay to the waveform to determine a pitch of the musical tone according to the performance information, the delay device successively writing the samples of the waveform of one musical tone into addresses of one memory region of the delay device and successively reading the samples from addresses of said one memory region to thereby create the delay, the delay device being operative when said one musical tone is switched to another musical tone for successively writing the samples of the waveform of said another musical tone into addresses of another memory region of the delay device and successively reading the samples from addresses of said another memory region to thereby create the delay while clearing said one memory region to prepare for a further musical tone.

20. A sound source apparatus having a software module used to compute samples of a waveform for generating a musical tone, the apparatus comprising:

a provider device for variably providing a trigger signal at a relatively slow rate to define a frame period between successive trigger signals, and for periodically providing a sampling signal at a relatively fast rate such that a plurality of sampling signals occur within one frame period;

a processor device resettable in response to each trigger signal and operable to periodically execute the software module for successively computing a number of samples of the waveform corresponding to the sampling signals within one frame;

a detector device for detecting a load of computation imposed on the processor device during the course of generating the musical tone;

a controller device operative according to the detected load for varying the frame period to adjust the number of the samples computed within one frame period, and a converter device response to each sampling signal for converting each of the samples into a corresponding analog signal to thereby generate the musical tones.

21. A sound source apparatus having submodules composed of softwares used to compute waveforms for generating a plurality of musical tones through a plurality of channels according to performance information, the apparatus comprising:

setting means for setting an algorithm which determines a module composed of selective ones of the submodules logically connected to each other to compute a waveform specific to one of the musical tones;

designating means responsive to the performance information for designating one of the channels to be used for generating said one musical tone; and generating means for loading the selective submodules into said one channel and for logically executing the allocated selective submodules according to the algorithm so as to compute the waveform to thereby generate said one musical tone through said one channel.

22. A sound source apparatus according to claim 21, wherein the setting means sets different algorithms which determine different modules corresponding to different timbres of the musical tones, each of the different modules being composed of selective ones of the submodules which are selectively and sequentially connected to each other to compute a waveform which is specific to a corresponding one of the different timbres.

23. A sound source apparatus according to claim 21, wherein the setting means comprises adjusting means operative dependently on a condition during the course of generating the musical tone for adjusting a number of the submodules to be loaded into the channel.

24. A sound source apparatus according to claim 21, wherein the adjusting means operates when the condition indicates that an amplitude envelope of the waveform attenuates below a predetermined threshold level for compacting the module so as to reduce the number of the submodules.

25. A sound source apparatus according to claim 21, wherein the adjusting means operates when the condition indicates that an output volume of the musical tone is tuned below a predetermined threshold level for compacting the module so as to reduce the number of the submodules.

26. A sound source apparatus according to claim 21, wherein the adjusting means operates when the condition indicates that one of the submodules loses contribution to computation of the waveform without substantially affecting other submodules for eliminating said one submodule so as to reduce the number of the submodules to be loaded into the channel.

27. A sound source apparatus having a software module used to compute samples of a waveform in response to a sampling frequency for generating a musical tone according to performance information, the apparatus comprising:

processor means to periodically execute the software module for successively computing samples of the waveform corresponding to a variable sampling frequency so as to generate the musical tone;

detector means for detecting a load of computation imposed on the processor means during the course of generating the musical tone; and controller means operative according to the detected load for changing the variable sampling frequency to adjust a rate of computation of the samples.

28. A sound source apparatus according to claim 27, wherein the controller means provides a fast sampling frequency when the detected load is relatively light, and provides a slow sampling frequency when the detected load is relatively heavy such that the rate of the computation of the sample is reduced by 1/n where n denotes an integer number.

29. A sound source apparatus according to claim 28, wherein the processor means includes delay means having a memory for imparting a delay to the waveform to determine a pitch of the musical tone according to the performance information, the delay means generating a write pointer for successively writing the samples into addresses of the memory and a read pointer for successively reading the samples from addresses of the memory to thereby create the delay corresponding to an address interval between the write pointer and the read pointer, the delay means being responsive to the fast sampling frequency to increment both of the write pointer and the read pointer by every one address for every one sample, otherwise the delay means being responsive to the slow sampling frequency to increment the write pointer by every one address at n times for repeatedly writing one sample into consecutive n addresses.

30. A sound source apparatus according to claim 28, wherein the processor means includes delay means having a memory for imparting a delay to the waveform to determine a pitch of the musical tone according to the performance information, the delay means generating a write pointer for successively writing the samples into addresses of the memory and a read pointer for successively reading the samples from addresses of the memory to thereby create the delay corresponding to an address interval between the write pointer and the read pointer, the delay means being responsive to the fast sampling frequency to increment both of the write pointer and the read pointer by every one address for every one sample, otherwise the delay means being responsive to the slow sampling frequency to increment the write pointer by every one address at n times for repeatedly writing one sample into consecutive n addresses and to skip the read pointer by consecutive n addresses for reading one sample.

31. A sound source apparatus having a software module used to compute samples of a waveform for generating a musical tone, the apparatus comprising:

provider means for variably providing a trigger signal at a relatively slow rate to define a frame period between successive trigger signals, and for periodically providing a sampling signal at a relatively fast rate such that a plurality of sampling signals occur within one frame period;

processor means resettable in response to each trigger signal and operable based on each sampling signal to periodically execute the software module for successively computing a number of samples of the waveform within one frame period;

detector means for detecting a load of computation imposed on the processor means during the course of generating the musical tone;

controller means operative according to the detected load for varying the frame period to adjust the number of the samples computed within one frame period, and converter means responsive to each sampling signal for converting each of the samples into a corresponding analog signal to thereby generate the musical tones.

32. A sound source apparatus having a software module used to compute samples of a waveform for generating a musical tone, the apparatus comprising:

provider means for periodically providing a trigger signal at a relatively slow rate to define a frame period between successive trigger signals, and for periodically providing a sampling signal at a relatively fast rate such that a plurality of sampling signals occur within one frame period;

processor means resettable in response to a trigger signal and operable in response to each sampling signal to periodically execute the software module for successively computing a number of samples of the waveform within one frame period; and converter means responsive to each sampling signal for converting each of the samples into a corresponding analog signal to thereby generate the musical tones, wherein the processor means includes delay means having a pair of memory regions for imparting a delay to the waveform to determine a pitch of the musical tone according to the performance information, the delay means successively writing the samples of the waveform of one musical tone into addresses of one of the memory regions and successively reading the samples from addresses of the same memory region to thereby create the delay, the delay means being operative when the processor means is reset so that said one musical tone is switched to another musical tone for successively writing the samples of the waveform of said another musical tone into addresses of the other memory region and successively reading the samples from addresses of the same memory region to thereby create the delay while clearing the one memory region to prepare for a further musical tone.

33. A method using submodules composed of softwares to compute waveforms for generating a plurality of musical tones through a plurality of channels according to performance information, the method comprising the steps of:

setting an algorithm which determines a module composed of selective ones of the submodules logically connected to each other to compute a waveform specific to one of the musical tones;

designating one of the channels to be used for generating said one musical tone in response to the performance information;

loading the selective submodules into said one channel; and logically executing the loaded selective submodules according to the algorithm so as to compute the waveform to thereby generate said one musical tone through said one channel.

34. A method according to claim 33, wherein the step of setting sets different algorithms which determine different modules corresponding to different timbres of the musical tones, each of the different modules being composed of selective ones of the submodules which are selectively and sequentially connected to each other to compute a waveform which is specific to a corresponding one of the different timbres.

35. A method according to claim 33, wherein the step of setting comprises adjusting a number of the submodules to be loaded into the channel dependently on a condition during the course of generating the musical tone.

36. A method according to claim 35, wherein the step of adjusting comprises compacting the module so as to reduce the number of the submodules when the condition indicates that an amplitude envelope of the waveform attenuates below a predetermined threshold level.

37. A method according to claim 35, wherein the step of adjusting comprises compacting the module so as to reduce the number of the submodules when the condition indicates that an output volume of the musical tone is tuned below a predetermined threshold level.

38. A method according to claim 35, wherein the step of adjusting comprises eliminating at least one submodule so as to reduce the number of the submodules to be loaded into the channel when the condition indicates that said at least one submodule loses contribution to computation of the waveform without substantially affecting other submodules.

39. A method using a hardware processor and a software module to compute samples of a waveform in response to a sampling frequency for generating a musical tone according to performance information, the method comprising the steps of:

periodically operating the hardware processor to execute the software module for successively computing samples of the waveform corresponding to a variable sampling frequency so as to generate the musical tone;

detecting a load of computation imposed on the hardware processor during the course of generating the musical tone; and changing the variable sampling frequency according to the detected load to adjust a rate of computation of the samples.

40. A method according to claim 39, wherein the step of changing provides a fast sampling frequency when the detected load is relatively light, and provides a slow sampling frequency when the detected load is relatively heavy.

41. A method using a hardware processor having a software module used to compute samples of a waveform for generating a musical tone, the method comprising the steps of:

variably providing a trigger signal at a relatively slow rate to define a frame period between successive trigger signals;

periodically providing a sampling signal at a relatively fast rate such that a plurality of sampling signals occur within one frame period;

operating the hardware processor resettable in response to each trigger signal and operable based on each sampling signal to periodically execute the software module for successively computing a number of samples of the waveform within one frame period;

detecting a load of computation imposed on the software processor during the course of generating the musical tone;

varying the frame period according to the detected load to adjust the number of the samples computed within one frame period, and converting each of the samples into a corresponding analog signal in response to each sampling signal to thereby generate the musical tones.

42. A method using a hardware processor having a software module used to compute samples of a waveform for generating a musical tone, the method comprising the steps of:

periodically providing a trigger signal at a relatively slow rate to define a frame period between successive trigger signals;

periodically providing a sampling signal at a relatively fast rate such that a plurality of sampling signals occur within one frame period;

operating the hardware processor resettable in response to a trigger signal and operable based on each sampling signal to periodically execute the software module for successively computing a number of samples of the waveform within one frame period; and converting each of the samples into a corresponding analog signal in response to each sampling signal to thereby generate the musical tones, wherein the step of operating includes delay step using a pair of memory regions for imparting a delay to the waveform to determine a pitch of the musical tone according to the performance information, the delay step successively writing the samples of the waveform of one musical tone into addresses of one of the memory regions and successively reading the samples from addresses of the same memory region to thereby create the delay, the delay step responding when the hardware processor is reset so that said one musical tone is switched to another musical tone for successively writing the samples of the waveform of said another musical tone into addresses of the other memory region and successively reading the samples from addresses of the same memory region to thereby create the delay while clearing the one memory region to prepare for a further musical tone.

43. A machine readable media for use in a processor machine including a CPU, said media containing program instructions executable by said CPU for causing the processor machine having submodules composed of softwares to compute waveforms for performing operation of generating a plurality of musical tones through a plurality of channels according to performance information, wherein the operation comprises the steps of:

setting an algorithm which determines a module composed of selective ones of the submodules logically connected to each other to compute a waveform specific to one of the musical tones;

designating one of the channels to be used for generating said one musical tone in response to the performance information;

loading the selective submodules into said one channel; and logically executing the loaded selective submodules according to the algorithm so as to compute the waveform to thereby generate said one musical tone through said one channel.

44. A machine readable media according to claim 43, wherein the step of setting sets different algorithms which determine different modules corresponding to different timbres of the musical tones, each of the different modules being composed of selective ones of the submodules which are selectively and sequentially connected to each other to compute a waveform which is specific to a corresponding one of the different timbres.

45. A machine readable media according to claim 43, wherein the step of setting comprises adjusting a number of the submodules to be loaded into the channel dependently on a condition during the course of generating the musical tone.

46. A machine readable media according to claim 45, wherein the step of adjusting comprises compacting the module so as to reduce the number of the submodules when the condition indicates that an amplitude envelope of the waveform attenuates below a predetermined threshold level.

47. A machine readable media according to claim 45, wherein the step of adjusting comprises compacting the module so as to reduce the number of the submodules when the condition indicates that an output volume of the musical tone is tuned below a predetermined threshold level.

48. A machine readable media according to claim 45, wherein the step of adjusting comprises eliminating at least one submodule so as to reduce the number of the submodules to be loaded into the channel when the condition indicates that said at least one submodule loses contribution to computation of the waveform without substantially affecting other submodules.

49. A machine readable media for use in a processor machine including a CPU, said media containing program instructions executable by said CPU for causing the processor machine having a software module to compute samples of a waveform in response to a sampling frequency for performing operation of generating a musical tone according to performance information, wherein the operation comprises the steps of:

periodically operating the processor machine to execute the software module for successively computing samples of the waveform corresponding to a variable sampling frequency so as to generate the musical tone;

detecting a load of computation imposed on the processor machine during the course of generating the musical tone; and changing the variable sampling frequency according to the detected load to adjust a rate of computation of the samples.

50. A machine readable media according to claim 49, wherein the step of changing provides a fast sampling frequency when the detected load is relatively light, and provides a slow sampling frequency when the detected load is relatively heavy.

51. A machine readable media for use in a processor machine including a CPU, said media containing program instructions executable by said CPU for causing the processor machine having a software module used to compute samples of a waveform for performing operation of generating a musical tone, wherein the operation comprises the steps of:

variably providing a trigger signal at a relatively slow rate to define a frame period between successive trigger signals;

periodically providing a sampling signal at a relatively fast rate such that a plurality of sampling signals occur within one frame period;

operating the processor machine resettable in response to each trigger signal and operable based on each sampling signal to periodically execute the software module for successively computing a number of samples of the waveform within one frame period;

detecting a load of computation imposed on the processor machine during the course of generating the musical tone;

varying the frame period according to the detected load to adjust the number of the samples computed within one frame period, and converting each of the samples into a corresponding analog signal in response to each sampling signal to thereby generate the musical tones.

52. A machine readable media for use in a processor machine including a CPU, said media containing program instructions executable by said CPU for causing the processor machine having a software module used to compute samples of a waveform for performing operation of generating a musical tone, wherein the operation comprises the steps of:

periodically providing a trigger signal at a relatively slow rate to define a frame period between successive trigger signals;

periodically providing a sampling signal at a relatively fast rate such that a plurality of sampling signals occur within one frame period;

operating the processor machine resettable in response to a trigger signal and operable based on each sampling signal to periodically execute the software module for successively computing a number of samples of the waveform within one frame; and converting each of the samples into a corresponding analog signal in response to each sampling signal to thereby generate the musical tones, wherein the step of operating includes delaying step using a pair of memory regions for imparting a delay to the waveform to determine a pitch of the musical tone according to the performance information, the delay step successively writing the samples of the waveform of one musical tone into addresses of one of the memory regions and successively reading the samples from addresses of the same memory region to thereby create the delay, the delay step responding when the processor machine is reset so that said one musical tone is switched to another musical tone for successively writing the samples of the waveform of said another musical tone into addresses of the other memory region and successively reading the samples from addresses of the same memory region to thereby create the delay while clearing the one memory region to prepare for a further musical tone.

*53. A system for synthesizing a musical tone according to control information at a given sampling frequency, comprising:*

*a processor that executes a process of managing the system;*

*a memory that memorizes a plurality of parameters corresponding to a plurality of sampling frequencies for use in synthesizing the musical tone;*

*a detector that detects a load imposed on the processor when the processor executes the process; and*

*a sound source module that generates a waveform of the musical tone based on the control information at one of the plurality of sampling frequencies selected according to the detected load imposed on the processor, the sound source module reading one of the plurality of parameters corresponding to said selected one of the plurality of sampling frequencies from the memory for use in generating the waveform.*

*54. The system according to claim 53, wherein the processor executes another process of providing the control information to the sound source module at a variable period, the system further comprising a controller that controls the variable period at which the processor provides the control information, according to the detected load of the processor.*

*55. The system according to claim 54, wherein the processor manages the system and provides the control information by executing a program.*

*56. The system according to claim 54, wherein the controller expands the variable period as the detected load of the processor increases.*

*57. A system for synthesizing a musical tone according to control information, comprising:*

*a processor that executes a process of generating the musical tone based on the control information at a given sampling frequency;*

*a detector that detects a load imposed on the processor when the processor executes the process; and*

*a memory that memorizes a plurality of parameters corresponding to a plurality of sampling frequencies for use in generating of the musical tone,*

*wherein the processor generates a waveform of the musical tone based on the control information at one of the plurality of sampling frequencies selected according to the detected load imposed on the processor, the processor reading one of the plurality of parameters corresponding to said selected one of the plurality of sampling frequencies from the memory for use in generating the waveform.*

*58. The system according to claim 57, wherein the processor executes another process of providing the control information at a variable period, the system further comprising a controller that controls the variable period at which the processor provides control information, according to the detected load of the processor.*

*59. The system according to claim 57, wherein the processor further executes a process of managing the system.*

*60. The system according to claim 59, wherein the processor executes the processes according to a program.*

*61. The system according to claim 58, wherein the controller expands the variable period as the detected load of the processor increases.*

*62. A method of synthesizing a musical tone according to control information at a given sampling frequency by a processor and a sound source module, said method comprising:*

*operating the processor to execute a process of managing the system;*

*memorizing a plurality of parameters corresponding to a plurality of sampling frequencies for use in synthesizing the musical tone;*

*detecting a load imposed on the processor when the processor executes the process; and*

*operating the sound source module to generate a waveform of the musical tone based on the control information at one of the plurality of sampling frequencies selected according to the detected load imposed on the processor, the sound source module reading one of the plurality of parameters corresponding to said selected one of the plurality of sampling frequencies for use in generating the waveform.*

*63. A method of synthesizing a musical tone by a processor according to control information, said method comprising:*

*operating the processor to execute a process of generating the musical tone based on the control information at a given sampling frequency;*

*detecting a load imposed on the processor when the processor executes the process; and*

*memorizing a plurality of parameters corresponding to a plurality of sampling frequencies for use in generating of the musical tone,*

*wherein said step of operating the processor generates a waveform of the musical tone based on the control information at one of the plurality of sampling frequencies selected according to the detected load imposed on the processor, the processor reading one of the plurality of parameters corresponding to said selected one of the plurality of sampling frequencies for use in generating the waveform.*

*64. A medium for use in a system having a processor and a sound source module for synthesizing a musical tone according to control information at a given sampling frequency, the medium containing a program executable by the processor for causing the system to perform a method comprising:*

*processing a load for managing the system;*

*memorizing a plurality of parameters corresponding to a plurality of sampling frequencies for use in synthesizing the musical tone;*

*detecting the load imposed on the processor when the processor executes the program; and*

*operating the sound source module to generate a waveform of the musical tone based on the control information at one of the plurality of sampling frequencies selected according to the detected load imposed on the processor, the sound source module reading one of the plurality of parameters corresponding to the selected one of the plurality of sampling frequencies for use in generating the waveform.*

*65. A medium for use in a system having a processor for synthesizing a musical tone according to control information, the medium containing a program executable by the processor for causing the system to perform a method comprising:*

*generating the musical tone based on the control information at a given sampling frequency;*

*detecting a load imposed on the processor when the processor executes the program; and*

*memorizing a plurality of parameters corresponding to a plurality of sampling frequencies for use in generating of the musical tone,*

*wherein said step of generating generates a waveform of the musical tone based on the control information at one of the plurality of sampling frequencies selected according to the detected load imposed on the processor, the processor reading one of the plurality of parameters corresponding to said selected one of the plurality of sampling frequencies for use in generating the waveform.*

* * * * *